(12) United States Patent
Saitoh et al.

(10) Patent No.: US 12,164,203 B2
(45) Date of Patent: Dec. 10, 2024

(54) ACTIVE MATRIX SUBSTRATE, LIQUID CRYSTAL DISPLAY DEVICE AND METHOD FOR MANUFACTURING ACTIVE MATRIX SUBSTRATE

(71) Applicant: Sharp Display Technology Corporation, Kameyama (JP)

(72) Inventors: Yuhichi Saitoh, Kameyama (JP); Hiroaki Furukawa, Kameyama (JP); Atsushi Hachiya, Kameyama (JP); Hiroshi Matsukizono, Kameyama (JP)

(73) Assignee: SHARP DISPLAY TECHNOLOGY CORPORATION, Kameyama (JP)

( * ) Notice: Subject to any disclaimer, the term of this patent is extended or adjusted under 35 U.S.C. 154(b) by 77 days.

(21) Appl. No.: 18/070,579

(22) Filed: Nov. 29, 2022

(65) Prior Publication Data

US 2023/0168550 A1 Jun. 1, 2023

(30) Foreign Application Priority Data

Nov. 30, 2021 (JP) ................................. 2021-194709

(51) Int. Cl.
*G02F 1/1368* (2006.01)
*G02F 1/1333* (2006.01)
(Continued)

(52) U.S. Cl.
CPC .. *G02F 1/136227* (2013.01); *G02F 1/133388* (2021.01); *G02F 1/13394* (2013.01);
(Continued)

(58) Field of Classification Search
CPC ............. G02F 1/133345; G02F 1/1368; G02F 2201/501; H01L 27/1248; H01L 27/1255
See application file for complete search history.

(56) References Cited

U.S. PATENT DOCUMENTS

2007/0164275 A1 7/2007 Ishiguro
2009/0147197 A1 6/2009 Shimada et al.
(Continued)

FOREIGN PATENT DOCUMENTS

JP 2007-188808 A 7/2007
JP 2009-157368 A 7/2009
(Continued)

*Primary Examiner* — Angela K Davison
(74) *Attorney, Agent, or Firm* — Keating & Bennett, LLP

(57) ABSTRACT

An active matrix substrate includes a substrate, a pixel TFT that is supported by the substrate, provided corresponding to each of a plurality of pixel areas, and includes an oxide semiconductor layer, an organic insulating layer disposed above at least the oxide semiconductor layer of the pixel TFT, and an inorganic insulating layer disposed in contact with an upper surface of the organic insulating layer on the organic insulating layer. The organic insulating layer and the inorganic insulating layer are provided with a plurality of dual-layer hole structure portions, each of the dual-layer hole structure portions includes a through-hole provided in the inorganic insulating layer and a bottomed hole provided in the organic insulating layer and positioned below the through-hole, and the through-hole is positioned on an inner side of an outer edge of the bottomed hole when viewed from a normal direction of the substrate.

20 Claims, 62 Drawing Sheets

(51) Int. Cl.
  *G02F 1/1339* (2006.01)
  *G02F 1/1343* (2006.01)
  *G02F 1/1362* (2006.01)
  *G09G 3/36* (2006.01)
  *H01L 27/12* (2006.01)
  *H01L 29/786* (2006.01)

(52) U.S. Cl.
  CPC .. *G02F 1/134309* (2013.01); *G02F 1/136209* (2013.01); *G02F 1/1368* (2013.01); *G09G 3/3677* (2013.01); *H01L 27/1225* (2013.01); *H01L 27/124* (2013.01); *H01L 27/1248* (2013.01); *H01L 27/1288* (2013.01); *H01L 29/78633* (2013.01); *H01L 29/7869* (2013.01); *G02F 1/13439* (2013.01); *G02F 2202/16* (2013.01); *G09G 2310/0297* (2013.01)

(56) References Cited

U.S. PATENT DOCUMENTS

| | | |
|---|---|---|
| 2012/0138922 A1 | 6/2012 | Yamazaki et al. |
| 2012/0153292 A1 | 6/2012 | Nakamura et al. |
| 2013/0320334 A1 | 12/2013 | Yamazaki et al. |
| 2014/0022480 A1 | 1/2014 | Yokoyama et al. |
| 2014/0117350 A1* | 5/2014 | Koezuka ............. H01L 27/1225 257/43 |
| 2014/0286076 A1 | 9/2014 | Aoki et al. |
| 2014/0306218 A1 | 10/2014 | Koezuka et al. |
| 2015/0378208 A1* | 12/2015 | Kim .................. G02F 1/136286 445/25 |
| 2016/0041413 A1 | 2/2016 | Nishino et al. |
| 2016/0093645 A1 | 3/2016 | Lee et al. |
| 2017/0278872 A1 | 9/2017 | Ohara |
| 2020/0136077 A1 | 4/2020 | Lee et al. |

FOREIGN PATENT DOCUMENTS

| | | |
|---|---|---|
| JP | 2010-244785 A | 10/2010 |
| JP | 2012-128159 A | 7/2012 |
| JP | 2012-134475 A | 7/2012 |
| JP | 2014-007399 A | 1/2014 |
| JP | 2014-013412 A | 1/2014 |
| JP | 2014-038320 A | 2/2014 |
| JP | 2014-090068 A | 5/2014 |
| JP | 2014-209727 A | 11/2014 |
| JP | 2016-038434 A | 3/2016 |
| JP | 2016-071340 A | 5/2016 |
| JP | 2016-218094 A | 12/2016 |
| JP | 6198434 B2 | 9/2017 |
| JP | 2017-183312 A | 10/2017 |
| JP | 2020-129617 A | 8/2020 |

* cited by examiner

ACTIVE MATRIX SUBSTRATE, LIQUID CRYSTAL DISPLAY DEVICE AND METHOD FOR MANUFACTURING ACTIVE MATRIX SUBSTRATE

CROSS-REFERENCE TO RELATED APPLICATIONS

This application claims the benefit of priority to Japanese Patent Application Number 2021-194709 filed on Nov. 30, 2021. The entire contents of the above-identified application are hereby incorporated by reference.

BACKGROUND

Technical Field

The disclosure relates to an active matrix substrate, a liquid crystal display device, and a method for manufacturing the active matrix substrate.

At present, a liquid crystal display device including an active matrix substrate is being widely used for various purposes. The active matrix substrate includes a switching element for each pixel area. An active matrix substrate including a thin film transistor (TFT) as a switching element is referred to as a TFT substrate.

The TFT substrate includes a TFT and a pixel electrode that are provided for each pixel area, a gate wiring line (gate bus line) for supplying a gate signal to the TFT, a source wiring line (source bus line) for supplying a source signal to the TFT, and the like. A gate electrode, a source electrode, and a drain electrode of the TFT are respectively electrically connected to the gate wiring line, the source wiring line, and the pixel electrode. The TFT is covered by an interlayer insulating layer (passivation layer).

An organic insulating layer may be formed on the interlayer insulating layer as a flattened layer for flattening the surface thereof. It is also possible to reduce load capacitance (parasitic capacitance) and reduce power consumption by forming the organic insulating layer. As a material for the organic insulating layer, a photosensitive resin material is often used. In order to obtain a sufficient flattening effect or a load capacitance reduction effect, a photosensitive resin material is applied thickly (for example, in a thickness of several μm) at the time of forming the organic insulating layer.

In a case where the organic insulating layer is formed, for example, a plurality of pixel electrodes are provided separated from each other on the organic insulating layer, and an inorganic insulating layer for insulating the pixel electrodes from each other is provided thereon. In a TFT substrate used in a fringe field switching (FFS) mode liquid crystal display device, a pixel electrode and a common electrode are layered on an organic insulating layer via a dielectric layer (inorganic insulating layer).

SUMMARY

In a manufacturing process for a TFT substrate, it is known that impurities such as moisture contained in a resist stripper, a wet etching solution, atmospheric air, or the like easily infiltrate into the organic insulating layer. As described above, when an upper surface of the organic insulating layer is covered with an inorganic insulating layer, impurities infiltrating into the organic insulating layer during the manufacturing process are unlikely to be discharged from the upper surface of the organic insulating layer to the outside of the TFT substrate. For this reason, there is a concern that a portion of the impurities having infiltrated into the organic insulating layer may move downward (substrate side) and enter the oxide semiconductor layer of the pixel TFT.

When impurities such as moisture enter the oxide semiconductor layer, there is a possibility that carriers will be formed in the oxide semiconductor layer and the density of the carriers will increase. Then, a threshold voltage of the pixel TFT may change (shift in a negative direction), and an off-leak current may increase. This results in a display failure. In addition, also in a case where an oxide semiconductor layer is used as an active layer of a TFT (circuit TFT) constituting a drive circuit, impurities may enter the oxide semiconductor layer, which results in a possibility that desired characteristics will not be obtained.

On the other hand, JP 2014-90068 A proposes that impurities such as moisture contained in an organic insulating layer be allowed to diffuse to the outside through an opening by providing an opening exposing a portion of an upper surface of the organic insulating layer in an inorganic insulating layer disposed on the organic insulating layer in a TFT substrate.

In recent years, high-resolution in liquid crystal display devices has increased, and in a TFT substrate used in a high-resolution liquid crystal display device (of, for example, 1000 ppi or more), an organic insulating layer may be formed even thicker (for example, 4 μm to 5 μm). In such a TFT substrate, the ratio of the volume of the organic insulating layer to the TFT substrate increases, and thus the influence of impurities contained in the organic insulating layer becomes significant. For this reason, there is a demand for a structure that more efficiently discharges impurities absorbed by the organic insulating layer to the outside.

An embodiment of the disclosure has been conceived in light of the above-described circumstances, and an object thereof is to provide an active matrix substrate capable of suppressing fluctuations in characteristics of an oxide semiconductor TFT due to impurities such as moisture.

The present specification discloses an active matrix substrate, a liquid crystal display device, and a method of manufacturing the active matrix substrate, which are described in the following items.

Item 1

An active matrix substrate including a display region including a plurality of pixel areas arrayed in a matrix shape in a row direction and a column direction, and a non-display region positioned in a periphery of the display region, the active matrix substrate including:
  a substrate;
  a pixel TFT supported by the substrate and provided corresponding to each of the plurality of pixel areas, the pixel TFT including an oxide semiconductor layer as an active layer;
  an organic insulating layer disposed above at least the oxide semiconductor layer of the pixel TFT; and
  an inorganic insulating layer disposed in contact with an upper surface of the organic insulating layer on the organic insulating layer,
  wherein the organic insulating layer and the inorganic insulating layer are provided with a plurality of dual-layer hole structure portions,
  each of the dual-layer hole structure portions includes a through-hole provided in the inorganic insulating layer and a bottomed hole provided in the organic insulating layer and positioned below the through-hole, and the through-hole is positioned on an inner side of an outer edge of the bottomed hole when viewed from a normal direction of the substrate.

Item 2

The active matrix substrate according to item 1, wherein an inner surface of the bottomed hole is not in direct contact with the inorganic insulating layer.

Item 3

The active matrix substrate according to item 1 or 2, further including:
- a transparent conductive layer disposed on the inorganic insulating layer,
- wherein the transparent conductive layer includes an opening on each of the dual-layer hole structure portions, and
- at least a portion of an inner surface of the bottomed hole is exposed from the transparent conductive layer and the inorganic insulating layer in each of the dual-layer hole structure portions.

Item 4

The active matrix substrate according to item 3, further including:
- an island-shaped transparent conductive portion formed in the same layer as the transparent conductive layer,
- wherein the transparent conductive layer covers at least a portion of an upper surface of the inorganic insulating layer and at least a portion of an inner surface of the through-hole of the inorganic insulating layer in each of the dual-layer hole structure portions,
- the island-shaped transparent conductive portion is disposed separated from the transparent conductive layer inside the bottomed hole of the organic insulating layer, and
- a portion of the inner surface of the bottomed hole is exposed from the island-shaped transparent conductive portion, the transparent conductive layer, and the inorganic insulating layer.

Item 5

The active matrix substrate according to item 4, wherein the opening is positioned on an inner side of the outer edge of the through-hole when viewed from the normal direction of the substrate.

Item 6

The active matrix substrate according to item 3, wherein the opening of the transparent conductive layer exposes an inner surface of the through-hole and the inner surface of the bottomed hole in each of the dual-layer hole structure portions, and
- the opening is positioned on an inner side of the outer edge of the bottomed hole when viewed from the normal direction of the substrate.

Item 7

The active matrix substrate according to any one of items 1 to 6, wherein the organic insulating layer includes a first organic insulating layer and a second organic insulating layer positioned in a layer higher than the first organic insulating layer, and
- each of the first organic insulating layer and the second organic insulating layer includes a portion exposed to the bottomed hole of each of the dual-layer hole structure portions.

Item 8

The active matrix substrate according to any one of items 1 to 6, wherein the organic insulating layer includes a first organic insulating layer and a second organic insulating layer, and the second organic insulating layer includes a portion positioned in a layer higher than the first organic insulating layer and in direct contact with the first organic insulating layer, and
- only one of the first organic insulating layer and the second organic insulating layer includes a portion exposed to the bottomed hole of each of the dual-layer hole structure portions.

Item 9

The active matrix substrate according to any one of items 1 to 6, further including:
- an other organic insulating layer disposed on the organic insulating layer via the inorganic insulating layer,
- wherein the other organic insulating layer is disposed filling the through-hole and the bottomed hole in each of the dual-layer hole structure portions.

Item 10

The active matrix substrate according to any one of items 1 to 9, wherein the plurality of dual-layer hole structure portions include a plurality of first dual-layer hole structure portions disposed in the display region.

Item 11

The active matrix substrate according to item 10, further including:
- a plurality of pixel electrodes respectively disposed in the plurality of pixel areas and electrically connected to a corresponding one pixel TFT,
- wherein the first dual-layer hole structure portions are disposed at positions that do not overlap the plurality of pixel electrodes in the display region.

Item 12

The active matrix substrate according to item 10 or 11, wherein the plurality of first dual-layer hole structure portions are disposed in the display region such that one first dual-layer hole structure portion corresponds to three or more pixel areas.

Item 13

The active matrix substrate according to any one of items 10 to 12, further including:
- a plurality of light shielding layers disposed on the substrate side of the pixel TFT,
- wherein the first dual-layer hole structure portions overlap any one of the plurality of light shielding layers when viewed from the normal direction of the substrate.

Item 14

The active matrix substrate according to any one of items 1 to 13, wherein the plurality of dual-layer hole structure portions include a plurality of second dual-layer hole structure portions disposed in the non-display region.

Item 15

The active matrix substrate according to item 14, wherein the non-display region further includes a gate driver and/or a demultiplexer circuit supported by the substrate, and
the plurality of second dual-layer hole structure portions are positioned between the gate driver and/or the demultiplexer circuit and the display region when viewed from the normal direction of the substrate.

Item 16

The active matrix substrate according to any one of items 1 to 15, further including:
a plurality of pixel electrodes respectively disposed in the plurality of pixel areas,
wherein the pixel TFT is electrically connected to a corresponding one pixel electrode by a connection electrode formed of a transparent conductive material.

Item 17

The active matrix substrate according to any one of items 1 to 16, wherein a depth of the bottomed hole is ¼ or more and ¾ or less of a thickness of the organic insulating layer.

Item 18

The active matrix substrate according to any one of items 1 to 17, wherein the oxide semiconductor layer includes an In—Ga—Zn—O based semiconductor.

Item 19

The active matrix substrate according to item 18, wherein the In—Ga—Zn—O based semiconductor includes a crystalline portion.

Item 20

A liquid crystal display device comprising:
the active matrix substrate according to any one of items 1 to 19;
a counter substrate provided facing the active matrix substrate; and
a liquid crystal layer provided between the active matrix substrate and the counter substrate.

Item 21

The liquid crystal display device according to item 20, further including:
a plurality of columnar spacers positioned between the active matrix substrate and the counter substrate,
wherein the active matrix substrate further includes a plurality of light shielding layers disposed in association with the plurality of columnar spacers on a side closer to the substrate than the pixel TFT, and
each of the light shielding layers are disposed overlapping one of the plurality of dual-layer hole structure portions and one of the plurality of columnar spacers when viewed from the normal direction of the substrate.

Item 22

A method of manufacturing the active matrix substrate according to any one of items 1 to 18, the method including:
forming the inorganic insulating layer on the organic insulating layer; and
etching the inorganic insulating layer and the organic insulating layer by using the same etching mask,
wherein the etching is performed under conditions in which the through-hole is formed in the inorganic insulating layer, and the bottomed hole is formed in the organic insulating layer by removing a portion of the organic insulating layer exposed in the through-hole and a portion positioned on an outer side of the through-hole when viewed from the normal direction of the substrate.

Item 23

The method of manufacturing an active matrix substrate according to item 22, further including:
forming a transparent conductive film on the inorganic insulating layer and the dual-layer hole structure portions after etching the inorganic insulating layer, the forming of the transparent conductive film including separating a portion of the transparent conductive film positioned on an upper surface of the inorganic insulating layer and a portion positioned inside the bottomed hole from each other by using a step between the upper surface of the inorganic insulating layer and the bottomed hole.

Item 24

A method of manufacturing the active matrix substrate according to any one of items 1 to 18, the method including:
forming the organic insulating layer, the inorganic insulating layer, and a transparent conductive film in this order;
patterning the transparent conductive film to form an opening in a region of each of the dual-layer hole structure portions; and
etching the inorganic insulating layer and the organic insulating layer using the transparent conductive film including the opening formed therein as a mask,
wherein the etching is performed under conditions in which the through-hole is formed in the inorganic insulating layer, and the bottomed hole is formed in the organic insulating layer by removing a portion of the organic insulating layer exposed in the through-hole and a portion positioned on an outer side of the through-hole when viewed from the normal direction of the substrate.

According to an embodiment of the disclosure, it is possible to provide an active matrix substrate capable of suppressing fluctuations in characteristics of an oxide semiconductor TFT due to impurities such as moisture.

BRIEF DESCRIPTION OF DRAWINGS

The disclosure will be described with reference to the accompanying drawings, wherein like numbers reference like elements.

DESCRIPTION OF EMBODIMENTS

Figure 1:
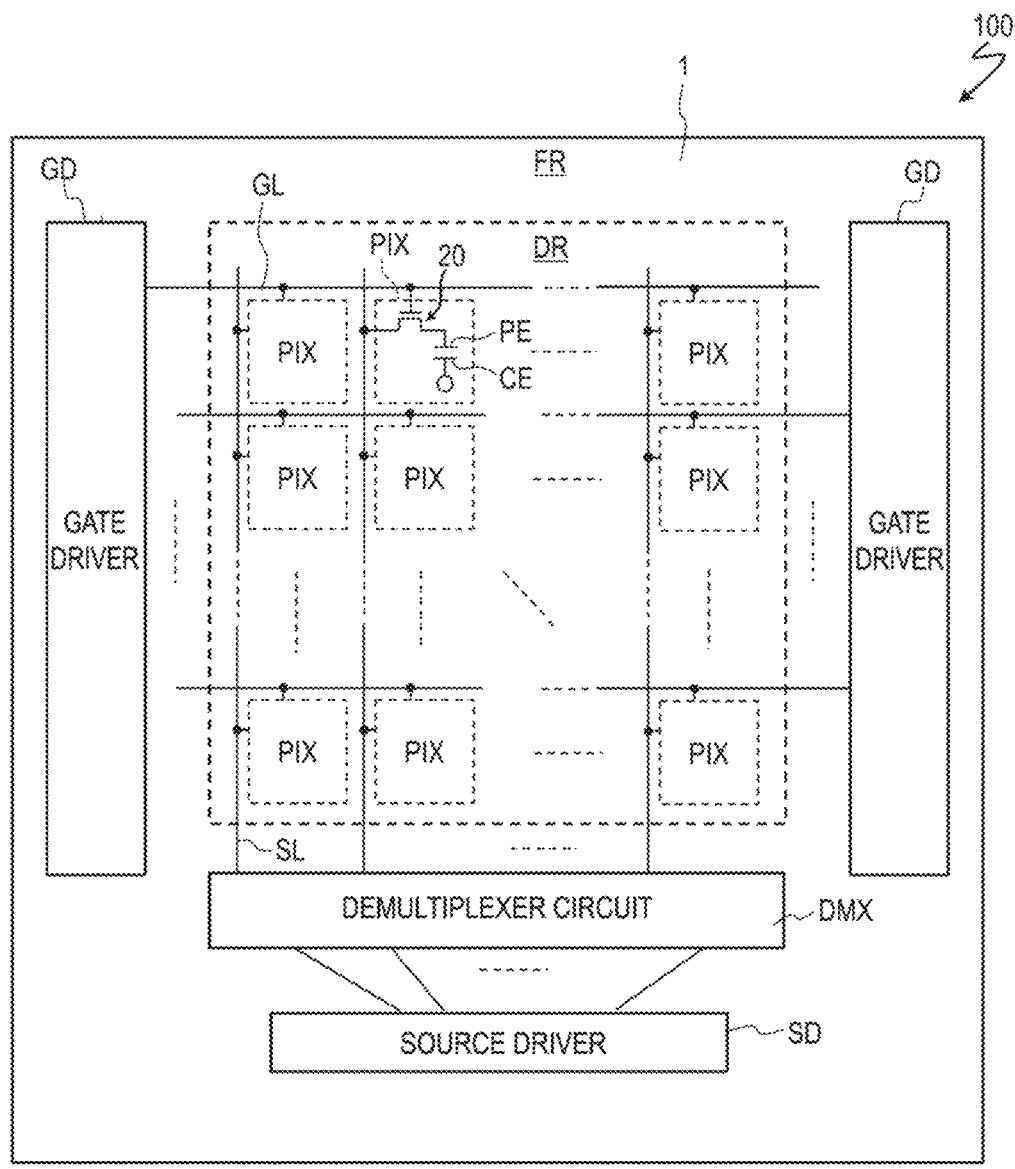
FIG. 1 is a schematic diagram illustrating an example of a planar structure of an active matrix substrate 100 according to an embodiment of the disclosure.

Hereinafter, embodiments of the disclosure will be described with reference to the accompanying drawings. Although an active matrix substrate for a fringe field switching (FFS) mode liquid crystal display device is exemplified below as an embodiment of the disclosure, the disclosure is not limited to the following embodiments. Further, in order to avoid redundant descriptions, similar constituent elements are denoted by the same reference numerals and signs in the description of modification examples and the like, and descriptions thereof may be omitted.

Example of Basic Structure of Active Matrix Substrate

First, an active matrix substrate 100 in an embodiment of the disclosure will be described with reference to FIG. 1. FIG. 1 is a schematic view illustrating an example of a planar structure of the active matrix substrate 100.

The active matrix substrate 100 has a display region DR and a non-display region (also referred to as a "frame region") FR as illustrated in FIG. 1. The display region DR is defined by a plurality of pixel areas PIX. The plurality of pixel areas PIX are arrayed in a matrix shape including a plurality of rows and a plurality of columns. The pixel area PIX is an area corresponding to a pixel of a liquid crystal display device, and the pixel area PIX may be referred to simply as a "pixel". The non-display region FR is a region positioned in the periphery of the display region DR and does not contribute to display.

In the display region DR, a plurality of gate wiring lines GL extending in a row direction, and a plurality of source wiring lines SL extending in a column direction are formed. Each of the pixel areas PIX is, for example, an area surrounded by a pair of gate wiring lines GL adjacent to each other and a pair of source wiring lines SL adjacent to each other.

As will be described below, the gate wiring line GL may have an overlapping structure including a lower gate wiring line and an upper gate wiring line overlapping each other via an insulating layer. The lower gate wiring line and the upper gate wiring line may be electrically connected to each other in the non-display region FR, for example.

Further, in the display region DR, a thin film transistor (TFT) 20 provided corresponding to each pixel area PIX and a pixel electrode PE electrically connected to the TFT 20 are disposed. The TFT 20 disposed in each pixel area PIX is referred to as a "pixel TFT" below. The pixel TFT 20 supplies a gate signal (scanning signal) from the corresponding gate wiring line GL and supplies a source signal (display signal) from the corresponding source wiring line SL. Here, an oxide semiconductor TFT having an oxide semiconductor layer as an active layer is used as the pixel TFT 20. In a case where the active matrix substrate 100 is applied to a display device of a transverse electrical field mode such as an FFS mode, an electrode (common electrode) CE that is common to the plurality of pixel areas PIX is provided in the active matrix substrate 100.

A peripheral circuit is disposed in the non-display region FR. Here, in the non-display region FR, a gate driver GD for driving the gate wiring line GL is formed integrally (monolithically), and a source driver SD for driving the source wiring line SL is mounted. Note that a demultiplexer circuit DMX that drives the source wiring line SL in a time division manner may be further disposed in the non-display region FR. The demultiplexer circuit DMX may also be integrally formed similarly to the gate driver GD. The peripheral circuit such as the gate driver GD and the demultiplexer circuit DMX includes a plurality of TFTs (circuit TFTs). The circuit TFT may be an oxide semiconductor TFT formed using the same semiconductor film as the pixel TFT, or may be a TFT formed using a semiconductor film different from the pixel TFT. For example, the circuit TFT may be a silicon semiconductor TFT including a crystalline silicon semiconductor film as an active layer.

Structure of Impurity Removed Region ER (Dual-Layer Hole Structure Portion HS)

Although not illustrated in FIG. 1, a region (impurity removed region) for discharging impurities from an organic insulating layer is provided at a plurality of locations of the display region DR and/or the non-display region FR of the active matrix substrate 100 in the present embodiment. Each impurity removed region includes a hole structure portion including a bottomed hole formed in the organic insulating layer and a through-hole formed in an inorganic insulating layer that is an upper layer thereof. In the present specification, the hole structure portion formed over the organic insulating layer and the inorganic insulating layer in this manner is referred to as a "dual-layer hole structure portion".

Impurity Removed Region ER1

Figure 2A:
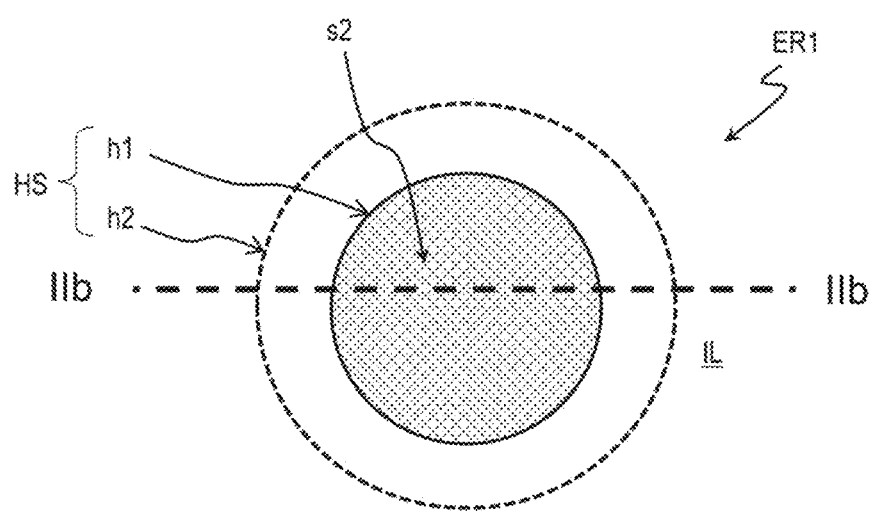
FIG. 2A is a plan view schematically illustrating an impurity removed region ER1 including a dual-layer hole structure portion HS.
Figure 2B:
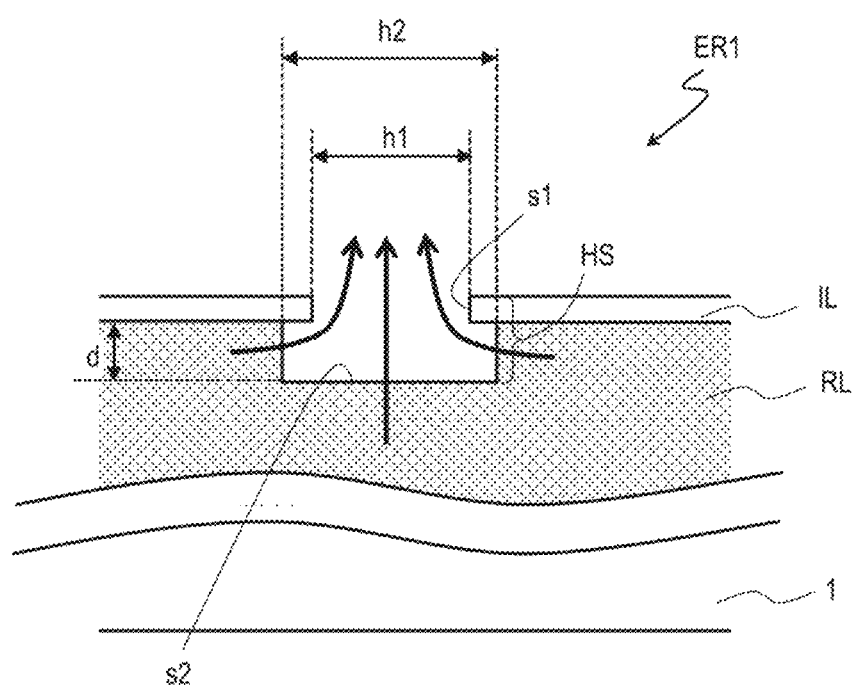
FIG. 2B is a schematic cross-sectional view taken along a line IIb-IIb illustrated in FIG. 2A.

FIGS. 2A and 2B are a plan view and a cross-sectional view which schematically illustrate an example of an impurity removed region including a dual-layer hole structure portion. Although a single impurity removed region is illustrated here, a plurality of impurity removed regions are typically provided separated from each other.

The active matrix substrate 100 includes a substrate 1, the pixel TFT (not illustrated) supported by the substrate 1, an organic insulating layer RL positioned above the oxide semiconductor layer constituting the pixel TFT, and an inorganic insulating layer IL positioned on the organic insulating layer RL. The organic insulating layer RL may be disposed in a layer higher than the source wiring line SL and the gate wiring line GL. The organic insulating layer RL mentioned here may include two or more organic insulating layers formed in a separate step. The inorganic insulating layer IL is disposed in contact with the upper surface of the organic insulating layer RL.

The impurity removed region ER1 includes a dual-layer hole structure portion HS. The dual-layer hole structure portion HS includes a through-hole h1 provided in the inorganic insulating layer IL, and a bottomed hole h2 that is provided in the organic insulating layer RL and positioned below the through-hole h1. The bottomed hole h2 is a hole that does not penetrate the organic insulating layer RL, and a depth d of the bottomed hole h2 is smaller than the thickness of the organic insulating layer RL. In addition, when viewed from the normal direction of the substrate 1, the through-hole h1 is positioned on an inner side of the outer edge of the bottomed hole h2.

In each dual-layer hole structure portion HS, impurities such as moisture contained in the organic insulating layer RL can be discharged to the outside via the through-hole h1 of the inorganic insulating layer IL from an inner surface s2 of the bottomed hole h2 as indicated by arrows.

As illustrated in the drawing, an end portion including an inner surface s1 of the through-hole h1 in the inorganic insulating layer IL may be extended like an eave above the bottomed hole h2. In this case, the entire inner surface s2 of the bottomed hole h2 may be exposed from the inorganic insulating layer IL and may not be in direct contact with the inorganic insulating layer IL. Thereby, the entire inner surface s2 of the bottomed hole h2 can be made to function as an "impurity discharging surface" that can discharge impurities.

A method of forming the dual-layer hole structure portion HS is not particularly limited. As will be described below, for example, the dual-layer hole structure portion HS can be formed by depositing the organic insulating layer RL and the inorganic insulating layer IL and then etching these layers under predetermined conditions.

Since the impurity removed region ER1 in the present embodiment includes the dual-layer hole structure portion HS described above, for example, it is possible to more efficiently discharge impurities in the organic insulating layer RL than in a case where a through-hole is provided only in the inorganic insulating layer to the outside. Hereinafter, the reason for that will be described with reference to the drawings.

Figure 28:
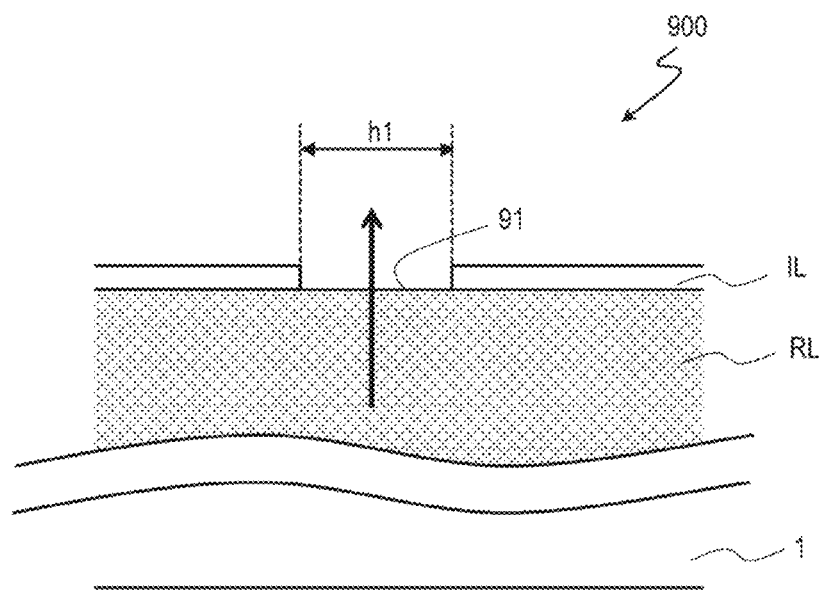
FIG. 28 is a cross-sectional view illustrating an impurity removed structure 900 as a reference example which discharges impurities.

FIG. 28 is a cross-sectional view illustrating an impurity removed structure 900 as a reference example in the active matrix substrate. Constituent elements similar those in FIGS. 2A and 2B are denoted by the same reference numerals and signs. In the impurity removed structure 900, a through-hole h1 that exposes a portion 91 of an upper surface of the organic insulating layer RL is provided in the inorganic insulating layer IL. A bottomed hole is not formed in the organic insulating layer RL. In the impurity removed structure 900, impurities in the organic insulating layer RL are discharged from the exposed portion 91 of the upper surface of the organic insulating layer RL via the through-hole h1 as indicated by an arrow. That is, the exposed portion 91 of the organic insulating layer RL serves as an impurity discharging surface. The area of the impurity discharging surface is, for example, substantially the same as the area of the through-hole h1.

On the other hand, in the present embodiment, a dual-layer hole structure portion HS over the inorganic insulating layer IL and the organic insulating layer RL is formed. In the dual-layer hole structure portion HS, a bottomed hole h2 having a size larger than the through-hole h1 of the inorganic insulating layer IL is formed in the organic insulating layer RL. For this reason, it is possible to enlarge the exposed area of the organic insulating layer RL that can function as an impurity discharging surface. Further, as indicated by the arrows in FIG. 2B, impurities in the organic insulating layer RL are easily moved from below and the sides of the dual-layer hole structure portion HS to the inner surface s2 of the bottomed hole h2. Accordingly, even when the organic insulating layer RL is thick, it is possible to more easily discharge impurities contained in the organic insulating layer RL. In this manner, according to the present embodiment, it is possible to promote the discharge of impurities from the organic insulating layer RL more efficiently and in a wider range than in the impurity removed structure 900 as the reference example, and thus fluctuations in characteristics of the oxide semiconductor TFT due to impurities are more effectively suppressed. Further, for example, in a case where the impurity removed region ER1 is provided in the display region DR, it is possible to reduce the number of impurity removed regions ER1 per unit area or reduce the size of each impurity removed region ER1, and thus fluctuations in characteristics of the oxide semiconductor TFT can be suppressed while securing a pixel aperture ratio (transmittance).

Note that the structure of the two-layer hole structure HS is not limited to the example illustrated in the drawing. For example, a portion of the inner surface s2 of the bottomed hole h2 may be in direct contact with the inorganic insulating layer IL. In this case, a portion of the inner surface s2 which is not in direct contact with the inorganic insulating layer IL (exposed from the inorganic insulating layer IL) may function as an impurity discharging surface. In addition, the planar shapes and cross-sectional shapes of the through-hole h1 and the bottomed hole h2 are not limited to the example illustrated in the drawing. In the example illustrated in the drawing, the planar shapes of the through-hole h1 and the bottomed hole h2 are circular shapes, but may be elliptical shapes or polygonal shapes such as a rectangular shape.

Impurity Removed Region ER2

Figure 3A:
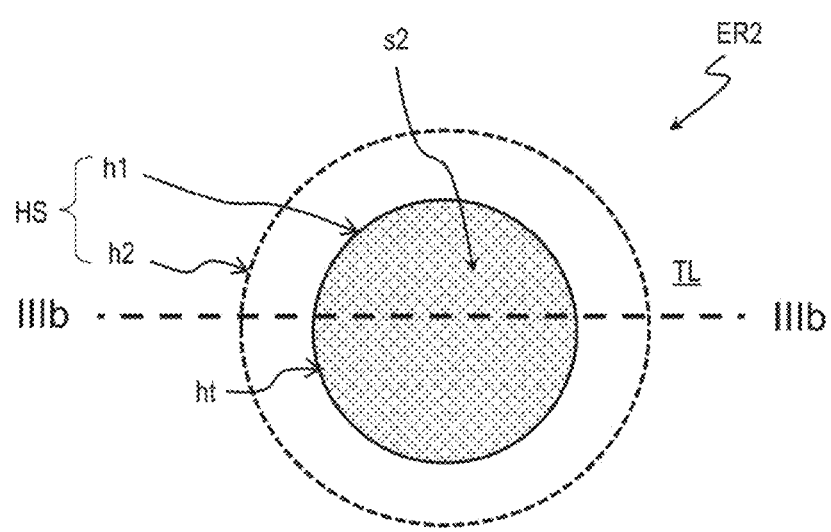
FIG. 3A is a plan view schematically illustrating another impurity removed region ER2 including a dual-layer hole structure portion HS.
Figure 3B:
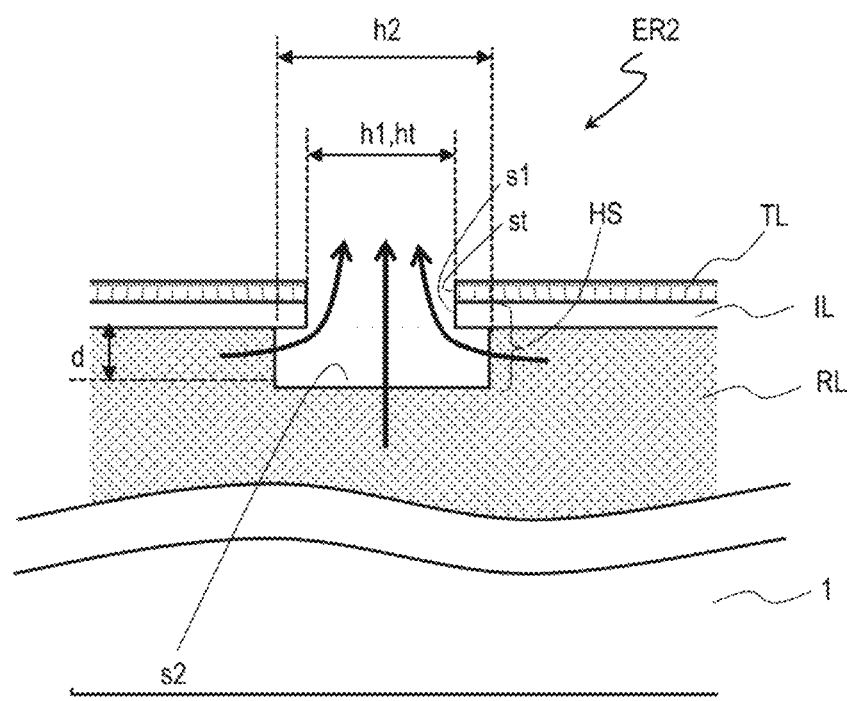
FIG. 3B is a schematic cross-sectional view taken along a line IIIb-IIIb illustrated in FIG. 3A.

FIGS. 3A and 3B are a plan view and a cross-sectional view, respectively, schematically illustrating another example of an impurity removed region.

An impurity removed region ER2 is different from the impurity removed region ER1 illustrated in FIGS. 2A and 2B in that it further includes a transparent conductive layer TL disposed on the inorganic insulating layer IL. An opening ht that partially exposes at least the inner surface s2 of the bottomed hole h2 is formed in the transparent conductive layer TL.

In the example illustrated in the drawing, the transparent conductive layer TL has the opening ht that exposes the inner surface s1 of the through-hole h1 and the inner surface s2 of the bottomed hole h2. At least a portion (the entirety in this example) of the inner surface s2 is exposed from the transparent conductive layer TL and the inorganic insulating layer IL. Thereby, as indicated by the arrows in FIG. 3B, impurities in the organic insulating layer RL may be discharged to the outside without being hindered by the inorganic insulating layer IL and the transparent conductive layer TL from the inner surface s2 of the bottomed hole h2.

The transparent conductive layer TL may be a common electrode CE or a pixel electrode PE. Alternatively, the transparent conductive layer TL may be another wiring line, electrode, or the like formed in the same layer as the common electrode CE or the pixel electrode PE (that is, formed of the same transparent conductive film).

The periphery of the opening ht may be positioned on the inorganic insulating layer IL. When viewed from the normal direction of the substrate 1, it is preferable that the opening ht be positioned inside the outer edge of the bottomed hole h2. In a case where the transparent conductive layer TL is, for example, the common electrode CE or the pixel electrode PE, the size of the opening ht when viewed from the normal direction of the substrate 1 is made smaller than the bottomed hole h2, and thus it is possible to increase the efficiency of removing impurities while securing the area of the common electrode CE or the pixel electrode PE. As illustrated in the drawing, a side wall st of the opening ht may be aligned with the inner surface s1 of the inorganic insulating layer IL.

A method of forming the impurity removed region ER2 is not particularly limited. For example, the inorganic insulating layer IL, the organic insulating layer RL, and the transparent conductive film may be deposited in this order, and the through-hole h1 and the bottomed hole h2 may be formed after the opening ht is formed in the transparent conductive film. Alternatively, the transparent conductive film may be deposited and patterned after the dual-layer hole structure portion HS is formed.

The position and size of the opening ht are not limited to the example illustrated in the drawing. When viewed from the normal direction of the substrate 1, the opening ht may be disposed so as to at least partially overlap the through-hole h1 of the inorganic insulating layer IL and expose at least a portion of the inner surface s2 of the bottomed hole h2.

Impurity Removed Region ER3

Figure 4A:
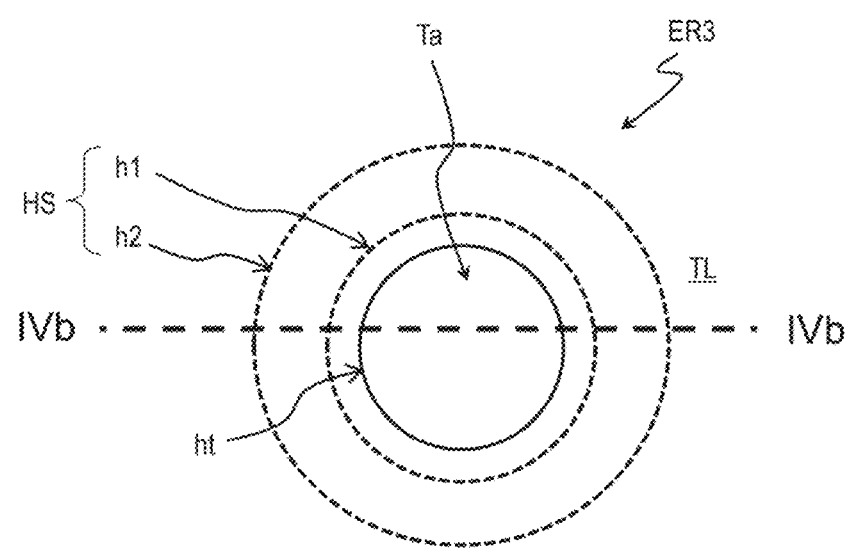
FIG. 4A is a plan view schematically illustrating still another impurity removed region ER3 including a dual-layer hole structure portion HS.
Figure 4B:
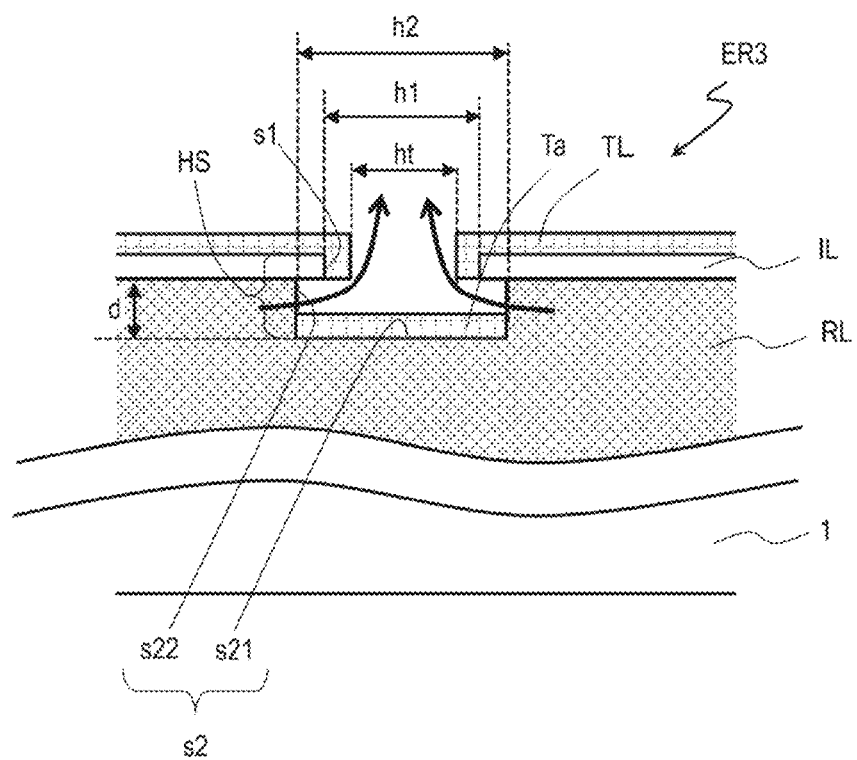
FIG. 4B is a schematic cross-sectional view taken along a line IVb-IVb illustrated in FIG. 4A.

FIGS. 4A and 4B are a plan view and a cross-sectional view, respectively, schematically illustrating still another example of an impurity removed region.

An impurity removed region ER3 differs from the impurity removed region ER2 illustrated in FIGS. 3A and 3B in that an island-shaped transparent conductive portion Ta formed in the same layer as the transparent conductive layer TL is disposed in the bottomed hole h2 of the organic insulating layer RL.

In the impurity removed region ER3, the transparent conductive layer TL is in contact with at least a portion of the upper surface of the inorganic insulating layer IL and at least a portion of the inner surface s1 of the through-hole h1. The island-shaped transparent conductive portion Ta formed in the same layer as the transparent conductive layer TL (that is, formed of the same transparent conductive film) is disposed in the bottomed hole h2 of the dual-layer hole structure portion HS. The island-shaped transparent conductive portion Ta and the transparent conductive layer TL are separated from each other. The island-shaped transparent conductive portion Ta covers, for example, only a portion s21 of the inner surface s2 of the bottomed hole h2 and is disposed so as to expose the other portion s22.

In the impurity removed region ER3, a portion of the inner surface s2 of the bottomed hole h2 is exposed from the island-shaped transparent conductive portion Ta, the transparent conductive layer TL, and the inorganic insulating layer IL, and functions as an impurity discharging surface. In this example, the portion s22 exposed from the island-shaped transparent conductive portion Ta in the inner surface s2 of the bottomed hole h2 serves as an impurity discharging surface. As indicated by the arrows in FIG. 4B, impurities in the organic insulating layer RL may be discharged to the outside without being hindered by the inorganic insulating layer IL, the transparent conductive layer TL, and the island-shaped transparent conductive portion Ta from the exposed portion s22 of the inner surface s2 of the bottomed hole h2.

A method of forming the impurity removed region ER3 is not particularly limited. As an example, the impurity removed region ER3 can be formed by the following method. First, a dual-layer hole structure portion HS is formed, and then a transparent conductive film covering the dual-layer hole structure portion HS is formed. When the transparent conductive film is deposited, a portion of the transparent conductive film which is positioned on the inorganic insulating layer IL and a portion (the island-shaped transparent conductive portion Ta) positioned inside the bottomed hole h2 may be separated from each other using a step between the bottom of the bottomed hole h2 and the upper surface of the inorganic insulating layer IL. According to this method, a design that takes processing accuracy into consideration may not be performed, and thus it is possible to make the size of the opening ht smaller than that in a case where the opening ht is formed in the transparent conductive film using, for example, a photolithography process. The size of the opening ht may be smaller than the through-hole h1. For example, when viewed from the normal direction of the substrate 1, the opening ht may be positioned on an inner side of the outer edge of the through-hole h1. In a case where the transparent conductive layer TL is the common electrode CE or the pixel electrode PE, the opening ht is made small, and thus it is possible to suppress a decrease in the electrode area due to providing the opening ht.

In the active matrix substrate 100 in the present embodiment, any one of the impurity removed regions ER1 to ER3 may be provided in the display region DR and/or the non-display region FR. For example, at least one impurity removed region ER1 may be provided in a region where the transparent conductive layer TL is not formed in the active matrix substrate 100, and at least one impurity removed region ER2 or impurity removed region ER3 may be provided in a region where the transparent conductive layer TL is formed.

In the present specification, the structures of the impurity removed regions ER1, ER2, and ER3 are referred to as a "first structure", a "second structure", and a "third structure", respectively. In addition, the impurity removed regions ER1 to ER3 may be referred to collectively as an "impurity removed region ER". Further, the impurity removed region ER disposed in the display region DR is referred to as a "first impurity removed region ERd", and the impurity removed region ER disposed in the non-display region FR is referred to as a "second impurity removed region ERf". Each of the first impurity removed region ERd and the second impurity removed region ERf may have any of the first to third structures described above.

Detailed Structure of Active Matrix Substrate 100

A more specific structure of the active matrix substrate in the present embodiment will be described. Hereinafter, an active matrix substrate 100A in which an impurity removed region ER (that is, the first impurity removed region ERd) is provided in the display region DR will be described as an example.

Figure 5:
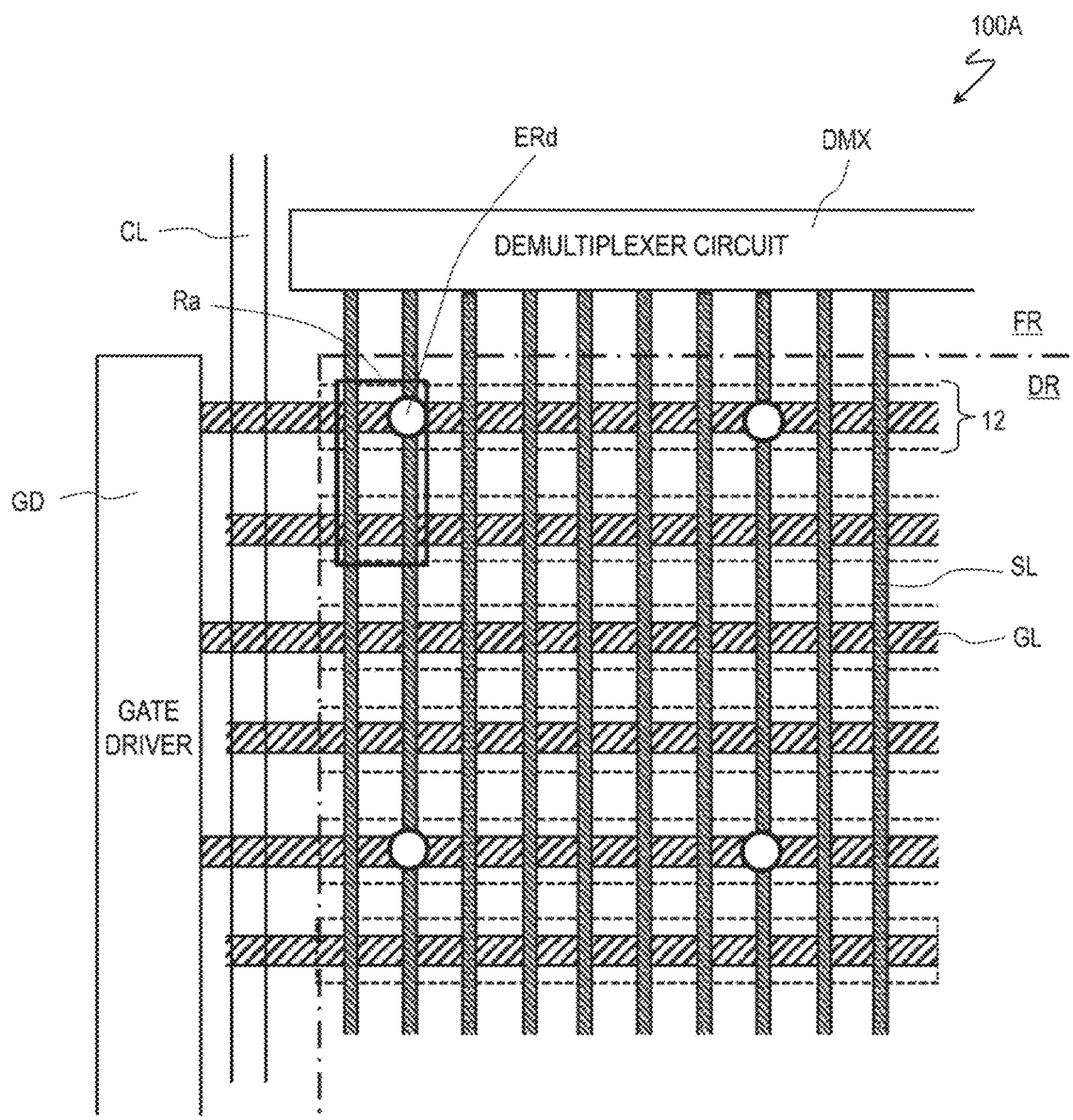
FIG. 5 is a schematic plan view illustrating the arrangement of impurity removed regions ERd in an active matrix substrate 100A.

FIG. 5 is a schematic plan view illustrating the arrangement of the first impurity removed regions ERd in the active matrix substrate 100A.

As illustrated in FIG. 5, in the active matrix substrate 100A, the plurality of first impurity removed regions ERd are disposed separated from each other in the display region DR. It is preferable that the first impurity removed regions ERd be disposed at a position that does not overlap the pixel electrode PE (not illustrated) when viewed from the normal direction of the substrate 1. For example, the first impurity removed regions ERd may be disposed at an intersection portion between the gate wiring line GL and the source wiring line SL (a source-gate intersection portion) when viewed from the normal direction of the substrate 1. The first impurity removed regions ERd may be disposed for each pixel area PIX, but it is preferable that the first impurity removed regions ERd be disposed for each set of a plurality of pixel areas PIX as illustrated in the drawing. Thereby, the number of the first impurity removed regions ERd can be reduced, and thus the influence on display characteristics can be reduced. Although it depends on the array pitch of the pixel areas PIX, a single first impurity removed region ERd may be disposed for, for example, three or more pixel areas PIX (24 pixel areas PIX in the example illustrated in the drawing).

In a case where the active matrix substrate 100A is used in an FFS mode display device, a transparent conductive layer that functions as a common electrode is formed in the display region DR. Accordingly, the first impurity removed region ERd may have the above-described second structure (the impurity removed region ER2 illustrated in FIGS. 3A and 3B) or third structure (the impurity removed region ER3 illustrated in FIGS. 4A and 4B).

An organic insulating layer RL including a first organic insulating layer 11 and a second organic insulating layer 12 disposed in a layer higher than the first organic insulating layer 11 is provided in the display region DR of the active matrix substrate 100A. As will be described below, it is preferable that the first impurity removed region ERd be configured to promote the discharge of impurities from both the first organic insulating layer 11 and the second organic insulating layer 12.

Figure 6A:
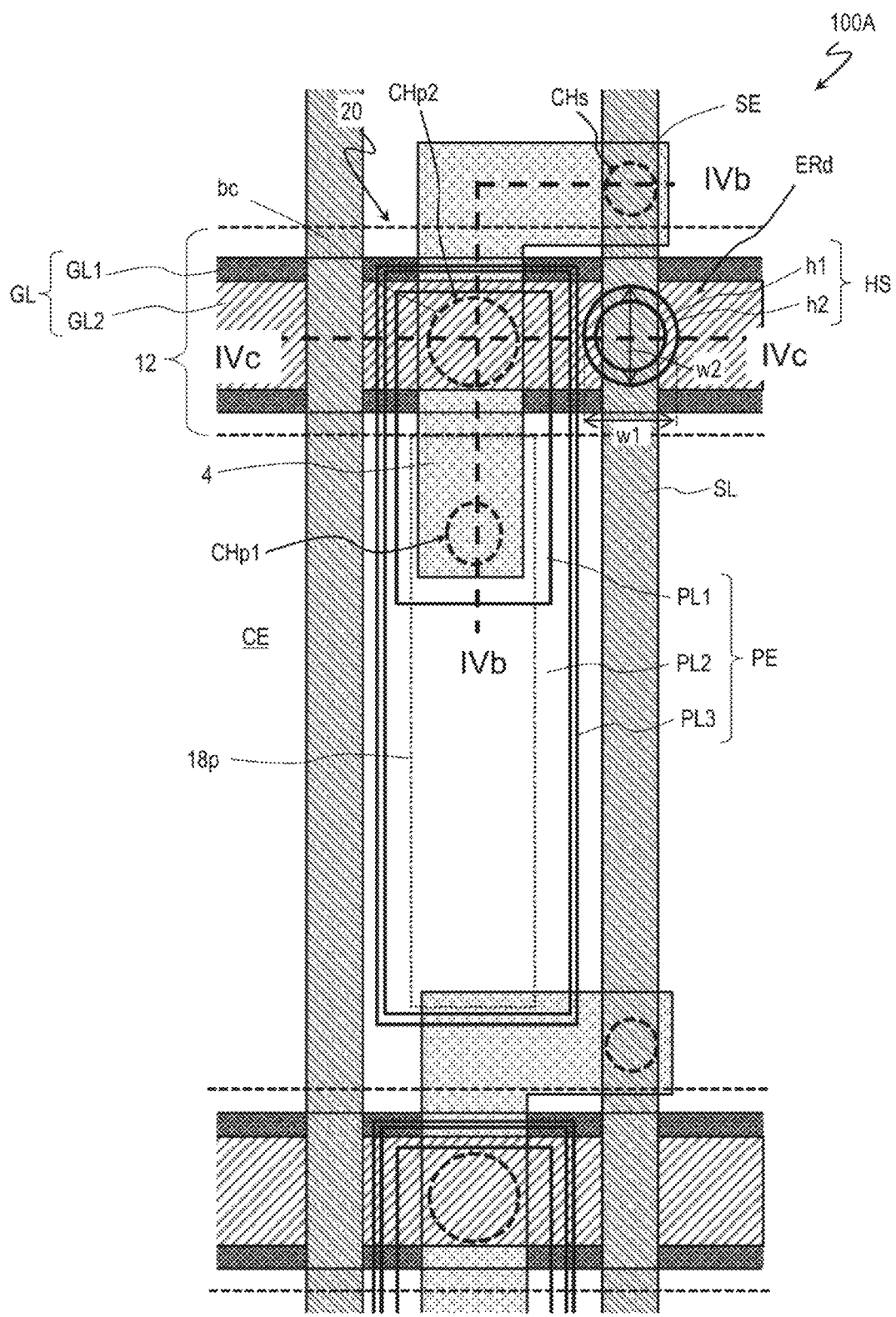
FIG. 6A is a plan view illustrating a pixel area PIX in the active matrix substrate 100A.
Figure 6B:
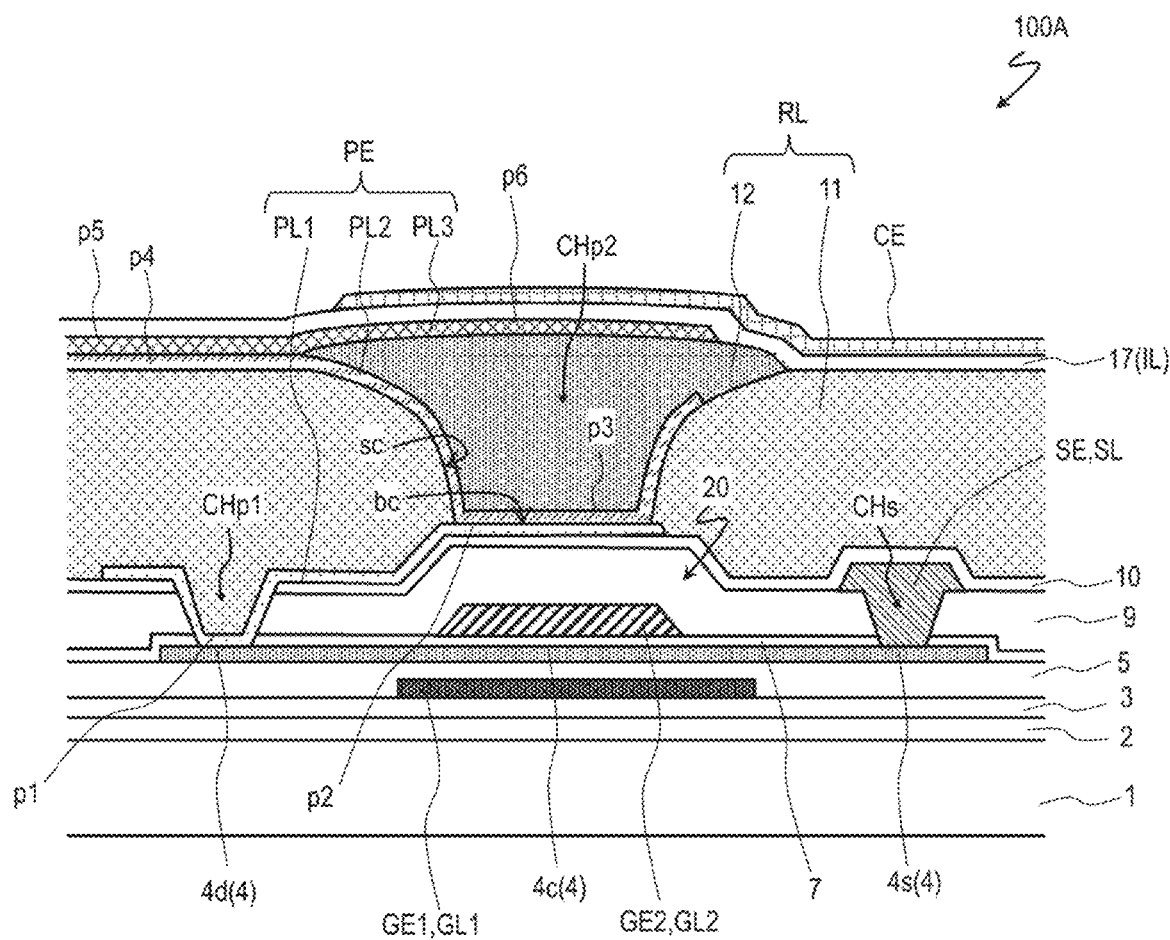
FIG. 6B is a cross-sectional view taken along a line IVb-IVb illustrated in FIG. 6A.
Figure 6C:
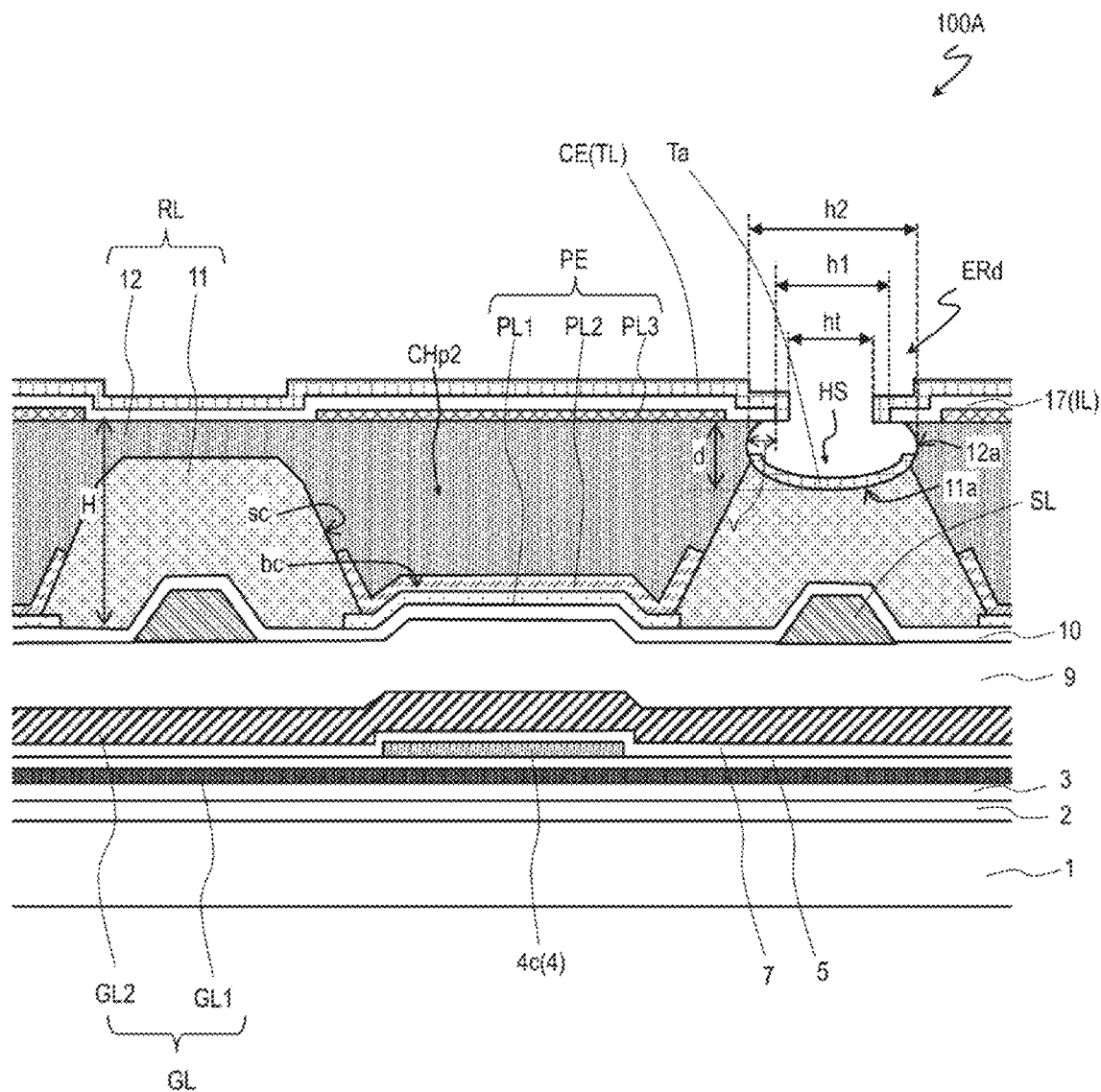
FIG. 6C is a cross-sectional view taken along a line IVc-IVc illustrated in FIG. 6A.

FIG. 6A is a plan view illustrating one pixel area PIX in the active matrix substrate 100A. FIG. 6A corresponds to a region Ra illustrated in FIG. 5. FIG. 6B is a cross-sectional view taken along a line VIb-VIb illustrated in FIG. 6A, and illustrates a cross section of the pixel TFT 20 in a channel length direction. FIG. 6C is a cross-sectional view taken along a line VIc-VIc illustrated in FIG. 6A.

As illustrated in FIGS. 6A to 6C, the active matrix substrate 100A includes a substrate 1, a pixel TFT 20 supported by the substrate 1, a plurality of source wiring lines SL, a plurality of gate wiring lines GL, an organic insulating layer RL including the first organic insulating layer 11 and the second organic insulating layer 12, and a pixel electrode PE. Here, each of the gate wiring lines GL has an overlapping structure including a lower gate wiring line GL1 and an upper gate wiring line GL2. The first organic insulating layer 11 is provided so as to overlap at least a portion of an oxide semiconductor layer 4 constituting the pixel TFT 20, for example, when viewed from the normal direction of the substrate 1. At least a portion of the pixel electrode PE is positioned on the first organic insulating layer 11. The common electrode CE may be disposed on the organic insulating layer RL and the pixel electrode PE via a dielectric layer 17. In addition, the first impurity removed region ERd is provided at a portion of the source-gate intersection portion. The first impurity removed region ERd includes the organic insulating layer RL and a dual-layer hole structure portion HS formed in the dielectric layer 17.

When viewed from the normal direction of the substrate 1, the source wiring lines SL extend in substantially a column direction, and the gate wiring lines GL extend in substantially a row direction. In each of the gate wiring lines GL, the upper gate wiring line GL2 and the lower gate wiring line GL1 overlap each other via an insulator. The upper gate wiring line GL2 and the lower gate wiring line GL1 are electrically connected to each other. Although not illustrated in the drawing, for example, a connection portion that electrically connects the lower gate wiring line GL1 and the upper gate wiring line GL2 may be provided in the non-display region FR. In this example, the width of the upper gate wiring line GL2 is smaller than the width of the lower gate wiring line GL1, and when viewed from the normal direction of the substrate 1, the upper gate wiring line GL2 is positioned on an inner side of two edge portions extending in the row direction of the lower gate wiring line GL1. Note that the arrangement and shapes of the lower gate wiring line GL1 and the upper gate wiring line GL2 are not limited to the example illustrated in the drawing.

As a lower insulating layer, a first lower insulating layer 2 and a second lower insulating layer 3 disposed thereon are formed on the substrate 1. In this example, the pixel TFT 20 is disposed on the second lower insulating layer 3.

The pixel TFT 20 is provided corresponding to each pixel area PIX. The pixel TFT 20 is an oxide semiconductor TFT including an oxide semiconductor layer 4 as an active layer. The structure of the pixel TFT 20 is not particularly limited. The pixel TFT 20 may have a top gate structure or may have a bottom gate structure. In this example, the pixel TFT 20 has a double gate structure including a gate below (on the substrate 1 side) and above (on a side opposite to the substrate 1) the oxide semiconductor layer 4. Specifically, the pixel TFT 20 includes a lower gate electrode GE1 positioned on the second lower insulating layer 3, the oxide semiconductor layer 4, the lower gate insulating layer 5 positioned between the lower gate electrode GE1 and the oxide semiconductor layer 4, an upper gate electrode GE2 positioned above the oxide semiconductor layer 4, an upper gate insulating layer 7 positioned between the upper gate electrode GE2 and the oxide semiconductor layer 4, and a source electrode SE.

The oxide semiconductor layer 4 includes a channel region 4c, and a source contact region 4s and a drain contact region 4d that are positioned respectively on both sides of the channel region 4c when viewed from the normal direction of the substrate 1. The source contact region 4s and the drain contact region 4d in the oxide semiconductor layer 4 have resistance lower than the channel region 4c. The source contact region 4s is electrically connected to the source electrode SE, and the drain contact region 4d is electrically connected to the corresponding pixel electrode PE.

The lower gate electrode GE1 is positioned on the substrate 1 side of the oxide semiconductor layer 4 and overlaps a portion of the oxide semiconductor layer 4 via the lower gate insulating layer 5. The upper gate electrode GE2 is positioned on a side opposite to the substrate 1 of the oxide semiconductor layer 4 and overlaps a portion of the oxide semiconductor layer 4 via the upper gate insulating layer 7. In this example, a region of the oxide semiconductor layer 4, which overlaps the upper gate electrode GE2, serves as the channel region 4c when viewed from the normal direction of the substrate 1. The lower gate electrode GE1 at least partially overlaps the channel region 4c of the oxide semiconductor layer 4.

The lower gate electrode GE1 and the upper gate electrode GE2 are electrically connected to the lower gate wiring line GL1 and the upper gate wiring line GL2, respectively. The lower gate electrode GE1 and the lower gate wiring line GL1 may be integrally formed using the same conductive film, and the upper gate electrode GE2 and the upper gate wiring line GL2 may be integrally formed using the same conductive film. Here, a portion of the lower gate wiring line GL1 (specifically, a portion facing the oxide semiconductor layer 4) functions as the lower gate electrode GE1, and a portion of the upper gate wiring line GL2 (specifically, a portion facing the oxide semiconductor layer 4) functions as the upper gate electrode GE2.

In the example illustrated in FIG. 6A, the oxide semiconductor layer 4 of each pixel TFT 20 extends from the corresponding pixel area PIX to another pixel area adjacent to the pixel area PIX in a column direction across the gate wiring line GL (here, the lower gate wiring line GL1 and the upper gate wiring line GL2) when viewed from the normal direction of the substrate 1. When viewed from the normal direction of the substrate 1, portions of the lower gate wiring line GL1 and the upper gate wiring line GL2 which intersect the oxide semiconductor layer 4 can function as the lower gate electrode GE1 and the upper gate electrode GE2 of the pixel TFT 20, respectively. The lower gate wiring line GL1 and the upper gate wiring line GL2 of each gate wiring line GL are electrically connected to each other, and the same gate signal is supplied to these wiring lines.

The oxide semiconductor layer 4, the upper gate insulating layer 7, and the upper gate electrode GE2 are covered with a first interlayer insulating layer 9. The first interlayer insulating layer 9 may be in contact with a portion of the upper surface of the oxide semiconductor layer 4.

The source wiring line SL and the source electrode SE of each pixel TFT 20 are disposed on the first interlayer insulating layer 9. In the first interlayer insulating layer 9 and the upper gate insulating layer 7, a contact hole (hereinafter referred to as a "source contact hole") CHs is formed such that at least a portion of the source contact region 4s of the oxide semiconductor layer 4 is exposed. The source electrode SE is formed on the first interlayer insulating layer 9 and in the source contact hole CHs and is electrically connected to the source contact region 4s in the source contact hole CHs. The source electrode SE may be formed integrally with the corresponding source wiring line SL using the same conductive film. Here, a portion of the source wiring line SL (specifically, a portion connected to the source contact region 4s) functions as the source electrode SE.

A second interlayer insulating layer 10 is provided so as to cover the pixel TFT 20. The second interlayer insulating layer 10 is positioned between the first interlayer insulating layer 9 and the first organic insulating layer 11 and covers the source electrode SE and the source wiring line SL. A first pixel contact hole CHp1 is formed in the second interlayer insulating layer 10, the first interlayer insulating layer 9, and the upper gate insulating layer 7 such that at least a portion of the drain contact region 4d of the oxide semiconductor layer 4 is exposed.

The first organic insulating layer 11 is formed on the second interlayer insulating layer 10. The first organic insulating layer 11 is formed of, for example, a photosensitive resin material. A second pixel contact hole CHp2 is formed in the first organic insulating layer 11. The second pixel contact hole CHp2 is formed so as to at least partially overlap at least one (here, both) of the lower gate wiring line GL1 and the upper gate wiring line GL2 when viewed from the normal direction of the substrate 1. As illustrated in FIG. 6A, when viewed from the normal direction of the substrate 1, a bottom surface be of the second pixel contact hole CHp2 may be positioned inside the lower gate wiring line GL1 and the upper gate wiring line GL2.

The pixel electrode PE includes a portion positioned on the first organic insulating layer 11. In the present embodiment, the pixel electrode PE includes a first electrode layer (lower electrode layer) PL1, a second electrode layer (intermediate electrode layer) PL2, and a third electrode layer (upper electrode layer) PL3 that are formed of a transparent conductive material. The first electrode layer PL1, the second electrode layer PL2, and the third electrode layer PL3 are disposed in this order from the substrate 1 side. The first electrode layer PL1, the second electrode layer PL2, and the third electrode layer PL3 are electrically connected to each other.

The first electrode layer PL1 is formed on the second interlayer insulating layer 10 and in the first pixel contact hole CHp1. The first electrode layer PL1 includes a portion (hereinafter referred to as a "first portion") p1 in contact with the drain contact region 4d of the oxide semiconductor layer 4 in the first pixel contact hole CHp1 and a portion (hereinafter referred to as a "second portion") p2 positioned in the second pixel contact hole CHp2. The first electrode layer PL1 functions as a connection electrode that electrically connects the drain contact region 4d of the oxide semiconductor layer 4 and the second electrode layer PL2.

The second electrode layer PL2 is formed on the first organic insulating layer 11 and in the second pixel contact hole CHp2. The second electrode layer PL2 includes a portion (hereinafter referred to as a "third portion") p3 in contact with the second portion p2 of the first electrode layer PL1 in the second pixel contact hole CHp2 and a portion (hereinafter referred to as a "fourth portion") p4 positioned on the first organic insulating layer 11. The second electrode layer PL2 functions as a connection electrode that electrically connects the first electrode layer PL1 and the third electrode layer PL3.

The second organic insulating layer 12 is disposed above the first organic insulating layer 11 so as to fill the second pixel contact hole CHp2. That is, the organic insulating layer RL that functions as a flattened layer is constituted by the first organic insulating layer 11 and the second organic insulating layer 12. The second organic insulating layer 12 covers the third portion p3 of the second electrode layer PL2. The second organic insulating layer 12 is formed of, for example, a photosensitive resin material.

As illustrated in FIGS. 6A and 6C, the second organic insulating layer 12 may be formed continuously so as to fill the second pixel contact holes CHp2 of the plurality of pixel areas PIX in the same row. Here, when viewed from the normal direction of the substrate 1, the second organic insulating layer 12 extends in a row direction so as to cover the lower gate wiring line GL1 and the upper gate wiring line GL2 constituting each gate wiring line GL. In the cross section illustrated in FIG. 6C, the second organic insulating layer 12 is disposed so as to cover a side surface sc and the bottom surface be of each second pixel contact hole CHp2 and cover the upper surface of the first organic insulating layer 11 (a portion positioned in the periphery of the second pixel contact hole CHp2).

The second organic insulating layer 12 includes a portion that is in direct contact with the first organic insulating layer 11. It is preferable that the second organic insulating layer 12 be in direct contact with a portion of the first organic insulating layer 11 on the side surface sc of the second pixel contact hole CHp2. For example, as illustrated in the drawing, a portion of the first organic insulating layer 11 may be covered with the second electrode layer PL2, and the other portion may be in contact with the second organic insulating layer 12 on the side surface sc of the second pixel contact hole CHp2.

The third electrode layer PL3 is formed on the first organic insulating layer 11, the second electrode layer PL2, and the second organic insulating layer 12. The third electrode layer PL3 includes a portion (hereinafter referred to as a "fifth portion") p5 in contact with the fourth portion p4 of the second electrode layer PL2 and a portion (hereinafter referred to as a "sixth portion") p6 positioned on the second organic insulating layer 12.

The dielectric layer 17 is provided on the organic insulating layer RL including the first organic insulating layer 11 and the second organic insulating layer 12 so as to cover the pixel electrode PE. The common electrode CE facing the pixel electrode PE is provided on the dielectric layer 17. At least one slit 18p is formed for each pixel area PIX in the common electrode CE.

As illustrated in FIG. 6C, the first impurity removed region ERd includes a dual-layer hole structure portion HS formed in the organic insulating layer RL and the dielectric layer 17, the common electrode CE, and an island-shaped transparent conductive portion Ta formed in the same layer as the common electrode CE. The dual-layer hole structure portion HS includes a through-hole h1 formed in the dielectric layer 17 and a bottomed hole h2 formed in the organic insulating layer RL. The common electrode CE includes an opening ht that is positioned on the dielectric layer 17 and exposes at least a portion of the dual-layer hole structure portion HS. The island-shaped transparent conductive portion Ta is positioned in the bottomed hole h2. The island-shaped transparent conductive portion Ta is disposed separated from the common electrode CE and is electrically separated from the common electrode CE. In this example, the island-shaped transparent conductive portion Ta is in contact with a portion (here, a bottom surface) of an inner surface s2 of the bottomed hole h2. In this manner, the first impurity removed region ERd illustrated in FIG. 6C has a third structure, that is, a structure similar to that of the impurity removed region ER3 illustrated in FIGS. 4A and 4B. The dielectric layer 17 and the common electrode CE are equivalent to the inorganic insulating layer IL and the transparent conductive layer TL in the impurity removed region ER3, respectively.

It is preferable that the organic insulating layer RL have an interface portion where the first organic insulating layer 11 and the second organic insulating layer 12 are in direct contact with each other. The position of the interface portion is not particularly limited. As described above, the first organic insulating layer 11 and the second organic insulating layer 12 may be in direct contact with each other at a portion of a side wall of the second pixel contact hole CHp2. The bottomed hole h2 of the organic insulating layer RL may be formed in a region including an interface portion where the first organic insulating layer 11 and the second organic insulating layer 12 are in direct contact with each other. Then, the first organic insulating layer 11 and the second organic insulating layer 12 include exposed portions 11a and 12a in the bottomed hole h2. With such a configuration, impurities contained in both the first organic insulating layer 11 and the second organic insulating layer 12 can be more efficiently discharged via one dual-layer hole structure portion HS.

Note that the bottomed hole h2 may be provided on only one of the first organic insulating layer 11 and the second organic insulating layer 12. In this case, only one of the first organic insulating layer 11 and the second organic insulating layer 12 is exposed in the bottomed hole h2. Even with such a configuration, impurities in the other organic insulating layer can be moved to the bottomed hole h2 through the interface portion, and thus impurities from both the first organic insulating layer 11 and the second organic insulating layer 12 can be efficiently discharged from the bottomed hole h2.

The size of the outer edge of the bottomed hole h2 in the first impurity removed region ERd is not particularly limited. As an example, as illustrated in FIG. 6A, a width w1 of the bottomed hole h2 in a row direction is larger than the width of the source wiring line SL and may be three times or less the width of the source wiring line SL. A width w2 of the bottomed hole h2 in a column direction may be ½ or more and equal to or less than the width of the gate wiring line GL (here, the lower gate wiring line GL1). Thereby, it is possible to secure the area of the inner surface s2 of the bottomed hole h2 (the area of the impurity discharging surface) while suppressing the influence on display characteristics.

As illustrated in FIG. 6C, a depth (a distance along the normal direction of the substrate 1 from the uppermost portion of the inner surface s2 of the bottomed hole h2 to a point positioned closest to the substrate 1 side on the inner surface s2 of the bottomed hole h2) d of the bottomed hole h2 may be ¼ or more of a thickness (for example, the thickness of the organic insulating layer RL at the source-gate intersection portion where the first impurity removed region ERd is not provided) H of the organic insulating layer RL. Thereby, it is possible to increase the area of the inner surface s2 of the bottomed hole h2. As a result, the area of the exposed surface of the organic insulating layer RL that functions as an impurity discharging surface increases, and thus the efficiency of removing impurities can be further improved. In addition, it is also easy to discharge impurities positioned in a relatively deep region in the organic insulating layer RL. In a case where the first impurity removed region ERd has a third structure, it is preferable that the depth d of the bottomed hole h2 be set to be, for example, three times or more the thickness of the transparent conductive layer TL. Thereby, a portion of the inner surface s2 of the bottomed hole h2 can be more reliably exposed from the island-shaped transparent conductive portion Ta.

On the other hand, when the depth d of the bottomed hole h2 is excessively large, the alignment of the liquid crystal layer (not illustrated) may be disturbed due to surface irregularities of the organic insulating layer RL, and there is a concern that display contrast may be degraded. When the depth d of the bottomed hole h2 is, for example, ¾ or less of the thickness H of the organic insulating layer RL, the surface shape of a portion of an alignment film which is positioned above the bottomed hole h2 can be brought close to a flat shape by filling the bottomed hole h2 with the alignment film provided for liquid crystal display (see FIG. 16). As a result, it is possible to more effectively suppress the degradation of display contrast caused by surface irregularities due to the bottomed hole h2. As an example, the depth d of the bottomed hole h2 may be 200 nm or more and 800 nm or less.

The size of the through-hole h1 is not particularly limited. When viewed from the normal direction of the substrate 1, the outer edge of the through-hole h1 may be positioned on an inner side of the outer edge of the bottomed hole h2. The widths of the outer edge of the through-hole h1 in a row direction and the column direction may be ½ or more of the widths w1 and w2 of the bottomed hole h2 in a row direction and the column direction. Thereby, impurities discharged from the bottomed hole h2 are not likely to interfere with the inorganic insulating layer IL, and thus can be more efficiently discharged to the outside.

When viewed from the normal direction of the substrate 1, a width v (FIG. 6C) of a portion (an eaves portion) of the dielectric layer 17 which is positioned on the inner side of the outer edge of the bottomed hole h2 may be, for example, 200 nm or more and 800 nm or less. When the width v is 200 nm or more, a reduction in the area of the common electrode CE can be suppressed by also disposing the common electrode CE on the eaves portion. When the width v is 800 nm or less, impurities discharged from the bottomed hole h2 are not likely to interfere with the inorganic insulating layer IL, and thus can be more efficiently discharged to the outside.

Effects

Since the active matrix substrate 100A in the present embodiment includes the plurality of first impurity removed regions ERd in the display region DR, impurities such as moisture infiltrated into the organic insulating layer RL during a manufacturing process can be efficiently discharged to the outside of the active matrix substrate 100A via the first impurity removed regions ERd. Thus, it is possible to suppress fluctuations in characteristics of the pixel TFT 20 caused by impurities entering the oxide semiconductor layer 4 of the pixel TFT 20 from the organic insulating layer RL. In addition, since the first impurity removed regions ERd do not contribute to display in the display region DR and are disposed at a source-gate intersection portion which is a light-shielded region, it is possible to suppress the degradation of display characteristics due to the first impurity removed regions ERd.

The active matrix substrate 100A includes two organic insulating layers (here, the first organic insulating layer 11 and the second organic insulating layer 12) provided in different steps as the organic insulating layer RL. In the present specification, a structure including two organic insulating layers, which are provided in different steps, above the pixel TFT in this manner is referred to as an "organic insulating layer layered structure". In the organic insulating layer layered structure, a step of a contact hole or the like provided in the lower organic insulating layer can be flattened by the upper organic insulating layer, and thus the occurrence of an alignment disturbance of liquid crystal molecules caused by the step is suppressed. More specifically, in the active matrix substrate 100A, a step due to the second pixel contact hole CHp2 formed in the first organic insulating layer 11 is flattened by the second organic insulating layer 12, and the occurrence of an alignment disturbance of liquid crystal molecules caused by the second pixel contact hole CHp2 is suppressed. For this reason, it is not necessary to shield light in the second pixel contact hole CHp2 and the vicinity thereof, and a portion above the second pixel contact hole CHp2 and the vicinity thereof can be used as an opening (a region that contributes to display), which leads to an improvement in transmittance.

The impurity removed region ER in the present embodiment can be suitably applied to an active matrix substrate having an organic insulating layer layered structure. The volume (total volume) of the organic insulating layer that may contain impurities increases by layering the organic insulating layers, but it is possible to promote the discharge of impurities from each of the layered organic insulating layers by providing the dual-layer hole structure portion HS in the present embodiment. For example, the bottomed hole h2 of the dual-layer hole structure portion HS is disposed so as to expose both the first organic insulating layer 11 and the second organic insulating layer 12, and thus it is possible to more effectively promote the discharge of impurities from both the first organic insulating layer 11 and the second organic insulating layer 12.

The active matrix substrate 100A uses a transparent electrode layer (here, the first electrode layer PL1) formed of a transparent conductive material instead of a metal electrode, as a drain electrode of the pixel TFT 20. In the present specification, a structure in which the pixel TFT and the pixel electrode are connected to each other by the transparent electrode layer in this manner is referred to as a "transparent contact structure". It is possible to increase transmittance (pixel aperture ratio) by adopting the transparent contact structure. More specifically, in the active matrix substrate 100A, the first electrode layer PL1, the second electrode layer PL2, and the third electrode layer PL3 included in the pixel electrode PE are all formed of a transparent conductive material, and thus a decrease in transmittance due to the pixel electrode PE including these electrode layers does not occur substantially. Further, the first electrode layer PL1 including a portion (first portion) p1 in contact with the drain contact region 4d of the oxide semiconductor layer 4 is formed of a transparent conductive material, and thus a portion above the first pixel contact hole CHp1 (that is, a vicinity of the drain contact region 4d) can be used as an opening, which leads to a further improvement in transmittance. Further, in the present embodiment, since the third electrode layer PL3 includes a portion (sixth portion) p6 positioned on the second organic insulating layer 12, a region in which a distance between the pixel electrode PE and the common electrode CE is kept constant becomes wider, and a region in which a fringe electric field having a sufficient strength is generated becomes wider, which also improves transmittance.

The impurity removed region ER in the present embodiment may be suitably applied to an active matrix substrate having a transparent contact structure. As a result of additional study, the inventor has found that, when a transparent contact structure is adopted, there is a possibility that impurities contained in the organic insulating layer will easily reach the oxide semiconductor layer of the pixel TFT via the transparent electrode layer (here, the first electrode layer PL1) such as an ITO layer. When the dual-layer hole structure portion HS in the present embodiment is provided in such an active matrix substrate, the discharge of impurities contained in the organic insulating layer RL to the outside is promoted, and thus it is possible to more effectively suppress infiltration of the impurities into the oxide semiconductor layer via the transparent electrode layer.

The configuration of the active matrix substrate 100A is also not limited to the configuration illustrated in the drawing. In the example illustrated in the drawing, for example, each first impurity removed region ERd has a third structure (FIGS. 4A and 4B), but may have a second structure (FIGS. 3A and 3B) instead (see FIG. 21B). In addition, the positions and number of the first impurity removed regions ERd are not limited to the example illustrated in the drawing.

In the present embodiment, the organic insulating layer RL includes the first organic insulating layer 11 and the second organic insulating layer 12, but the organic insulating layer RL may be constituted by only the first organic insulating layer 11. That is, the second pixel contact hole CHp2 may not be filled with an organic insulating layer. Alternatively, as will be described below, an other organic insulating layer that fills the second pixel contact hole CHp2 may be provided from above the common electrode CE.

Figure 7:
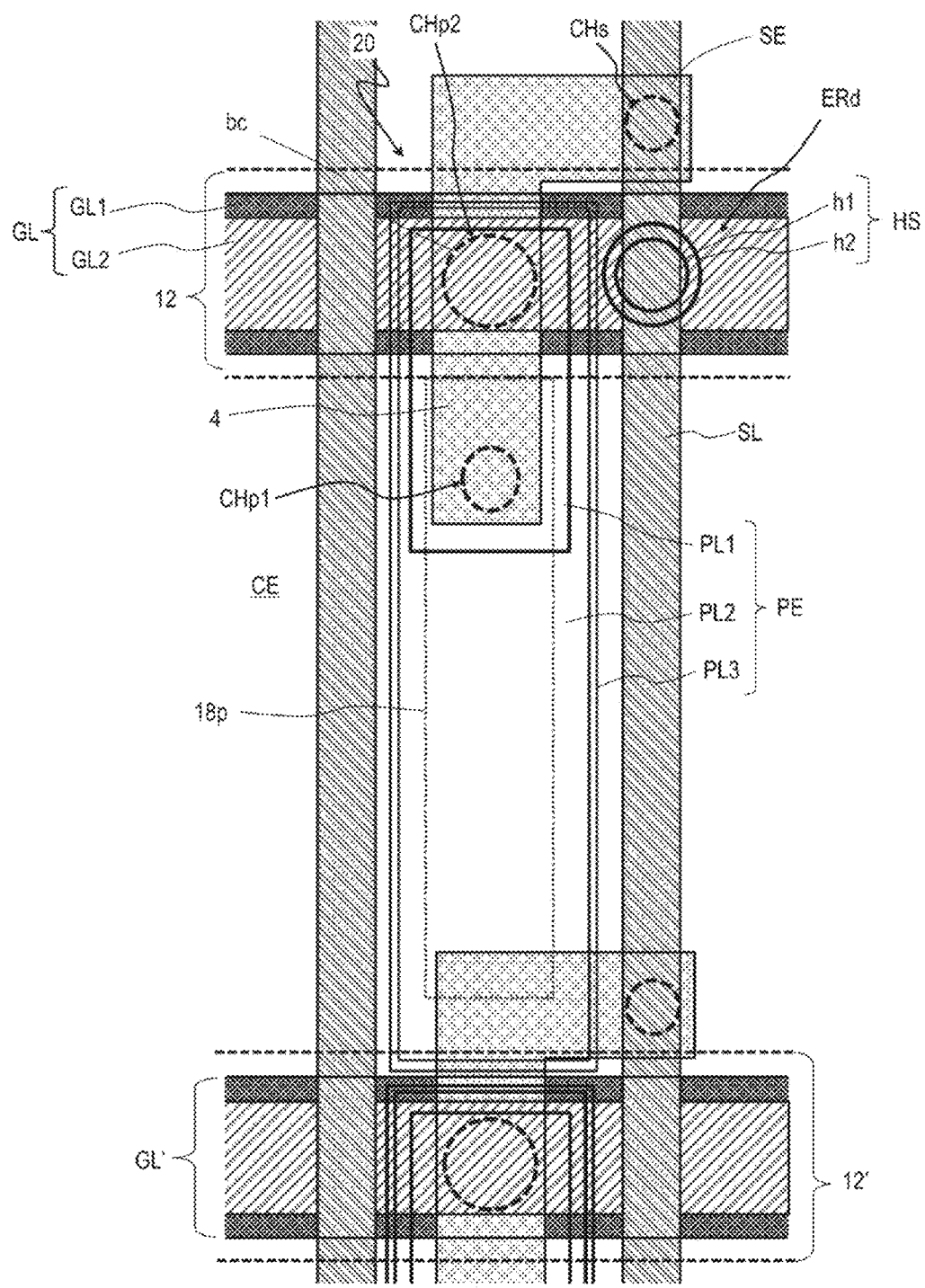
FIG. 7 is a plan view illustrating another arrangement of a pixel electrode PE.

The arrangement of the pixel electrode PE and the common electrode CE is not limited to the example illustrated in the drawing. As illustrated in FIG. 7, when viewed from the normal direction of the substrate 1, the second electrode layer PL2 and the third electrode layer PL3 in the pixel electrode PE may extend from the corresponding gate wiring line GL to the vicinity of another gate wiring line GL' adjacent to the gate wiring line GL in a column direction. Ends of the second electrode layer PL2 and the third electrode layer PL3 on the other gate wiring line GL' side (that is, ends on a side opposite to the third portion p3) may partially overlap the second organic insulating layer 12' on the other gate wiring line GL'. By adopting such a configuration, the end of the second electrode layer PL2 on the gate wiring line GL' side can be covered with the second organic insulating layer 12', and thus it is possible to suppress the generation of a step caused by the end of the second electrode layer PL2 on the gate wiring line GL' side and suppress light leakage due to the step.

In addition, although the pixel electrode PE is constituted by the three electrode layers PL1 to PL3 in the above description, the pixel electrode PE may not include the third electrode layer PL3. Further, a drain electrode formed of a metal material (for example, formed in the same layer as the source electrode SE) may be provided instead of the transparent first electrode layer PL1. Contact resistance can be reduced by forming the drain electrode, but a pixel aperture ratio may be reduced. For this reason, it is preferable to use the transparent first electrode layer PL1 particularly in a high-resolution active matrix substrate.

Further, different gate signals may be supplied to the lower gate electrode GE1 and the upper gate electrode GE2, respectively, in each pixel TFT 20. Alternatively, only the upper gate electrode GE2 may function as a gate electrode, and the lower gate electrode GE1 may be in an electrically floating state or may be fixed to a fixed potential (for example, a common potential).

Although the lower gate wiring line GL1 and the upper gate wiring line GL2 are provided as the gate wiring lines GL in the above description, any one of them may be provided. In a case where only the upper gate wiring line GL2 is provided as the gate wiring line, the pixel TFT may have a top gate structure. In a case where only the lower gate wiring line GL1 is provided as the gate wiring line, the pixel TFT may have a bottom gate structure. The position and shape of the oxide semiconductor layer 4 of each pixel TFT 20 are not limited to the example illustrated in the drawing. Additionally, in this example, the source wiring line SL is in a layer higher than the lower gate wiring line GL1 and the upper gate wiring line GL2, but the source wiring line SL may be provided in a layer lower than the lower gate wiring line GL1.

Figure 22A:
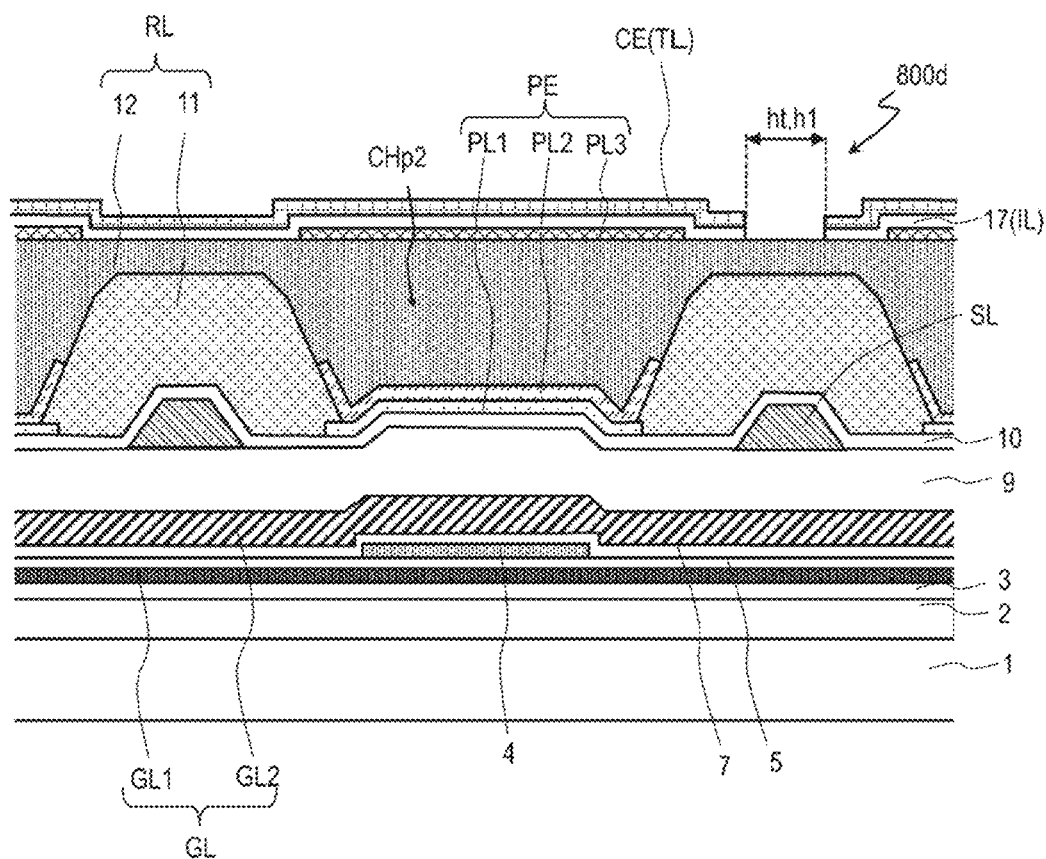
FIG. 22A is a cross-sectional view illustrating another impurity removed region 800*d*.
Figure 22B:
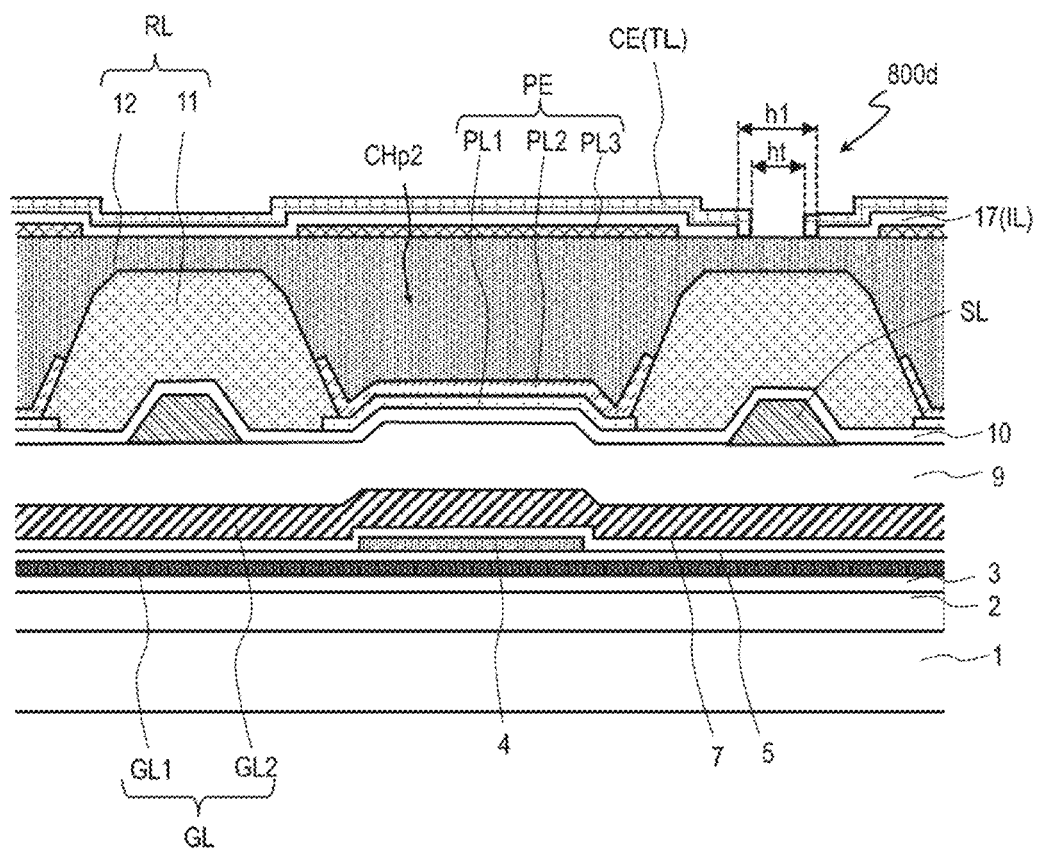
FIG. 22B is a cross-sectional view illustrating the other impurity removed region 800*d*.

As illustrated in FIGS. 22A and 22B, an impurity removed region 800d having at least the opening ht of the common electrode CE and the through-hole h1 of the dielectric layer 17 may be provided instead of the first impurity removed region ERd described above. The opening ht and the through-hole h1 are disposed so as to expose a portion of the organic insulating layer RL. In the impurity removed region 800d, the bottomed hole h2 may not be formed in the organic insulating layer RL. When viewed from the normal direction of the substrate 1, the side surfaces of the opening ht and the through-hole h1 may be aligned with each other (FIG. 22A), and the opening ht may be positioned on an inner side of the outer edge of the through-hole h1 (FIG. 22B). Although not illustrated in the drawing, the through-hole h1 may be positioned on an inner side of the outer edge of the opening ht.

Circuit TFT

The active matrix substrate 100A may further include peripheral circuits such as a gate driver GD, a demultiplexer circuit DMX, and the like in the non-display region FR. These peripheral circuits include a plurality of circuit TFTs. Each circuit TFT may be an oxide semiconductor TFT having an oxide semiconductor layer in the same layer as the oxide semiconductor layer 4 of the pixel TFT 20 as an active layer. The circuit TFT may be an oxide semiconductor TFT having a top gate structure, a bottom gate structure, or a double gate structure. Alternatively, the circuit TFT may be a silicon semiconductor TFT having a crystalline silicon semiconductor layer or an amorphous silicon layer as an active layer.

A configuration in which a crystalline silicon TFT having a crystalline silicon semiconductor layer as an active layer is provided as a circuit TFT will be described below.

Figure 8:
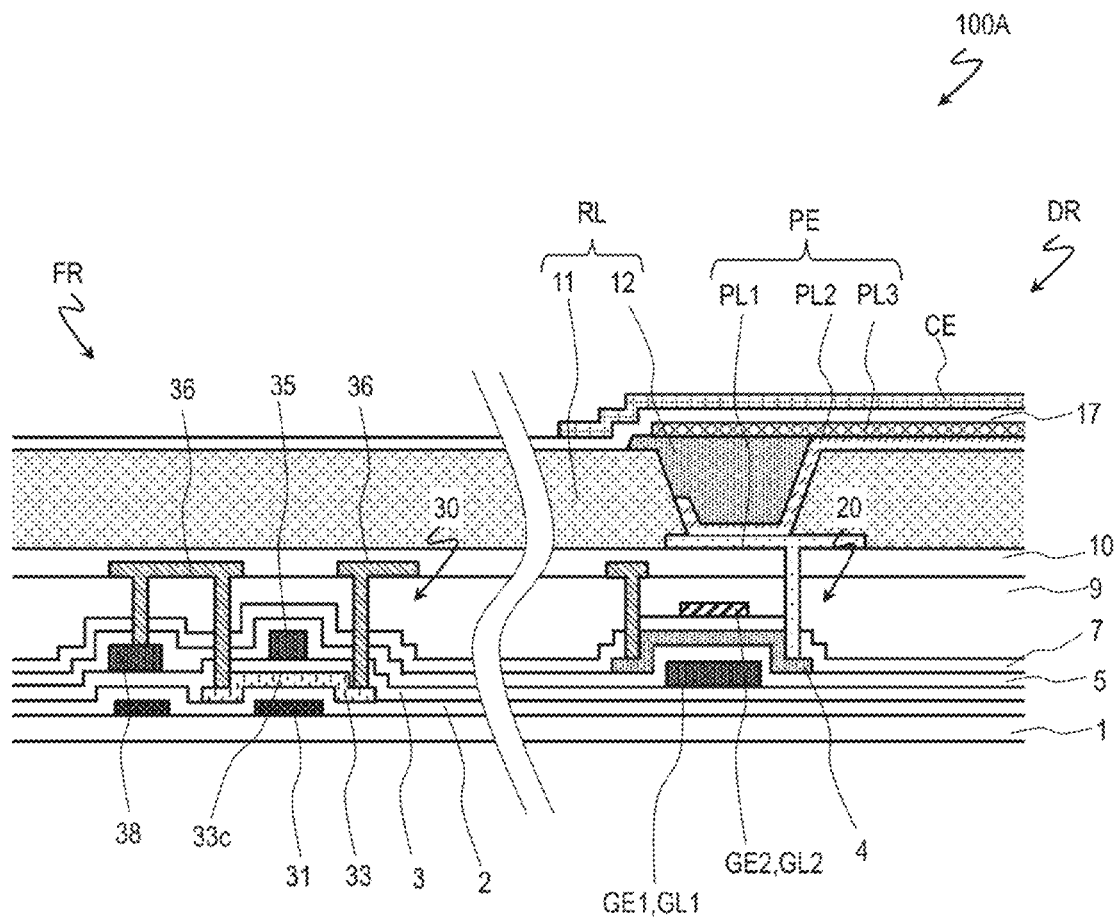
FIG. 8 is a cross-sectional view illustrating a circuit TFT 30 and a pixel TFT 20 in the active matrix substrate 100A.

FIG. 8 is an enlarged cross-sectional view illustrating a portion of a peripheral circuit in the non-display region FR and a portion of the pixel area PIX of the display region DR. A configuration of the pixel area is similar to the configuration described above with reference to FIGS. 6A to 6C, and thus description thereof will be omitted.

The peripheral circuit includes at least one circuit TFT 30. The circuit TFT 30 is, for example, a crystalline silicon TFT having a top gate structure.

The circuit TFT 30 includes a light shielding layer 31 located on the substrate 1, a crystalline silicon semiconductor layer 33 including a channel region 33c, a gate electrode 35, and a source electrode and drain electrode 36. The first lower insulating layer 2 extends between the light shielding layer 31 and the crystalline silicon semiconductor layer 33 as a lower gate insulating layer. The second lower insulating layer 3 extends between the crystalline silicon semiconductor layer 33 and the gate electrode 35 as a lower gate insulating layer. When viewed from the normal direction of the substrate 1, the light shielding layer 31 and the gate electrode 35 are disposed so as to at least partially overlap the channel region 33c of the crystalline silicon semiconductor layer 33. The light shielding layer 31 may be, for example, in an electrically floating state. Note that the light shielding layer 31 may be made to function as a lower gate (double gate structure) by electrically connecting the light shielding layer 31 and the gate electrode 35.

The gate electrode 35 is formed in the same layer as the lower gate wiring line GL1 and the lower gate electrode GE1 of the pixel TFT 20. The wording "formed in the same layer," means being formed of the same conductive film. The lower gate insulating layer 5 and the upper gate insulating layer 7 of the pixel TFT 20 extend above the gate electrode 35, and the first interlayer insulating layer 9 further extends above the layers.

The source electrode and drain electrode 36 are arranged on the first interlayer insulating layer 9. Here, the source electrode and drain electrode 36 are formed in the same layer as the source wiring line SL and the source electrode SE of the pixel TFT 20. The second lower insulating layer 3, the lower gate insulating layer 5, the upper gate insulating layer 7, and the first interlayer insulating layer 9 are provided with a circuit contact hole that exposes portions positioned on both sides of the channel region 33c of the crystalline silicon semiconductor layer 33. The source electrode and drain electrode 36 are electrically connected to the crystalline silicon semiconductor layer 33 in the circuit contact hole. The source electrode and drain electrode 36 may be electrically connected to a wiring line in the same layer as these electrodes, or to a wiring line 38 in the same layer as the lower gate electrode GE1.

The circuit TFT 30 is covered with the second interlayer insulating layer 10 and the first organic insulating layer 11. The dielectric layer 17 may be disposed on the first organic insulating layer 11.

Modification Example 1: Active Matrix Substrate 100B

Figure 9:
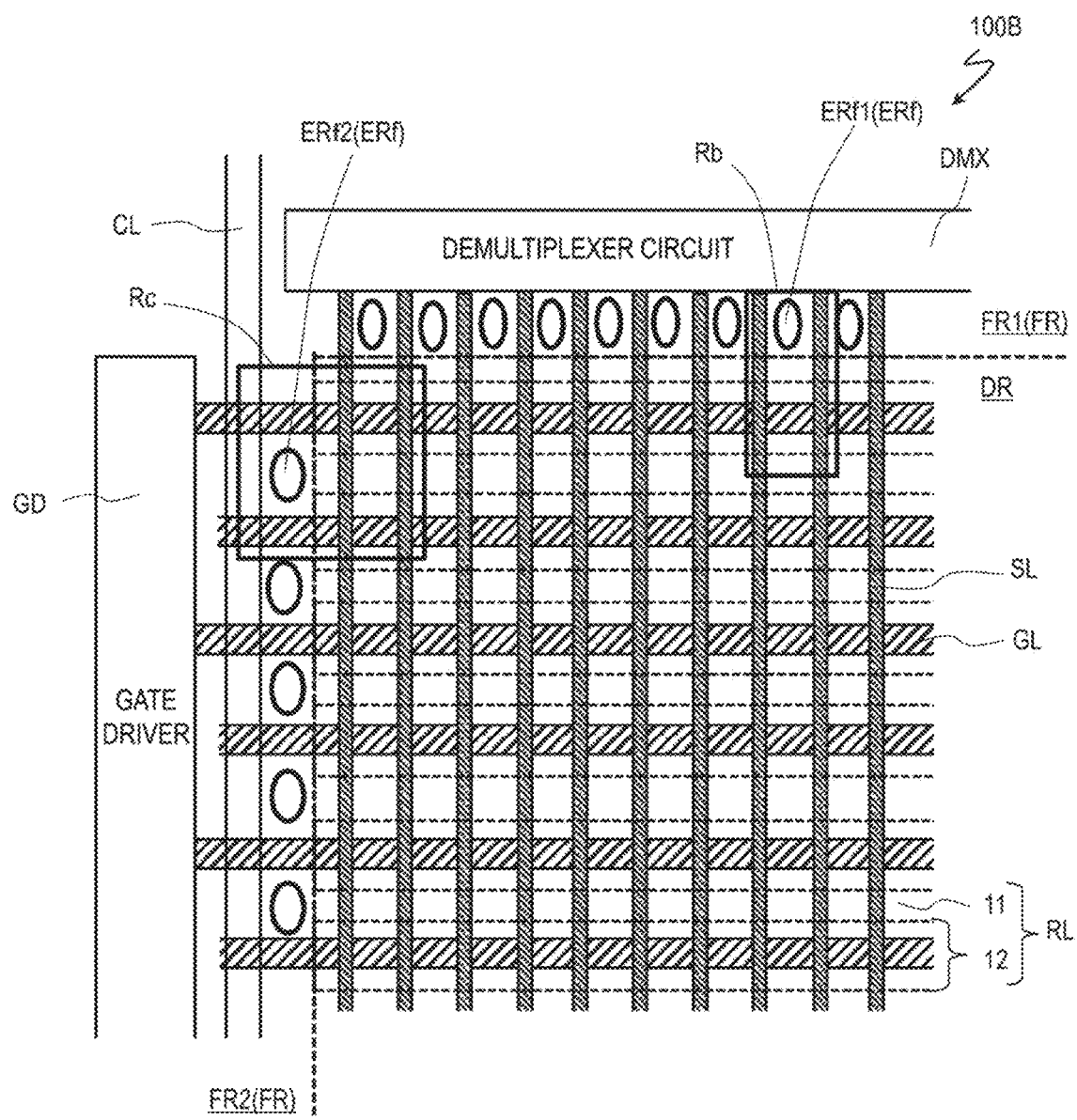
FIG. 9 is a schematic plan view illustrating the arrangement of impurity removed regions ERf in an active matrix substrate 100B.

FIG. 9 is a schematic plan view illustrating the arrangement of the second impurity removed regions ERf in an active matrix substrate 100B according to Modification Example 1. The active matrix substrate in Modification Example 1 differs from the active matrix substrate 100A described above in that the second impurity removed region ERf is provided in the non-display region FR.

As illustrated in FIG. 9, in the active matrix substrate 100B, a plurality of second impurity removed regions ERf are disposed separated from each other in the non-display region FR. It is preferable that the second impurity removed regions ERf be provided in proximity to the display region DR. When viewed from the normal direction of the substrate 1, the plurality of second impurity removed regions ERf are disposed in the non-display region FR along a boundary between the display region DR and the non-display region FR. When viewed from the normal direction of the substrate 1, the plurality of second impurity removed regions ERf may be disposed so as to surround the display region DR. For example, the plurality of second impurity removed regions ERf may be disposed on the outer side of pixel rows at both ends (an upper end and a lower end) in a column direction and both side ends (a right end and a left end) in a row direction. Thereby, it is possible to more effectively prevent impurities discharged from the organic insulating layer RL from entering the oxide semiconductor layer 4 of the pixel TFT 20 in the display region DR.

As illustrated in the drawing, the second impurity removed regions ERf may be disposed between the peripheral circuit such as the gate driver GD or the demultiplexer circuit DMX and the display region DR. In the present specification, a region FR1 positioned between the display region DR and the demultiplexer circuit DMX in the non-display regions FR is referred to as a "first non-display region", and a region FR2 positioned between the display region DR and the demultiplexer circuit DMX is referred to as a "second non-display region". In this example, the second impurity removed region ERf includes a plurality of second impurity removed regions ERf1 disposed in the first non-display region FR1 and a plurality of second impurity removed regions ERf2 disposed in the second non-display region FR2 when viewed from the normal direction of the substrate 1.

The plurality of second impurity removed regions ERf1 may be arrayed, for example, on the outer side of pixel rows at one end in the column direction (pixel rows positioned closest to the demultiplexer circuit DMX side) so as to be separated from each other along the row direction. The second impurity removed regions ERf1 may be disposed between two adjacent source wiring lines SL.

On the other hand, the plurality of second impurity removed regions ERf2 may be arrayed on the outer side of pixel columns at one side end or both side ends (pixel columns positioned closest to the gate driver GD side) in the row direction so as to be separated from each other in the column direction. The second impurity removed regions ERf2 may be disposed between two adjacent gate wiring lines GL. In a case where the common wiring line CL for supplying a signal to the common electrode CE is formed between the gate driver GD and the display region DR when viewed from the normal direction of the substrate 1, the second impurity removed regions ERf2 may be disposed in a region between the common wiring line CL and the display region DR and in which the common electrode CE extends.

Note that the positions and number of the second impurity removed regions ERf1 and the second impurity removed regions ERf2 are not limited to the example illustrated in the drawing. The second impurity removed regions ERf1 may be disposed for every two or more source wiring lines SL. Similarly, the second impurity removed regions ERf2 may be disposed for every two or more gate wiring lines GL. Further, only one of the second impurity removed region ERf1 and the second impurity removed region ERf2 may be provided. Further, in this example, when viewed from the normal direction of the substrate 1, the second impurity removed regions ERf1 and ERf2 are disposed at a position that does not overlap the source wiring line SL or the gate wiring line GL, but a portion or the entirety of the second impurity removed regions ERf1 and ERf2 (a portion or the entirety of the bottomed hole h2) may overlap the source wiring line SL or the gate wiring line GL.

Figure 10A:
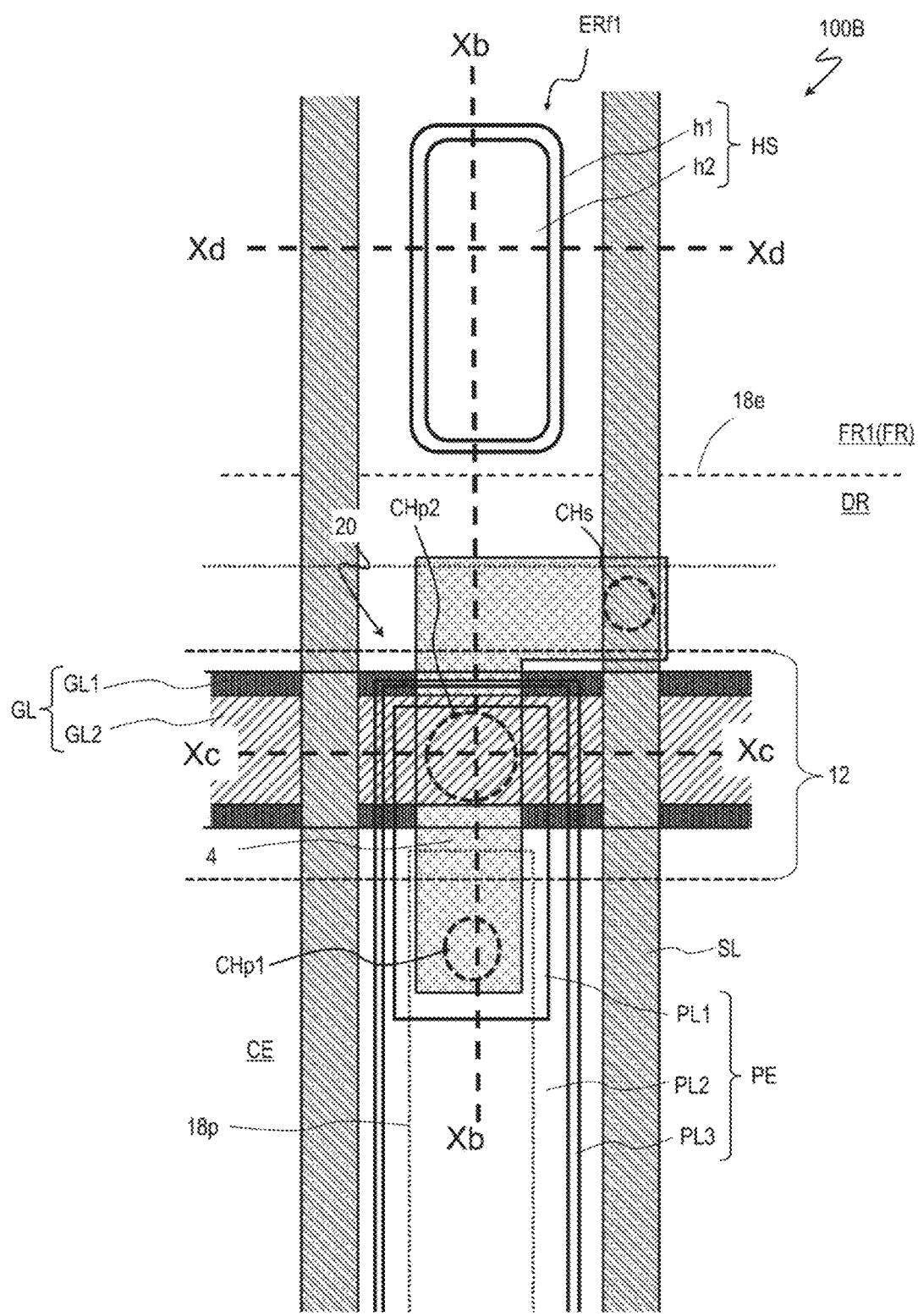
FIG. 10A is a plan view illustrating portions of a pixel area PIX and a first non-display region FR1 at an upper end in the active matrix substrate 100B.
Figure 10B:
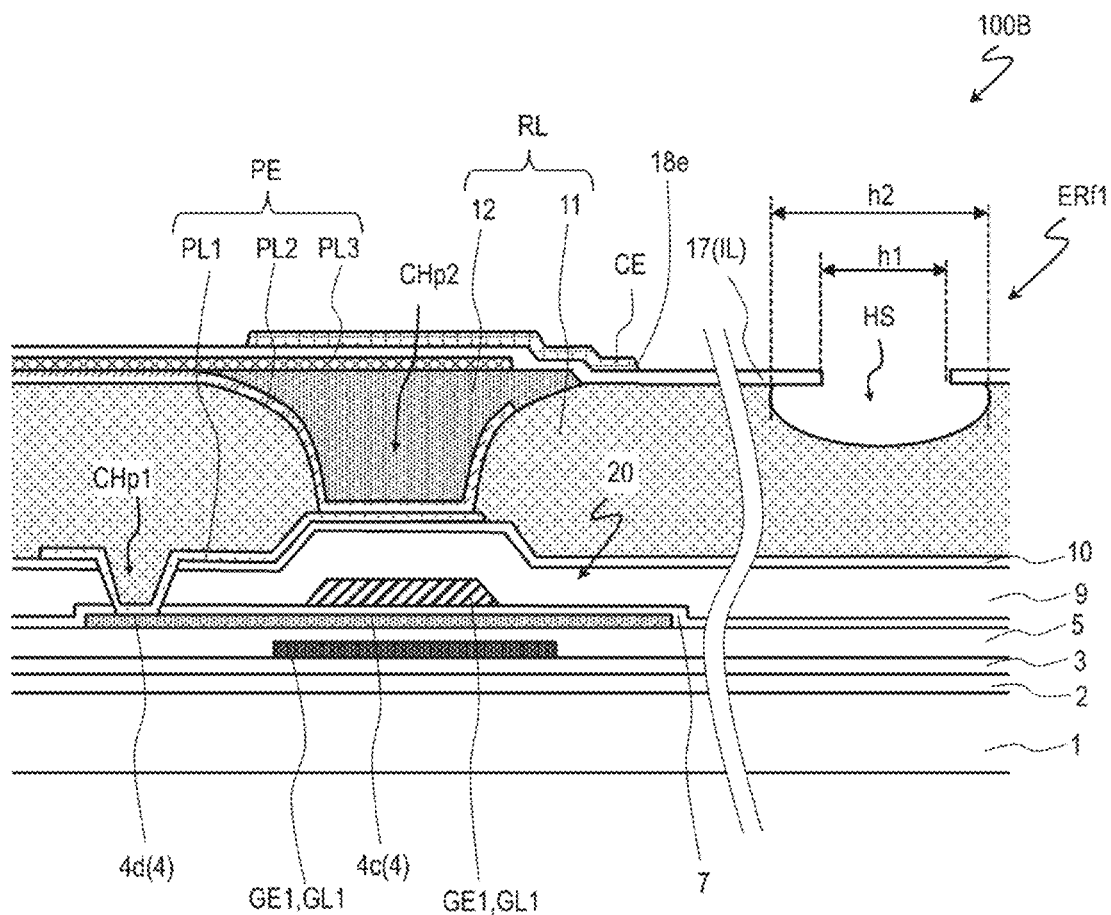
FIG. 10B is a cross-sectional view taken along a line Xb-Xb illustrated in FIG. 10A.
Figure 10C:
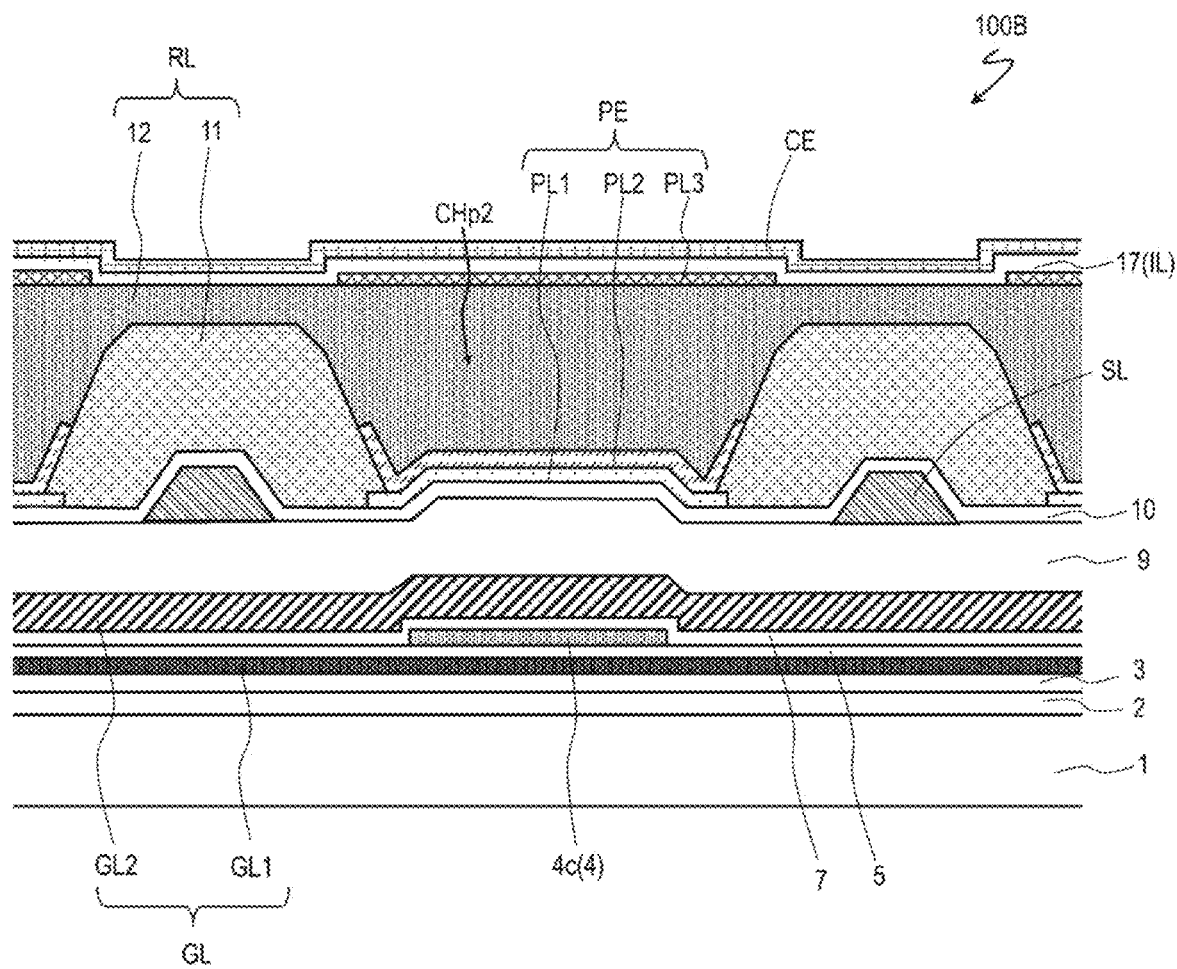
FIG. 10C is a cross-sectional view taken along a line Xc-Xc illustrated in FIG. 10A.
Figure 10D:
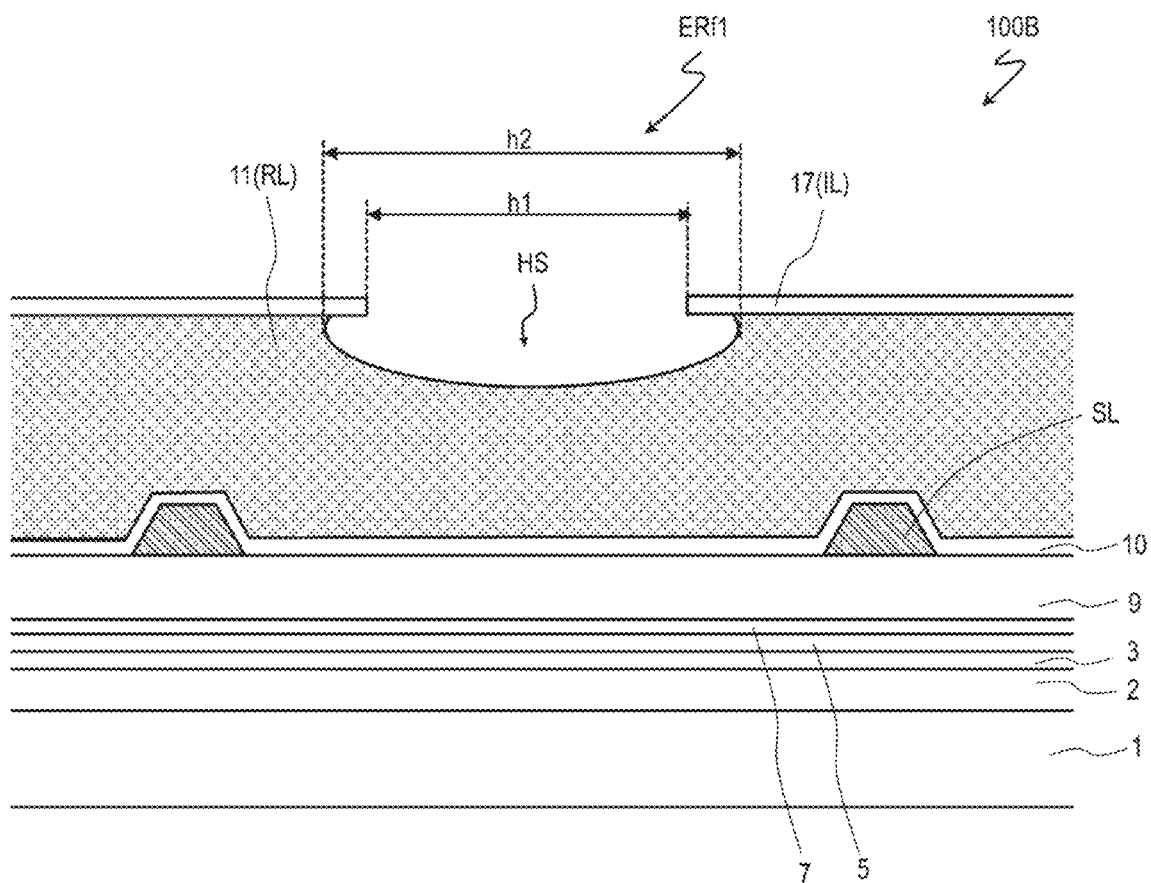
FIG. 10D is a cross-sectional view taken along a line Xd-Xd illustrated in FIG. 10A.
Figure 11A:
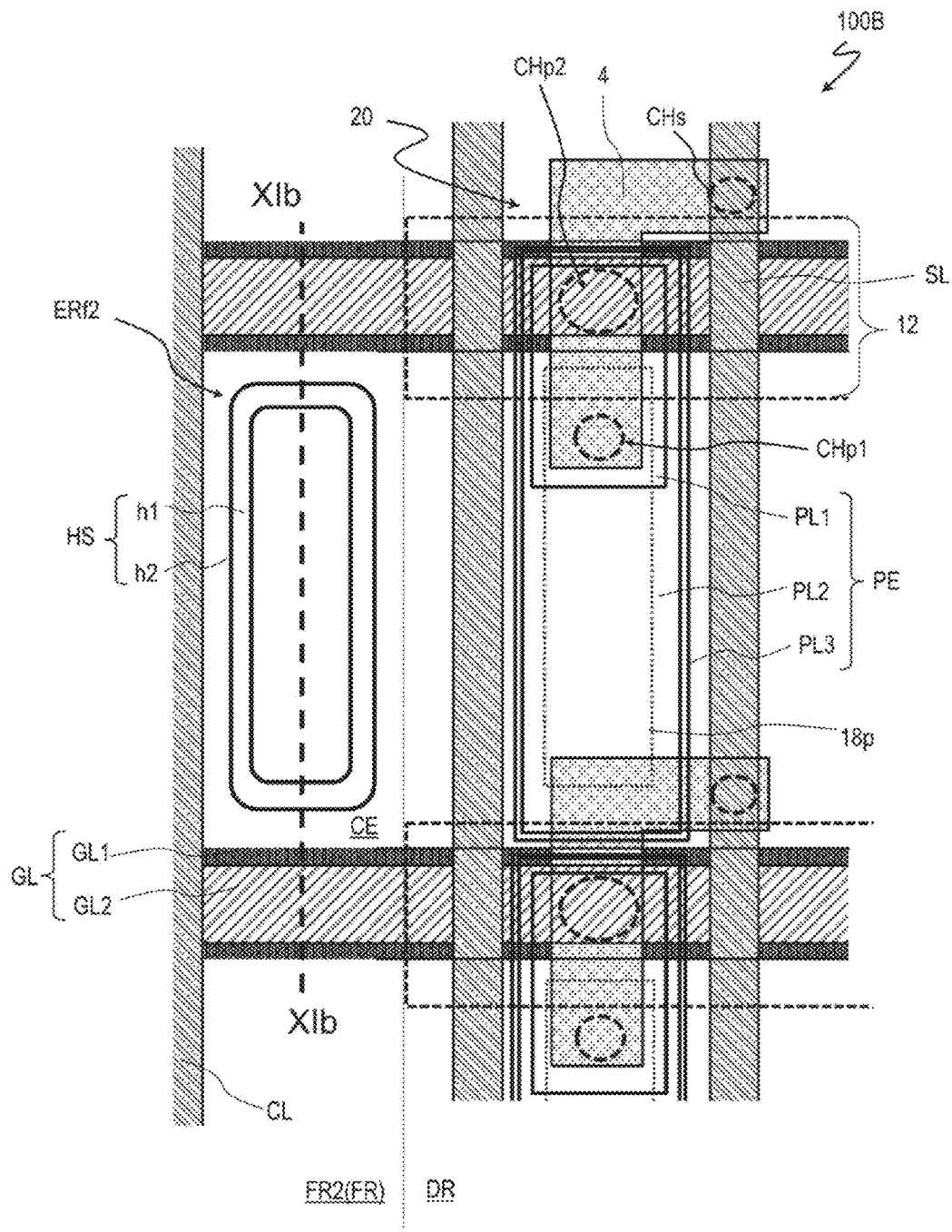
FIG. 11A is a plan view illustrating portions of a pixel area PIX and a second non-display region FR2 at one side end in the active matrix substrate 100B.
Figure 11B:
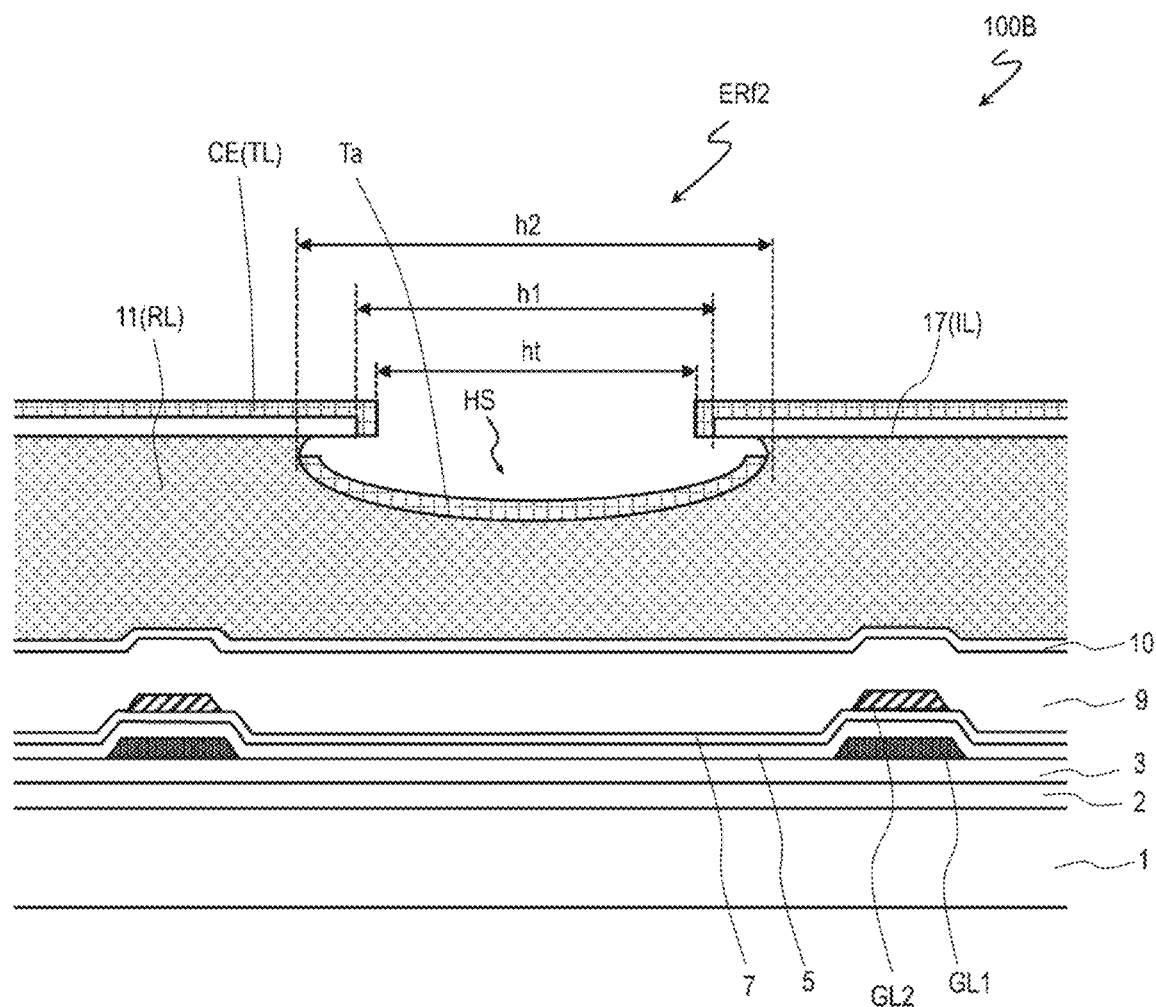
FIG. 11B is a cross-sectional view taken along a line XIb-XIb illustrated in FIG. 11A.

FIG. 10A illustrates one pixel area PIX positioned in a pixel row at one end (upper end) of the active matrix substrate 100B in the column direction, and a portion of the first non-display region FR1. FIG. 10A corresponds to the region Rb illustrated in FIG. 9. FIGS. 10B and 10D are cross-sectional views taken along a line Xb-Xb, a line Xc-Xc, and a line Xd-Xd illustrated in FIG. 10A, respectively. FIG. 11A illustrates one pixel area PIX positioned in a pixel column at one side end (left end) of the active matrix substrate 100B in the row direction, and a portion of the second non-display region FR2. FIG. 11A corresponds to the region Rc illustrated in FIG. 9. FIG. 11B is a cross-sectional view taken along a line XIb-XIb illustrated in FIG. 11A.

The structure of each pixel area PIX in the active matrix substrate 100B is similar to that of the active matrix substrate 100A described above except that the first impurity removed region ERd is not disposed.

As illustrated in FIGS. 10A and 10B, in the first non-display region FR1 of the active matrix substrate 100B, the second impurity removed region ERf1 is disposed between two adjacent source wiring lines SL.

In this example, the first non-display region FR1 is positioned closer to the demultiplexer circuit DMX side than an end portion 18e of the common electrode CE. That is, the common electrode CE does not extend to the first non-display region FR1. For this reason, the second impurity removed region ERf1 has a first structure (which is a structure similar to that of the impurity removed region ER1 illustrated in FIGS. 2A and 2B). The dielectric layer 17 is equivalent to the inorganic insulating layer IL in the impurity removed region ER1.

As illustrated in FIGS. 11A and 11B, the second impurity removed region ERf2 is disposed between two adjacent gate wiring lines GL in the second non-display region FR2. In this example, the common wiring line CL extends in a column direction between the display region DR and the gate driver GD. The common wiring line CL is, for example, a wiring line formed in the same layer as the source wiring line SL, the upper gate wiring line GL2, or the lower gate wiring line GL1. The common electrode CE extends from the display region DR to the common wiring line CL, and is electrically connected to the common wiring line CL at a connection portion positioned on the common wiring line CL or in the vicinity of the common wiring line CL. The second impurity removed regions ERf2 are disposed in a region in which the common electrode CE extends in the second non-display region FR2.

In the example illustrated in the drawing, each of the second impurity removed regions ERf2 has a third structure (FIGS. 4A and 4B). The dielectric layer 17 and the common electrode CE correspond to the inorganic insulating layer IL and the transparent conductive layer TL, respectively, in the impurity removed region ER3 illustrated in FIGS. 4A and 4B. That is, the opening ht is provided on the common electrode CE on the dual-layer hole structure portion HS. An island-shaped transparent conductive portion Ta formed in the same layer as the common electrode CE is disposed within the opening ht. The island-shaped transparent conductive portion Ta is in contact with a portion of the inner surface s2 of the bottomed hole h2. Note that each of the second impurity removed regions ERf2 may have a second structure (FIGS. 3A and 3B).

In the active matrix substrate 100B, the second organic insulating layer 12 is not formed in the first non-display region FR1 and the second non-display region FR2. For this reason, in each of the second impurity removed regions ERf1 and ERf2, the bottomed hole h2 constituting the dual-layer hole structure portion HS is provided only in the first organic insulating layer 11. The first organic insulating layer 11 includes a portion exposed in the bottomed hole h2, but the second organic insulating layer 12 is not exposed in the bottomed hole h2. However, as can be seen from FIGS. 10B and 10C, since a portion of the second organic insulating layer 12 is in direct contact with the first organic insulating layer 11, impurities in the second organic insulating layer 12 can move to the two-layer hole structure portion HS of any one of the second impurity removed regions ERf1 and ERf2 through an interface with the first organic insulating layer 11 and can be discharged to the outside.

In the example illustrated in the drawing, when viewed from the normal direction of the substrate 1, the outer edge of the bottomed hole h2 of the dual-layer hole structure portion HS in each of the second impurity removed regions ERf1 and ERf2 has substantially a rectangular shape, and the outer edge of the through-hole h1 has a rectangular shape that is one size smaller than the bottomed hole h2. Note that the shapes of the bottomed hole h2 and the through-hole h1 are not limited thereto and may be circular or elliptical shapes. The sizes of the through-holes h1 and the bottomed hole h2 in the second impurity removed regions ERf1 and ERf2 are not particularly limited and may be appropriately selected depending on the sizes of regions for forming the second impurity removed regions ERf1 and ERf2. The depth d of the bottomed hole h2, a relationship between the sizes of the through-hole h1, the bottomed hole h2, and the opening ht, the width v of the eaves portion of the dielectric layer 17 (the inorganic insulating layer IL), and the like may be similar to those of the active matrix substrate 100A described above.

Figure 18:
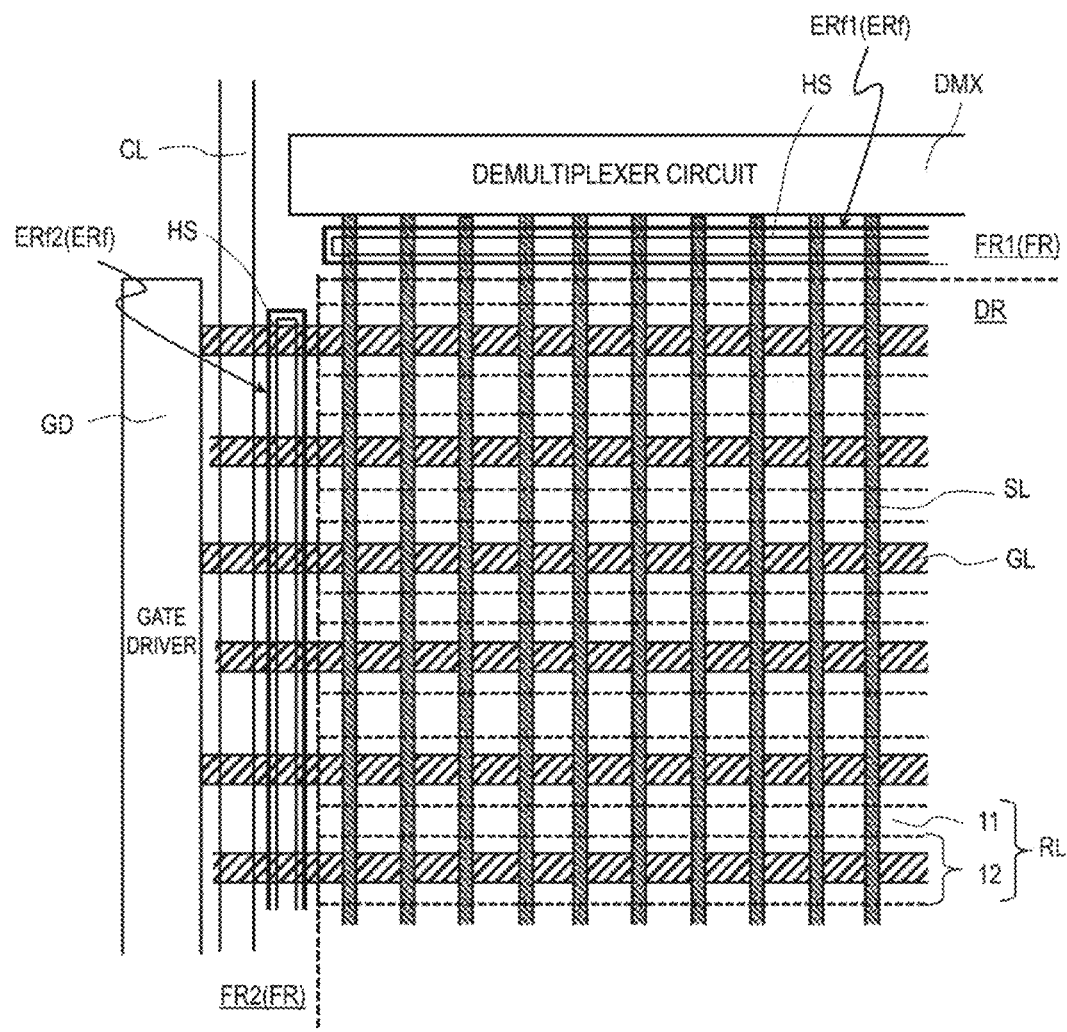
FIG. 18 is a plan view illustrating another example of a dual-layer hole structure portion HS in an active matrix substrate.

Further, as illustrated in FIG. 18, the first non-display region FR1 may be provided with a dual-layer hole structure portion HS disposed so as to cross the plurality of source wiring lines SL when viewed from the normal direction of the substrate 1. Similarly, the second non-display region FR2 may be provided with a dual-layer hole structure portion HS disposed so as to cross the plurality of gate wiring lines GL. Thereby, the surface area of the impurity discharging surface can be increased, and thus impurities can be further efficiently discharged to the outside.

Figure 23:
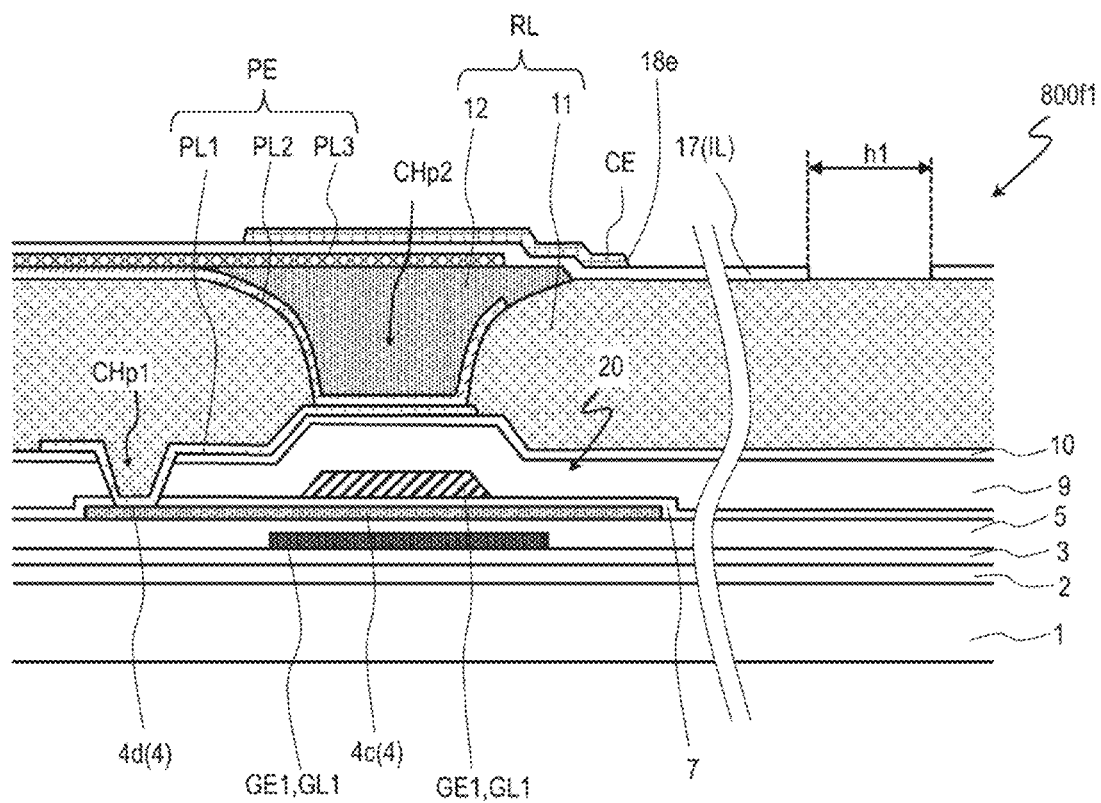
FIG. 23 is a cross-sectional view illustrating another impurity removed region 800*f*1 in Modification Example 1.
Figure 24A:
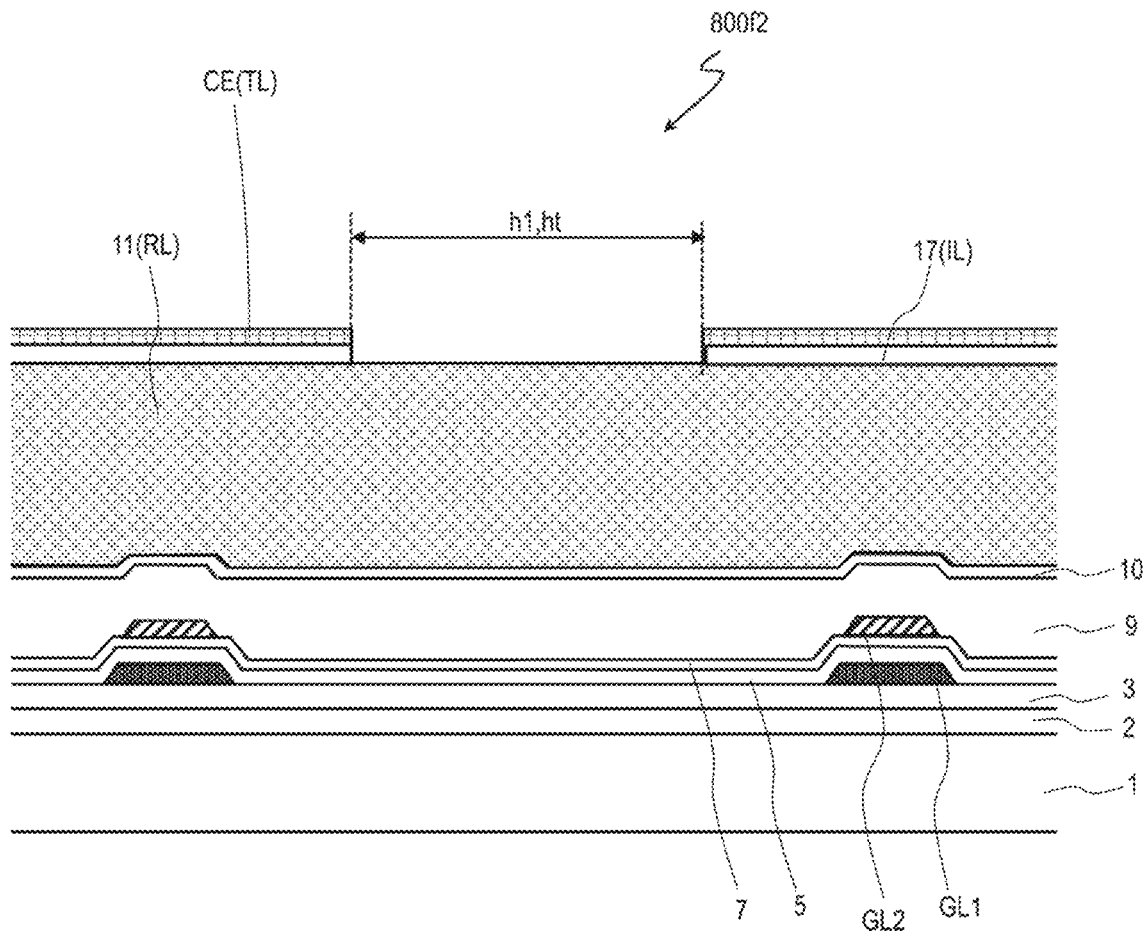
FIG. 24A is a cross-sectional view illustrating another impurity removed region 800*f*2 in Modification Example 1.
Figure 24B:
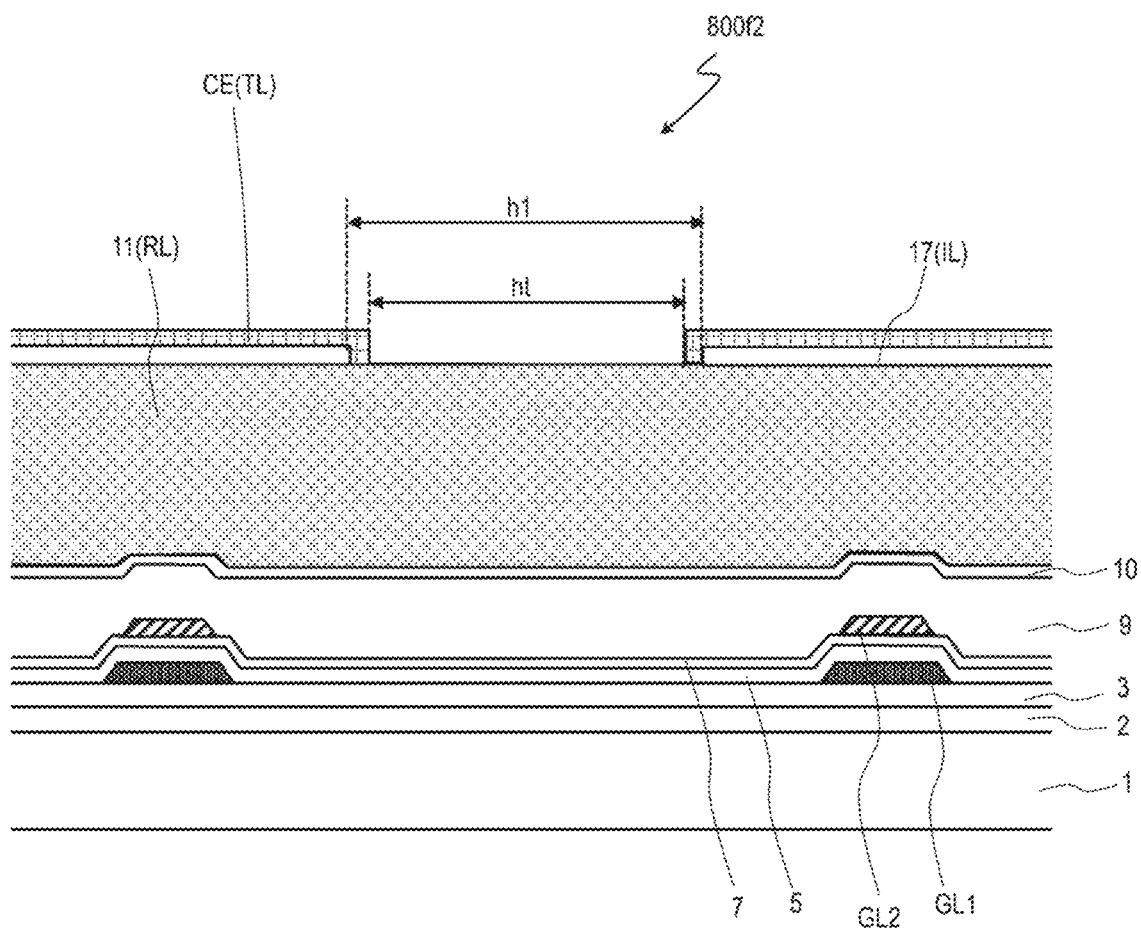
FIG. 24B is a cross-sectional view illustrating the other impurity removed region 800*f*2 in Modification Example 1.

As illustrated in FIG. 23, an impurity removed region 800f1 having at least the through-hole h1 of the dielectric layer 17 may be provided instead of the second impurity removed region ERf1 described above. The through-hole h1 is provided so as to expose a portion of the organic insulating layer RL. In the impurity removed region 800f1, the bottomed hole h2 may not be formed in the organic insulating layer RL. Similarly, as illustrated in FIGS. 24A and 24B, an impurity removed region 800f2 having at least the opening ht of the common electrode CE and the through-hole h1 of the dielectric layer 17 may be provided instead of the second impurity removed region ERf2 described above. The opening ht and the through-hole h1 are disposed so as to expose a portion of the organic insulating layer RL. In the impurity removed region 800f2, the bottomed hole h2 may not be formed in the organic insulating layer RL. When viewed from the normal direction of the substrate 1, the side surfaces of the opening ht and the through-hole h1 may be aligned with each other (FIG. 24A), and the opening ht may be positioned on an inner side of the outer edge of the through-hole h1 (FIG. 24B). Although not illustrated in the drawing, the through-hole h1 may be positioned on an inner side of the outer edge of the opening ht. Additionally, as illustrated in FIG. 18, the through-holes h1 of the impurity removed regions 800f1 and 800f2 may be disposed so as to cross the plurality of source wiring lines SL or gate wiring lines GL.

Modification Example 2: Active Matrix Substrate 100C

Figure 12:
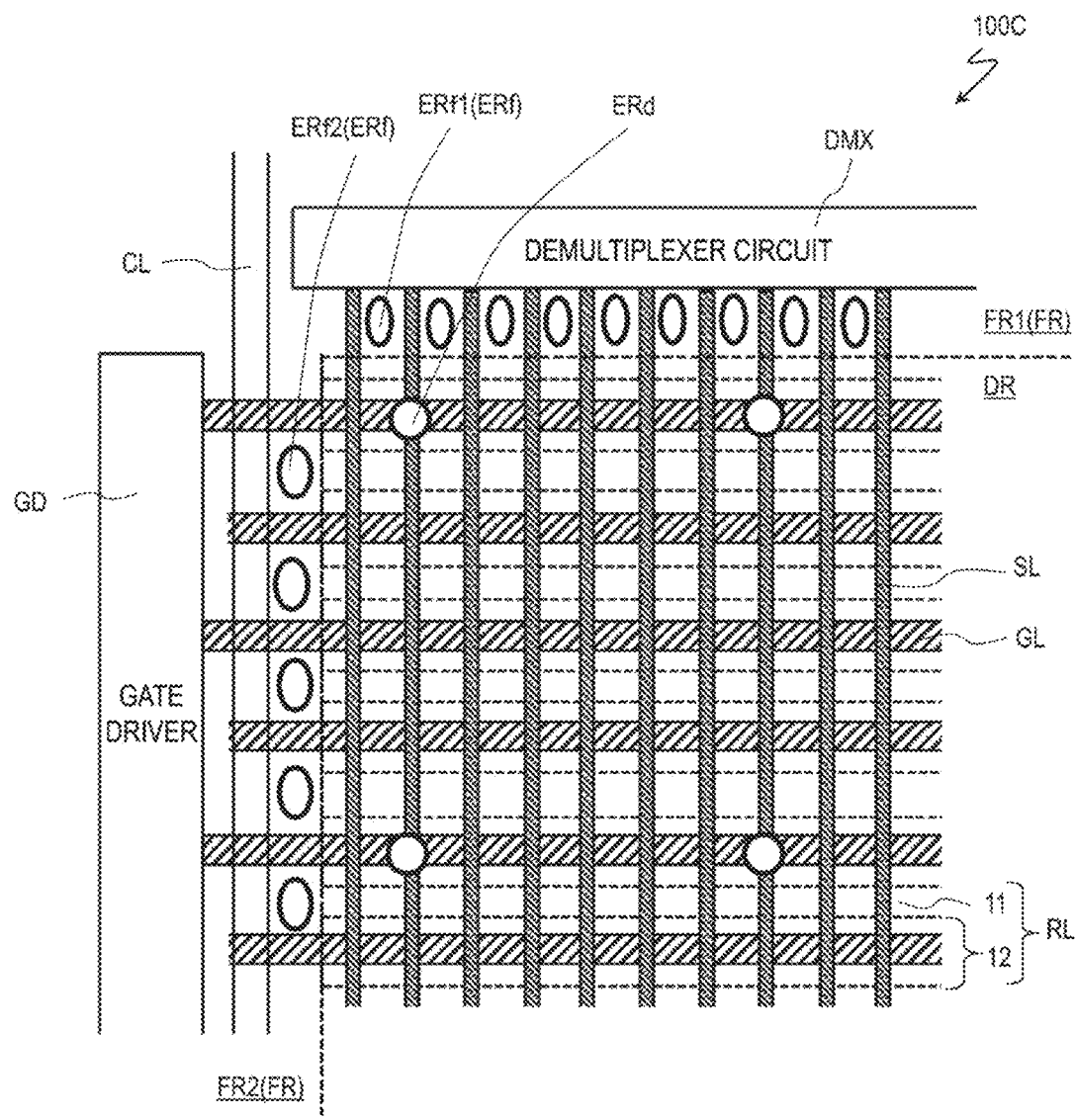
FIG. 12 is a schematic plan view illustrating the arrangement of impurity removed regions ER (ERd, ERf) in an active matrix substrate 100C.

FIG. 12 is a schematic plan view illustrating the arrangement of impurity removed regions ER in an active matrix substrate 100C according to Modification Example 2. The active matrix substrate in Modification Example 2 differs from the active matrix substrates 100A and 100B described above in that the impurity removed regions ER are disposed in both the display region DR and the non-display region FR.

As illustrated in FIG. 12, in the active matrix substrate 100C, a plurality of first impurity removed regions ERd are provided in the display region DR, and a plurality of second impurity removed regions ERf1 and ERf2 are provided in the non-display region FR. The structures and arrangement of the first impurity removed regions ERd may be similar to those of the active matrix substrate 100A. The structures and arrangement of the second impurity removed regions ERf1 and ERf2 may be similar to those of the active matrix substrate 100B.

According to the present modification example, more dual-layer hole structure portions HS can be disposed, and thus impurities can be more efficiently discharged from the organic insulating layer RL to the outside. Additionally, by disposing the second impurity removed region ERf in the non-display region FR, the number of first impurity removed regions ERd disposed in the display region DR can be made smaller than that of, for example, the active matrix substrate 100A illustrated in FIG. 5. For example, one first impurity removed region ERd may be disposed for a pixel area PIX of, for example, 25 or more and 10000 or less. Alternatively, when viewed from the normal direction of the substrate 1, one first impurity removed region ERd may be disposed for a rectangular region of 0.1 mm to 2 mm×0.1 mm to 2 mm (per area of 0.01 mm$^2$ or more and 4 mm$^2$ or less) in the display region DR.

Also in the present modification example, the impurity removed regions 800d, 800f1, and 800f2 (FIG. 22A to FIG. 24B) may be formed instead of the first impurity removed region ERd and the second impurity removed region ERf described above.

Modification Example 3: Active Matrix Substrates 100D and 100E

Figure 13A:
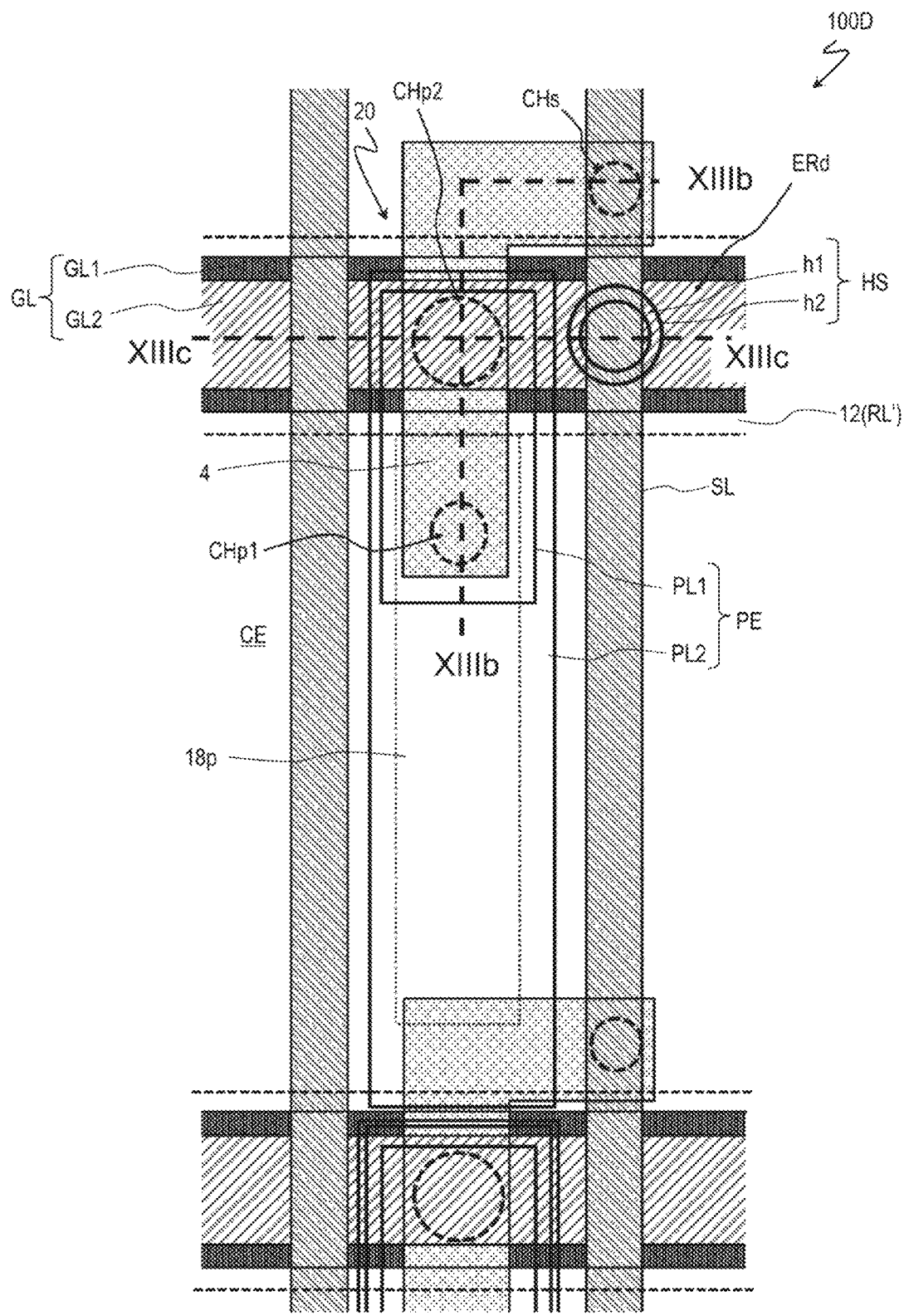
FIG. 13A is a plan view illustrating a pixel area PIX in an active matrix substrate 100D.
Figure 13B:
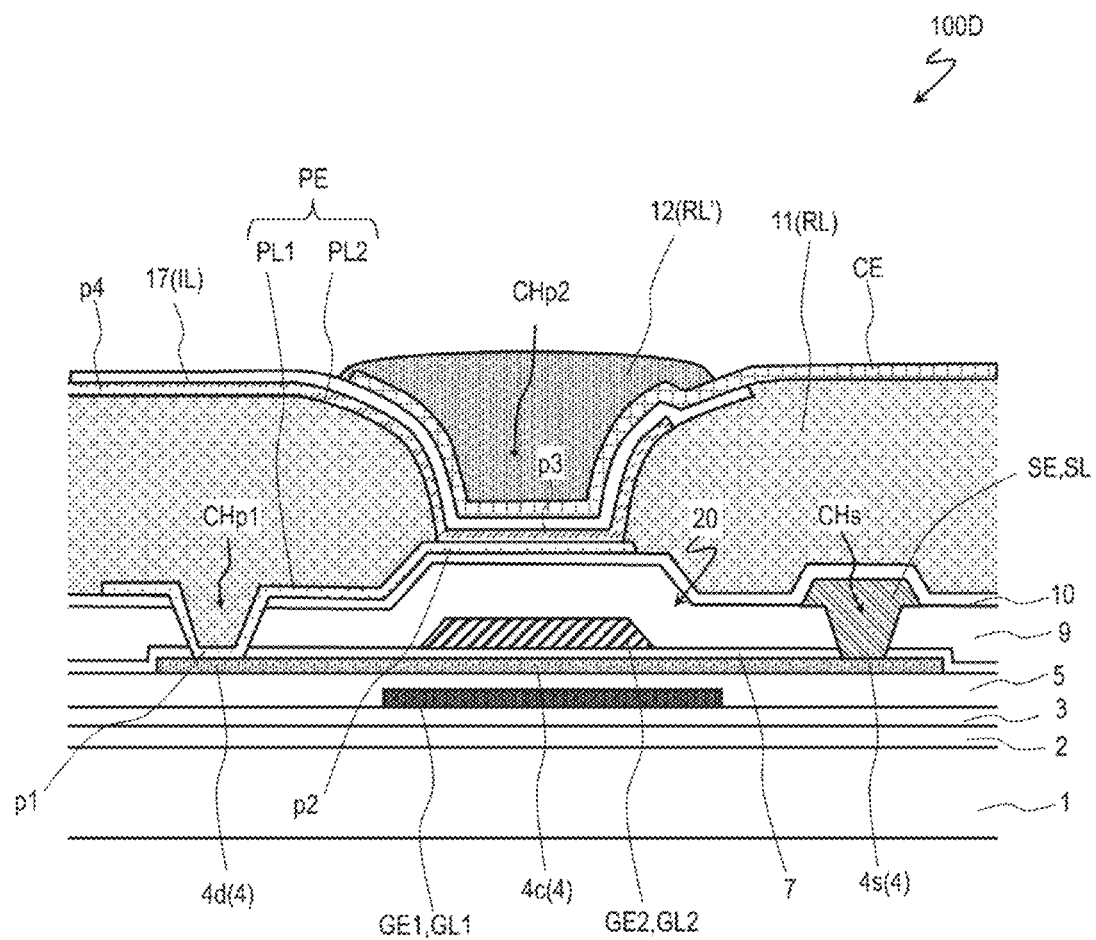
FIG. 13B is a cross-sectional view taken along a line XIIIb-XIIIb illustrated in FIG. 13A.
Figure 13C:
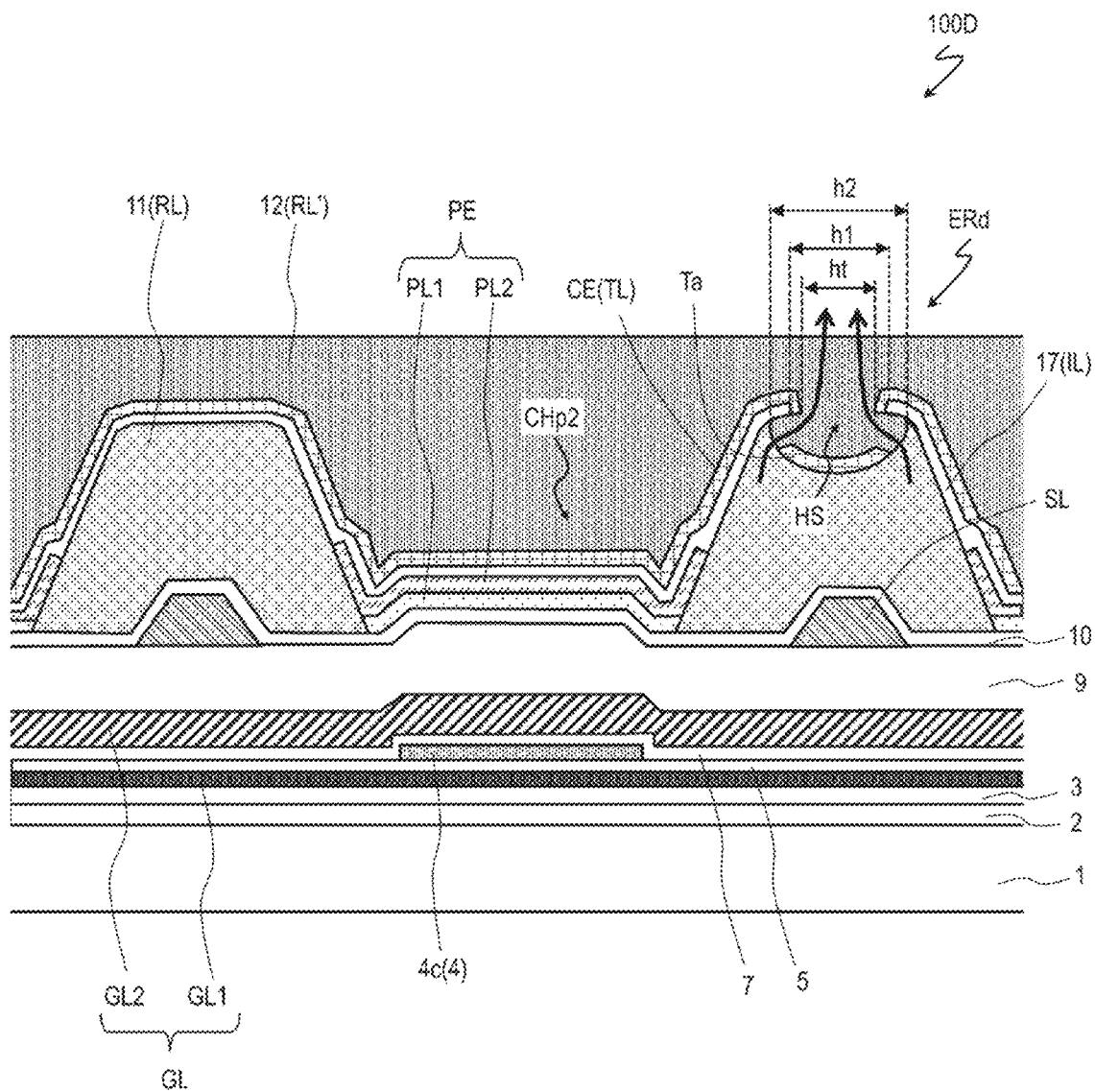
FIG. 13C is a cross-sectional view taken along a line XIIIc-XIIIc illustrated in FIG. 13A.

FIG. 13A is a plan view illustrating one pixel area PIX in an active matrix substrate 100D according to Modification Example 3. FIGS. 13B and 13C are cross-sectional views taken along a line XIIIb-XIIIb and a line XIIIc-XIIIc illustrated in FIG. 13A, respectively. The active matrix substrate 100D has a plurality of first impurity removed regions ERd in the display region DR. The arrangement of the first impurity removed regions ERd in the active matrix substrate 100D is similar to that in, for example, FIG. 5. FIG. 13A corresponds to the region Ra illustrated in FIG. 5.

The active matrix substrate 100D differs from the active matrix substrate 100A in that the second organic insulating layer 12 is disposed in a layer higher than the dielectric layer 17. In the present specification, in order to make a distinction from the organic insulating layer RL positioned in a layer lower than the dielectric layer 17 (the inorganic insulating layer IL), an organic insulating layer positioned in a layer higher than the dielectric layer 17 may be referred to as an "other organic insulating layer RL'". In the active matrix substrate 100D, the first organic insulating layer 11 is the "organic insulating layer RL'", and the second organic insulating layer 12 is the "other organic insulating layer RL'".

In addition, the active matrix substrate 100D differs from the active matrix substrate 100A in that the active matrix substrate 100D does not include the third electrode layer PL3. A pixel electrode PE of the active matrix substrate 100D includes a first electrode layer PL1 which is in contact with the drain contact region 4d of the oxide semiconductor layer 4 in the first pixel contact hole CHp1, and a second electrode layer PL2 which is in contact with the first electrode layer PL1 in the second pixel contact hole CHp2 provided in the first organic insulating layer 11. The arrangement and shapes of the first electrode layer PL1 and the second electrode layer PL2 may be similar to those of the active matrix substrate 100A.

In the second pixel contact hole CHp2 provided in the first organic insulating layer 11 and on the first organic insulating layer 11, the dielectric layer 17 and the common electrode CE are disposed on the second electrode layer PL2 in this order. The second organic insulating layer 12 is disposed above the common electrode CE so as to fill a recessed portion caused by the second pixel contact hole CHp2. That is, the dielectric layer 17 and the common electrode CE are positioned between the first organic insulating layer 11 and the second organic insulating layer 12. When viewed from the normal direction of the substrate 1, the second organic insulating layer 12 may extend continuously in a row direction on the lower gate wiring line GL1 and the upper gate wiring line GL2, similarly to the active matrix substrate 100A.

The first impurity removed region ERd is disposed at a gate-source intersection portion, for example, similarly to the first impurity removed region ERd in the active matrix substrate 100A. As illustrated in FIG. 13C, the first impurity removed region ERd includes the first organic insulating layer 11 (the organic insulating layer RL) and the dual-layer hole structure portion HS formed in the dielectric layer 17. In this example, the first impurity removed region ERd has a third structure. The common electrode CE is disposed on the dielectric layer 17, and an island-shaped transparent conductive portion Ta formed in the same layer as the common electrode CE is disposed in the bottomed hole h2 of the dual-layer hole structure portion HS.

The first impurity removed region ERd is covered with the second organic insulating layer 12 (other organic insulating layer RL'). As illustrated in the drawing, the second organic insulating layer 12 may be disposed so as to fill the through-hole h1 and the bottomed hole h2 of the dual-layer hole structure portion HS. In the bottomed hole h2, the second organic insulating layer 12 may be in direct contact with a portion of the inner surface s2 which is exposed from the island-shaped transparent conductive portion Ta.

In the present modification example, the upper surface of the second organic insulating layer 12 is not covered with an inorganic insulating film or a transparent conductive film, and thus impurities in the second organic insulating layer 12 can be discharged to the outside from the upper surface of the second organic insulating layer 12. On the other hand, impurities in the first organic insulating layer 11 may move to a portion of the second organic insulating layer 12 which is positioned inside the bottomed hole h2 and then may be discharged from the upper surface of the second organic insulating layer 12 through the through-hole h1, as indicated by the arrows in FIG. 13C.

FIGS. 13A to 13C illustrate an example in which the first impurity removed region ERd is disposed in the display region DR, but in addition to this, or instead of this, the second impurity removed regions ERf1 and ERf2 may be disposed in the non-display region FR.

Figure 14A:
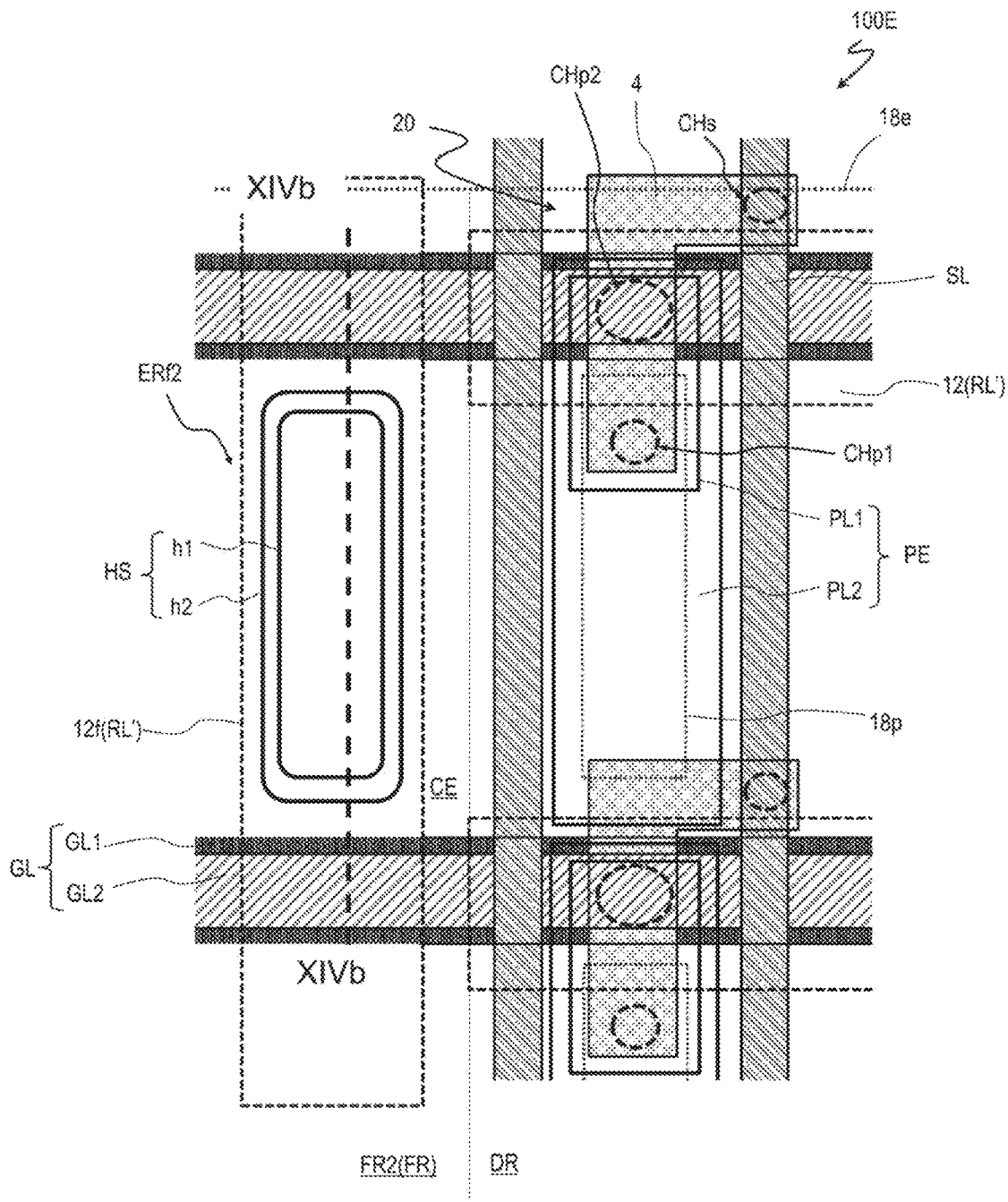
FIG. 14A is a plan view illustrating portions of a pixel area PIX and a second non-display region FR2 at one side end in an active matrix substrate 100E.
Figure 14B:
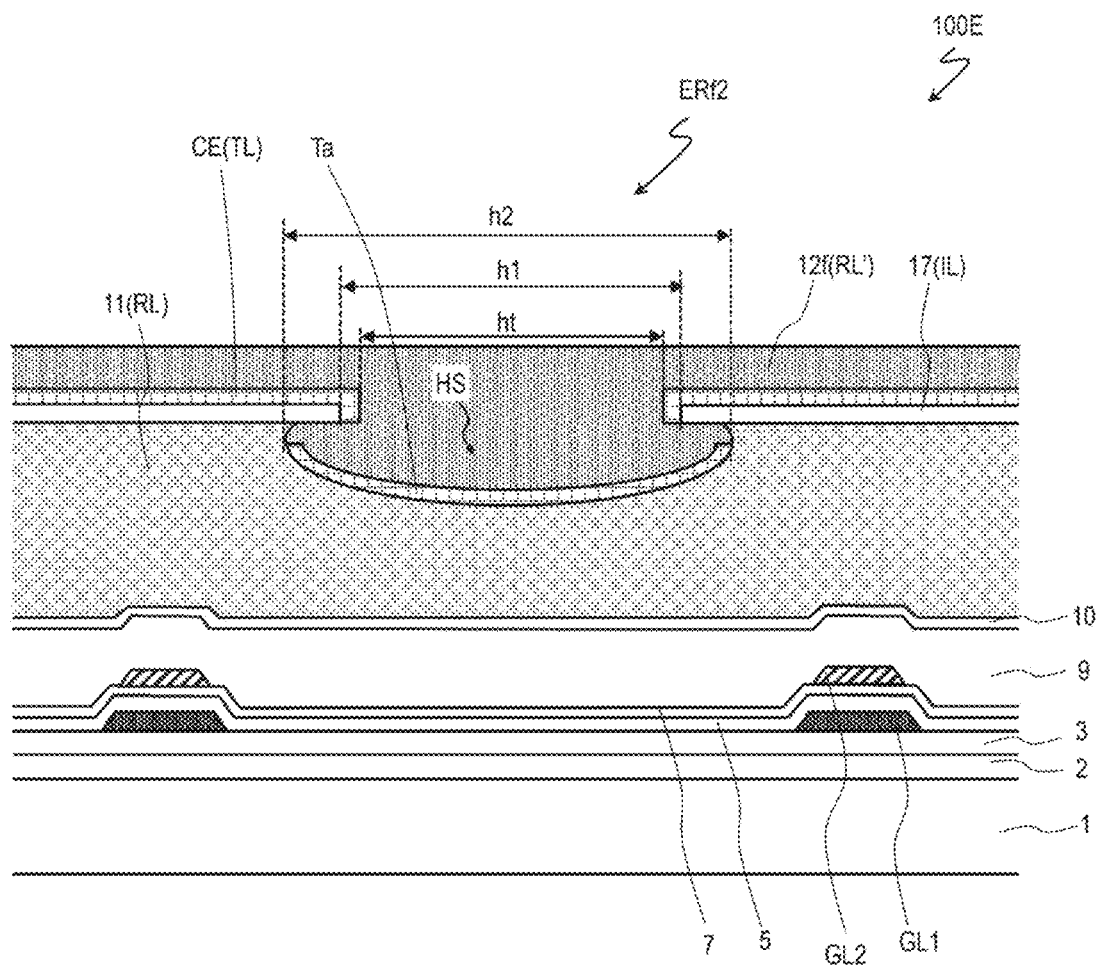
FIG. 14B is a cross-sectional view taken along a line XIVb-XIVb illustrated in FIG. 14A.

FIG. 14A is a plan view illustrating a portion of a non-display region (here, the second non-display region FR2) in another active matrix substrate 100E according to the Modification Example 3. FIG. 14B is a cross-sectional view taken along a line XIVb-XIVb illustrated in FIG. 14A. The arrangement of the second impurity removed region ERf in the active matrix substrate 100E is similar to, for example, that in FIG. 9. FIG. 14A corresponds to the region Rb illustrated in FIG. 9.

As illustrated in FIG. 14B, the second impurity removed region ERf2 has, for example, a third structure. A second organic insulating layer 12f (other organic insulating layer RL') is disposed on the second impurity removed region ERf2 so as to fill the dual-layer hole structure portion HS. The second organic insulating layer 12f may be disposed so as to fill the through-hole h1 and the bottomed hole h2 of the dual-layer hole structure portion HS. The second organic insulating layer 12f is the same layer as the second organic insulating layer 12 positioned in the display region DR. In this example, the second organic insulating layer 12f is disposed separated from the second organic insulating layer 12. In the second non-display region FR2, one island-shaped second organic insulating layer 12f may be disposed for each dual-layer hole structure portion HS. Alternatively, the second organic insulating layer 12f may extend in a column direction so as to fill two or more dual-layer hole structure portions HS. Note that the second organic insulating layer 12f may be continuous (formed integrally) with the second organic insulating layer 12.

Although not illustrated in the drawing, the second impurity removed region ERf1 having a first structure may be provided in the first non-display region FR1. The other organic insulating layer RL' may also be disposed on the second impurity removed region ERf1 so as to fill the dual-layer hole structure portion HS.

Figure 25:
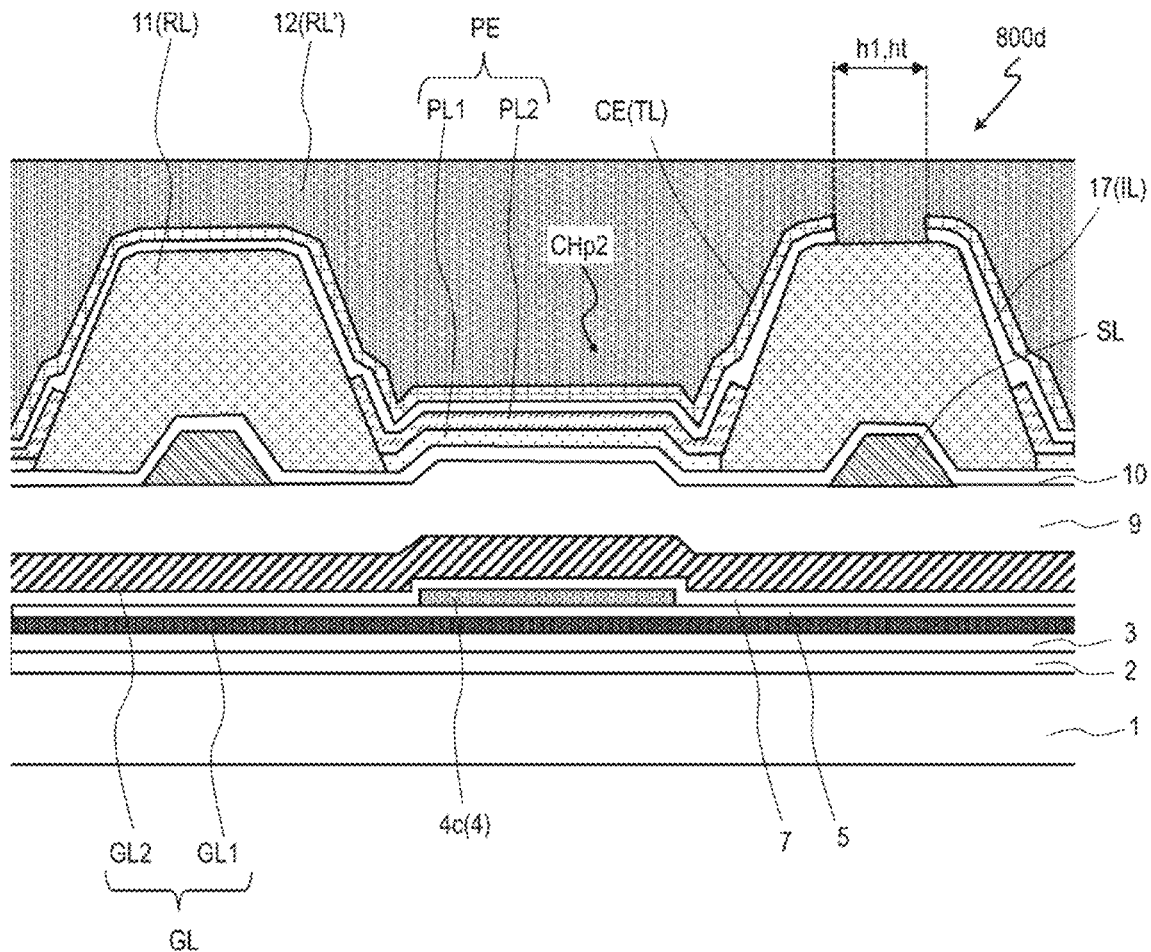
FIG. 25 is a cross-sectional view illustrating the other impurity removed region 800d in Modification Example 2.
Figure 26:
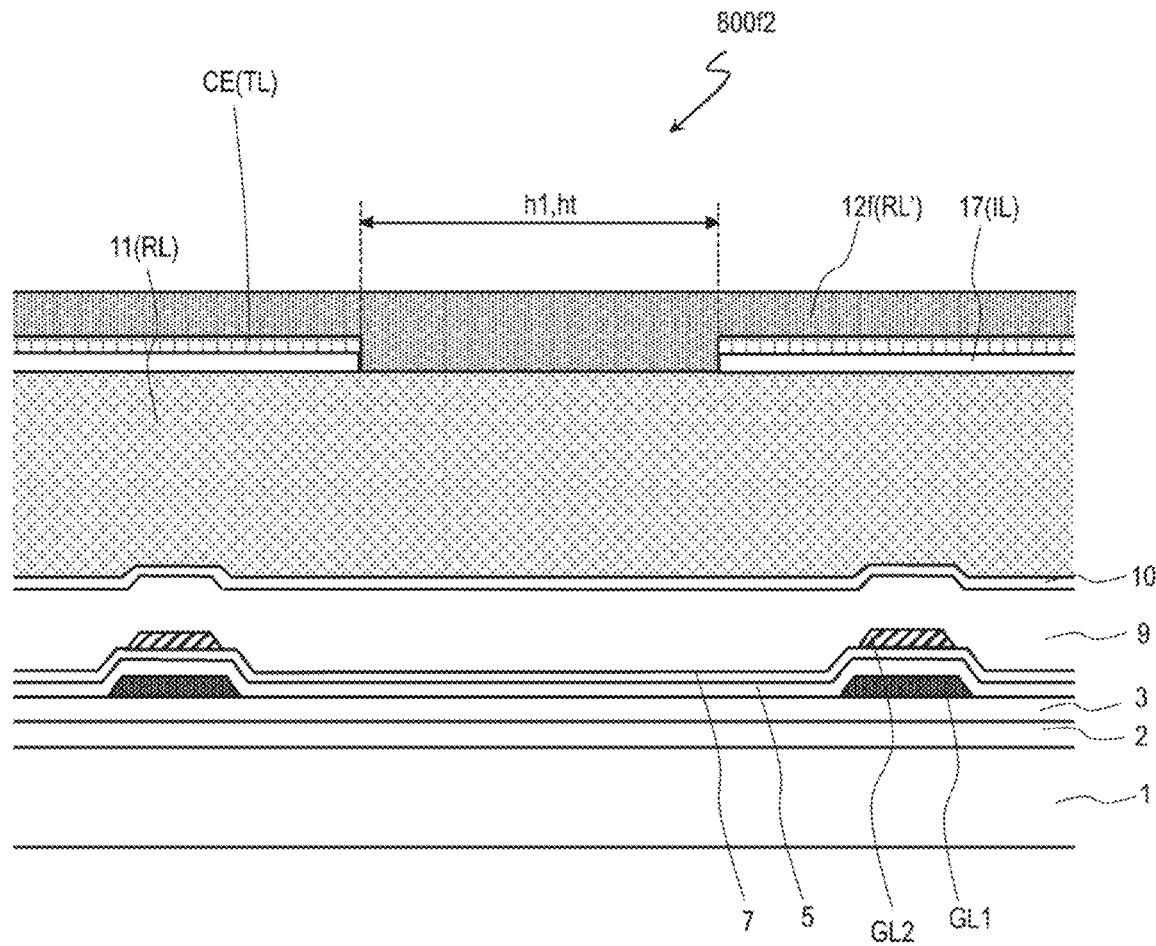
FIG. 26 is a cross-sectional view illustrating the other impurity removed region 800f2 in Modification Example 2.

As illustrated in FIGS. 25 and 26, the impurity removed regions 800d and 800f2 having at least the opening ht of the common electrode CE and the through-hole h1 of the dielectric layer 17 may be provided instead of the first impurity removed region ERd and the second impurity removed region ERf2 described above. The opening ht and the through-hole h1 are disposed so as to expose a portion of the organic insulating layer RL. In the impurity removed regions 800d and 800f2, the bottomed hole h2 may not be formed in the organic insulating layer RL. In FIGS. 25 and 26, when viewed from the normal direction of the substrate 1, the side surfaces of the opening ht and the through-hole h1 are aligned with each other, but the opening ht may be positioned on an inner side of the outer edge of the through-hole h1 (see FIGS. 22B and 24B), and the through-hole h1 may be positioned on an inner side of the outer edge of the opening ht. Although not illustrated in the drawing, an impurity removed region having a structure similar to that of the impurity removed region 800f2 may also be disposed in the first non-display region R1.

Modification Example 4: Active Matrix Substrate 100F

Figure 15A:
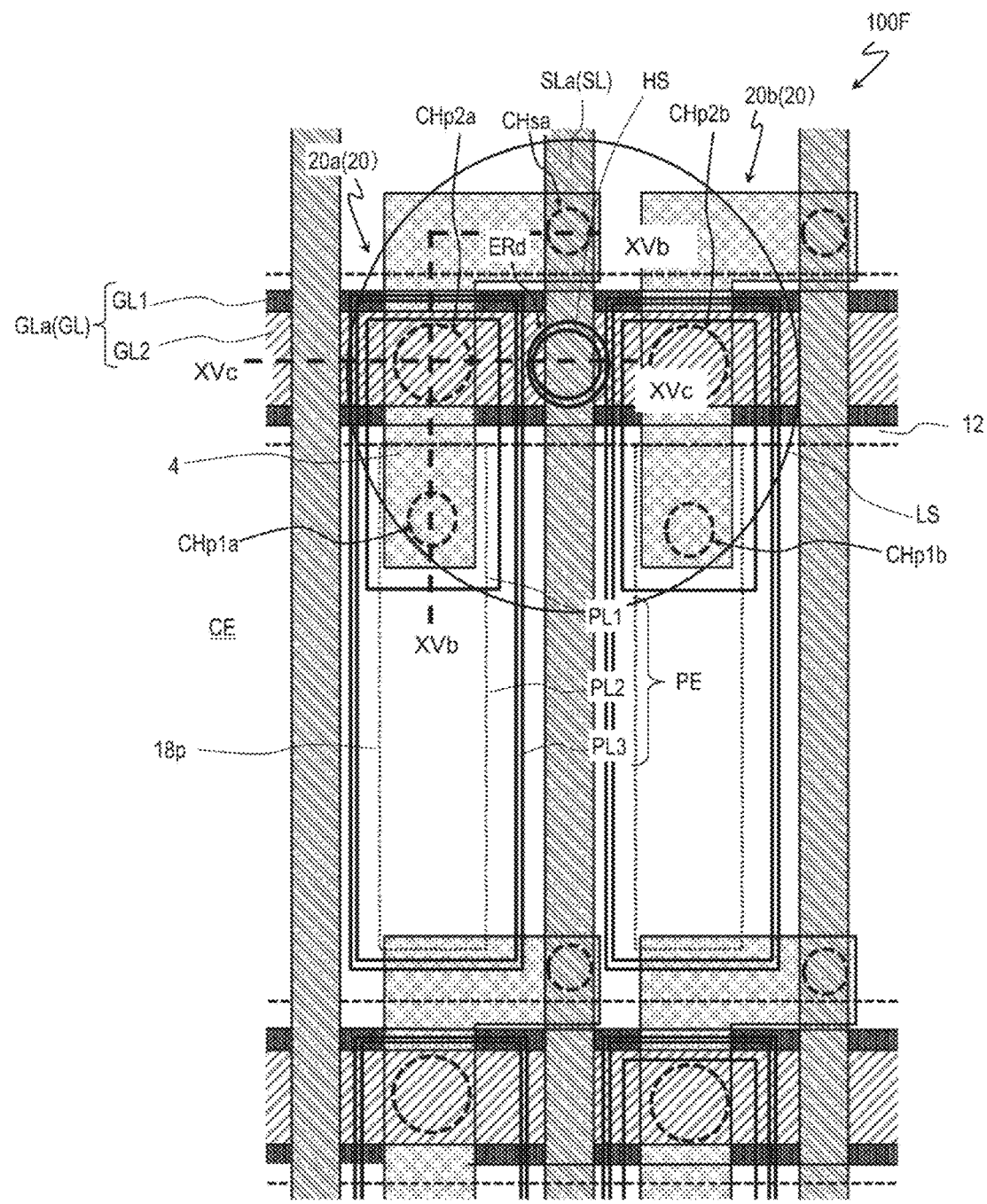
FIG. 15A is a plan view illustrating a pixel area PIX in an active matrix substrate 100F.
Figure 15B:
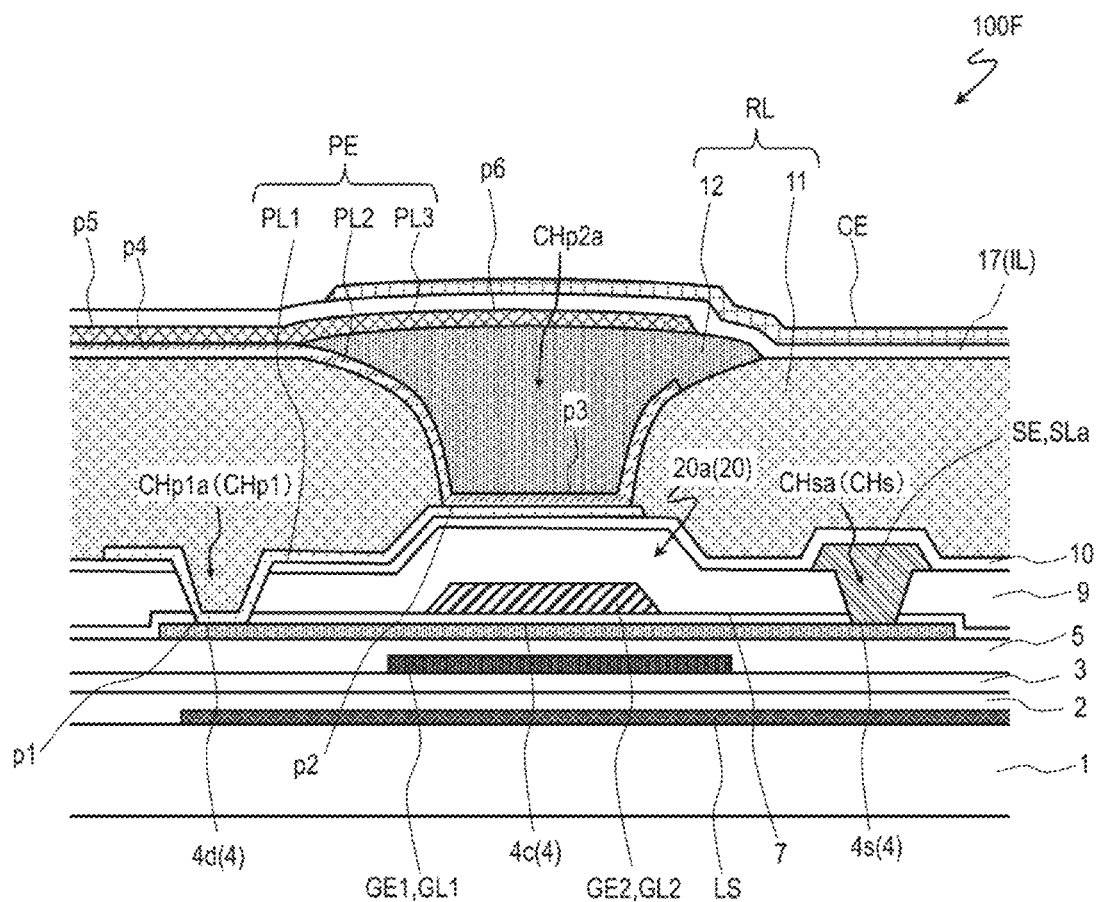
FIG. 15B is a cross-sectional view taken along a line XVb-XVb illustrated in FIG. 15A.
Figure 15C:
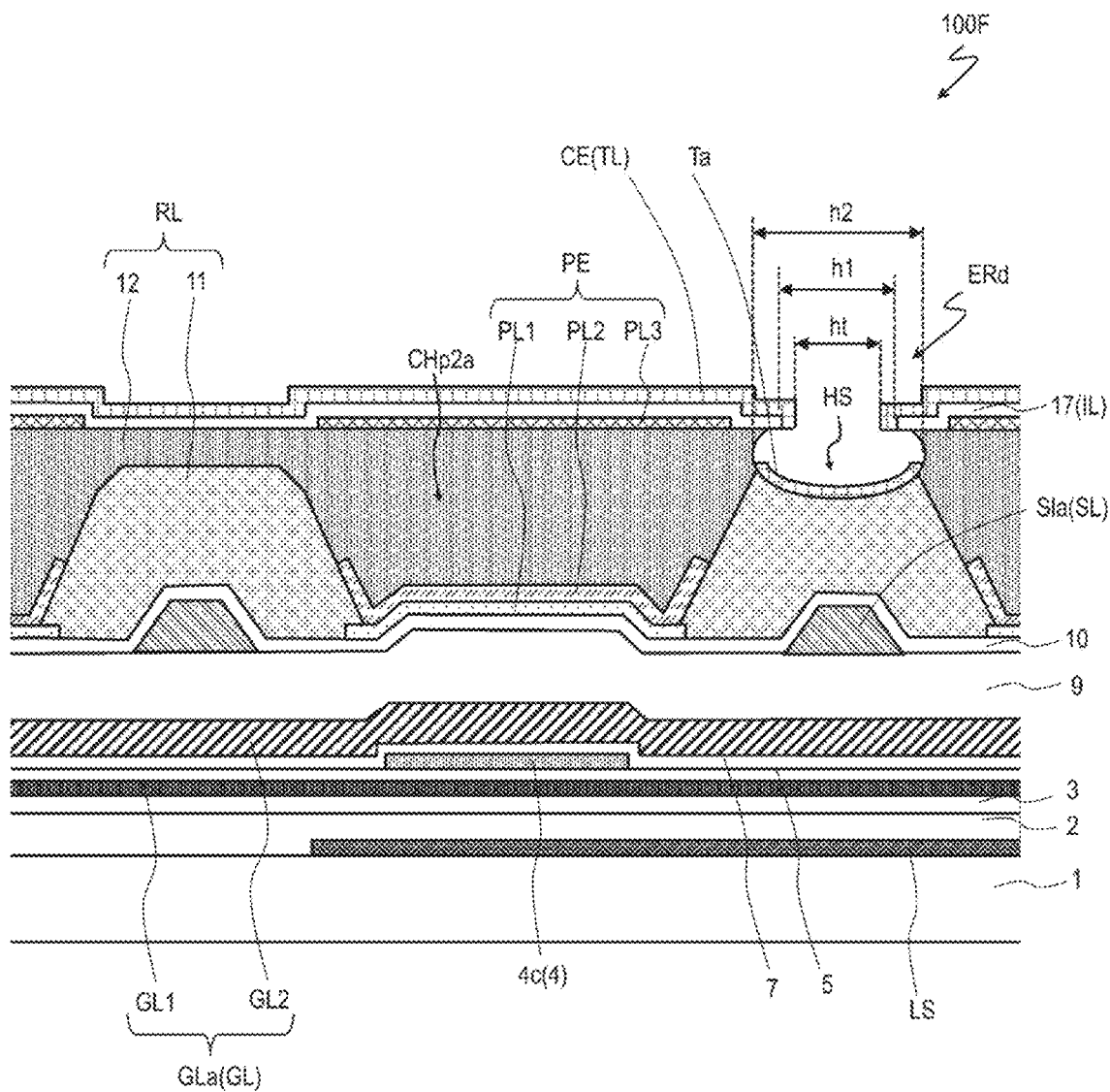
FIG. 15C is a cross-sectional view taken along a line XVc-XVc illustrated in FIG. 15A.

FIG. 15A is a plan view illustrating two pixel areas PIX adjacent to each other in a row direction in an active matrix substrate 100F according to Modification Example 4. FIGS. 15B and 15C are cross-sectional views taken along a line XVb-XVb and a line XVc-XVc illustrated in FIG. 15A, respectively. The active matrix substrate 100F has a plurality of first impurity removed regions ERd in the display region DR. The arrangement of the first impurity removed regions ERd in the active matrix substrate 100F is similar to, for example, that in FIG. 5.

The active matrix substrate 100F differs from the active matrix substrate 100A according to Modification Example 1 in that a light shielding layer LS is provided on the substrate 1 side of each of the first impurity removed regions ERd.

The light shielding layer LS is disposed closer to the substrate 1 side than each pixel TFT 20 (here, closer to the substrate 1 side than the lower gate electrode GE1). In the example illustrated in the drawing, the light shielding layer LS is disposed on the substrate 1 side of the lower gate electrode GE1 of the pixel TFT 20 via the lower insulating layers 3 and 2. The light shielding layer LS is, for example, a metal layer.

As illustrated in FIG. 8, in a case where the circuit TFT 30 is formed on the same substrate 1, the light shielding layer LS may be formed in the same layer as the light shielding layer 31 of the circuit TFT 30 (that is, using the same conductive film). Thereby, the light shielding layer LS can be formed without increasing the number of manufacturing processes.

In a liquid crystal display device, when irregularities are provided on the surface of a display region of an active matrix substrate, there is a possibility that liquid crystal alignment can be partially disturbed due to the irregularities of the surface. The disturbance of liquid crystal alignment can result in the degradation of display contrast. In the present modification example, surface irregularities may be generated in the dual-layer hole structure portion HS and the vicinity thereof in the first impurity removed region ERd disposed in the display region DR. Even in this case, light is shielded by the light shielding layer LS in the first impurity removed region ERd, and a region including the first impurity removed region ERd does not contribute to display, thereby making it possible to suppress the degradation of display contrast caused by surface irregularities generated due to the dual-layer hole structure portion HS.

When viewed from the normal direction of the substrate 1, the light shielding layer LS may be disposed so as to overlap the first impurity removed region ERd positioned at the gate-source intersection portion and other contact holes disposed in proximity to the first impurity removed region ERd.

Here, the gate wiring line GL and the source wiring line SL that constitute the gate-source intersection portion in which the first impurity removed region ERd is disposed are referred to as a gate wiring line GLa and a source wiring line SLa, respectively, and two pixel TFTs 20 including the channel region 4c on the gate wiring line GLa are referred to as pixel TFTs 20a and 20b, respectively. The pixel TFTs 20a and 20b are adjacent to each other with the source wiring line SLa interposed therebetween. In the example illustrated in the drawing, second pixel contact holes CHp2a and CHp2b of the pixel TFTs 20a and 20b are disposed so as to sandwich the first impurity removed region ERd therebetween in a row direction on the gate wiring line GLa when viewed from the normal direction of the substrate 1. In addition, first pixel contact holes CHp1a and CHp1b of the pixel TFTs 20a and 20b are disposed in the vicinity of the gate wiring line GLa in the corresponding pixel area PIX. Further, a source contact hole CHsa of one pixel TFT 20a is disposed so as to overlap the source wiring line SLa. In addition to the dual-layer hole structure portion HS of the first impurity removed region ERd, the light shielding layer LS is disposed so as to shield light in all of the second pixel contact holes CHp2a and CHp2b, the first pixel contact holes CHp1a and CHp1b, and the source contact hole CHsa. Thereby, it is possible to more effectively suppress the degradation of display contrast due to surface irregularities in a predetermined region including the first impurity removed regions ERd of the active matrix substrate 100F.

The light shielding layer LS described in the present modification example can also be applied to the other active matrix substrates 100C and 100D having the first impurity removed region ERd.

Note that the light shielding layer LS may overlap at least the dual-layer hole structure portion HS, and the size or planar shape of the light shielding layer LS is not limited to the example illustrated in the drawing.

Figure 27:
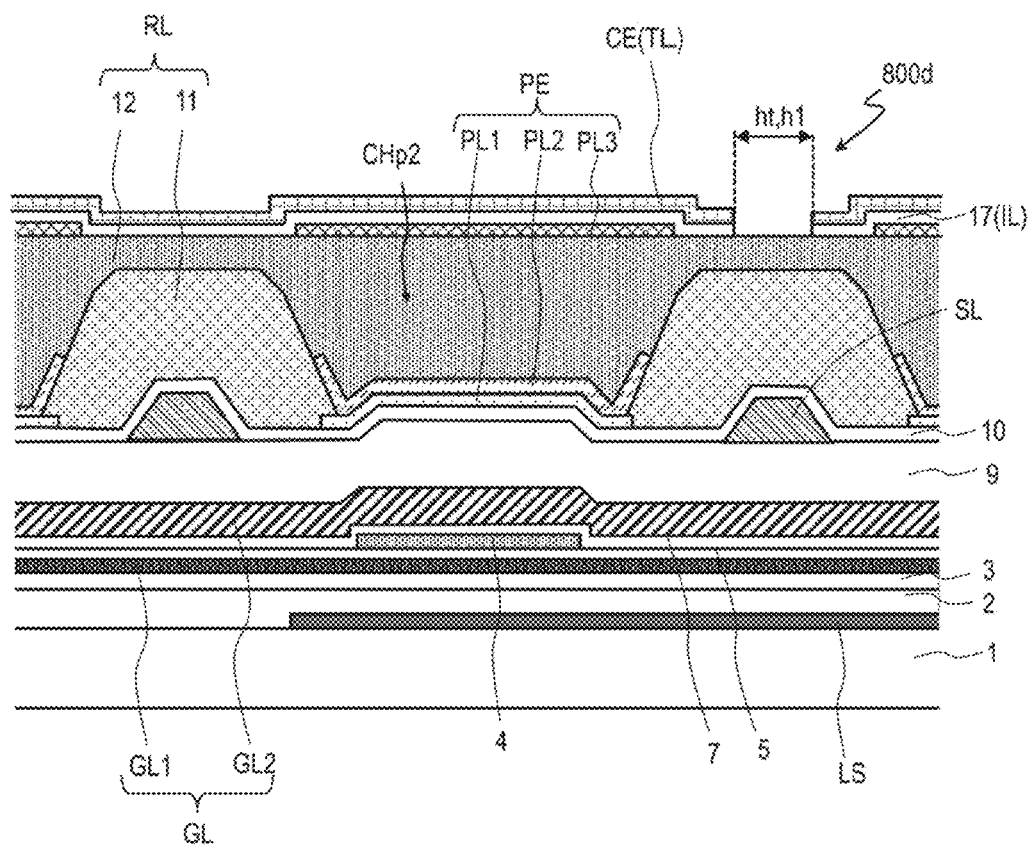
FIG. 27 is a cross-sectional view illustrating the other impurity removed region 800d in Modification Example 4.

As illustrated in FIG. 27, an impurity removed region 800d having at least the opening ht of the common electrode CE and the through-hole h1 of the dielectric layer 17 may be provided instead of the first impurity removed region ERd described above. The opening ht and the through-hole h1 are disposed so as to expose a portion of the organic insulating layer RL. In the impurity removed region 800d, the bottomed hole h2 may not be formed in the organic insulating layer RL. When viewed from the normal direction of the substrate 1, the opening ht may be positioned on an inner side of the outer edge of the through-hole h1 (see FIG. 22B), and the through-hole h1 may be positioned on an inner side of the outer edge of the opening ht.

Liquid Crystal Display Device

The active matrix substrates 100A to 100F according to the embodiments of the disclosure can be suitably used in a liquid crystal display device.

Hereinafter, an example of the liquid crystal display device of the present embodiment will be described with an FFS mode liquid crystal display device using the active matrix substrate 100F according to Modification Example 4 as an example.

Figure 16:
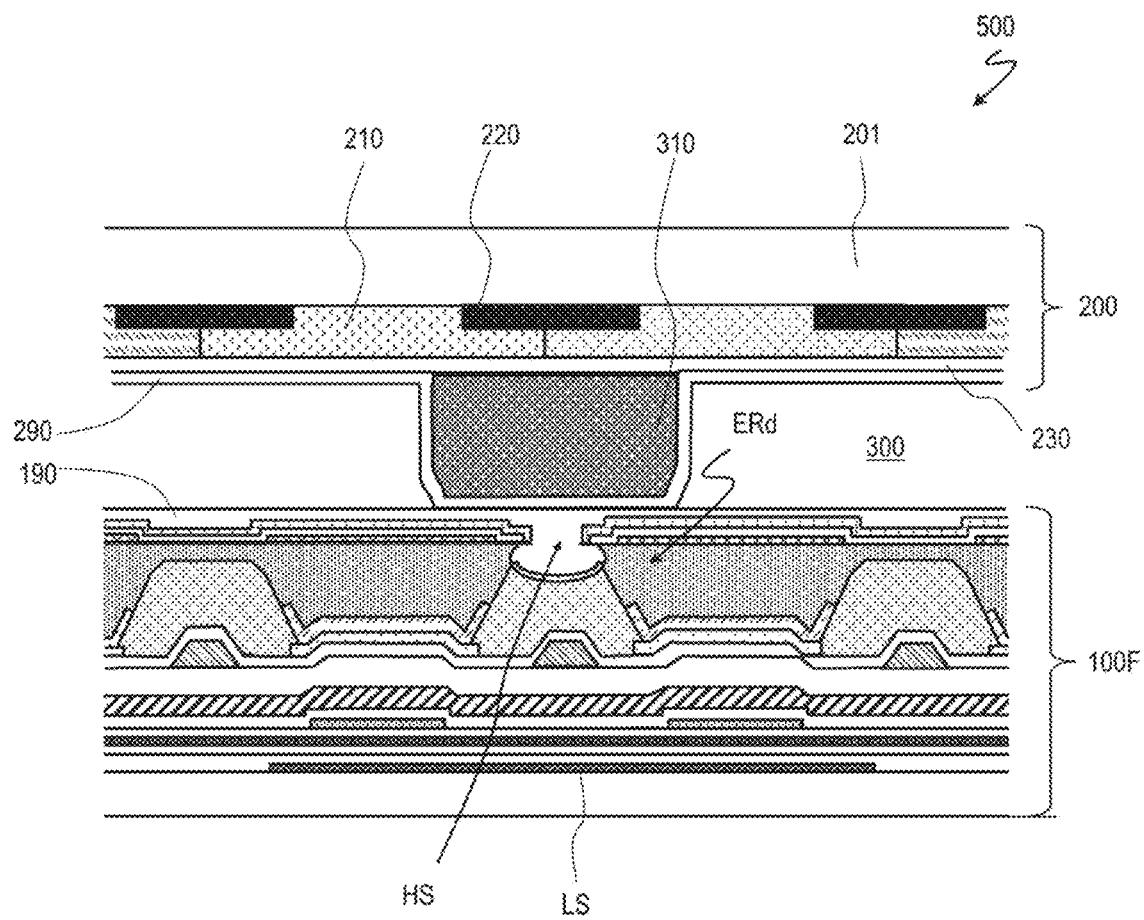
FIG. 16 is a schematic cross-sectional view illustrating a portion of a liquid crystal display device 500.

FIG. 16 is a schematic cross-sectional view illustrating a portion of a liquid crystal display device 500.

The liquid crystal display device 500 includes the active matrix substrate 100F, a counter substrate 200 provided so as to face the active matrix substrate 100F, and a liquid crystal layer 300 provided between the active matrix substrate 100F and the counter substrate 200.

An alignment film 190 is provided on the outermost surface of the active matrix substrate 100F on the liquid crystal layer 300 side. The alignment film 190 is formed, for example, after an impurity removal step (to be described later) for the active matrix substrate 100F is performed, and thus the alignment film 190 may be covered with the dual-layer hole structure portion HS in each impurity removed region ER.

The alignment film 190 can be formed, for example, by applying an alignment film material containing a resin material and a solvent onto the surface of the active matrix substrate 100F by a printing rubber plate or inkjet and then baking the alignment film material. The alignment film 190 can fill the dual-layer hole structure portion HS (the bottomed hole h2 and the through-hole h1) of the active matrix substrate 100F, and thus it is possible to more effectively suppress the degradation of display contrast caused by the dual-layer hole structure portion HS. As illustrated in the drawing, the surface of a portion of the alignment film 190 which is positioned above the dual-layer hole structure portion HS may be substantially flat.

The counter substrate 200 includes a substrate 201, and a color filter layer 210 and a black matrix 220 which are supported by the substrate 201. An alignment film 290 is provided on the outermost surface of the counter substrate 200 on the liquid crystal layer 300 side. An overcoat layer 230 may be disposed between the color filter layer 210, the black matrix 220, and the alignment film 290.

The thickness (cell gap) of the liquid crystal layer 300 is defined, for example, by a columnar spacer 310 provided on the liquid crystal layer 300 side of the counter substrate 200.

In the liquid crystal display device 500, the light shielding layer LS of the active matrix substrate 100F may be disposed so as to shield light in the columnar spacer 310 and the dual-layer hole structure portion HS.

Figure 17A:
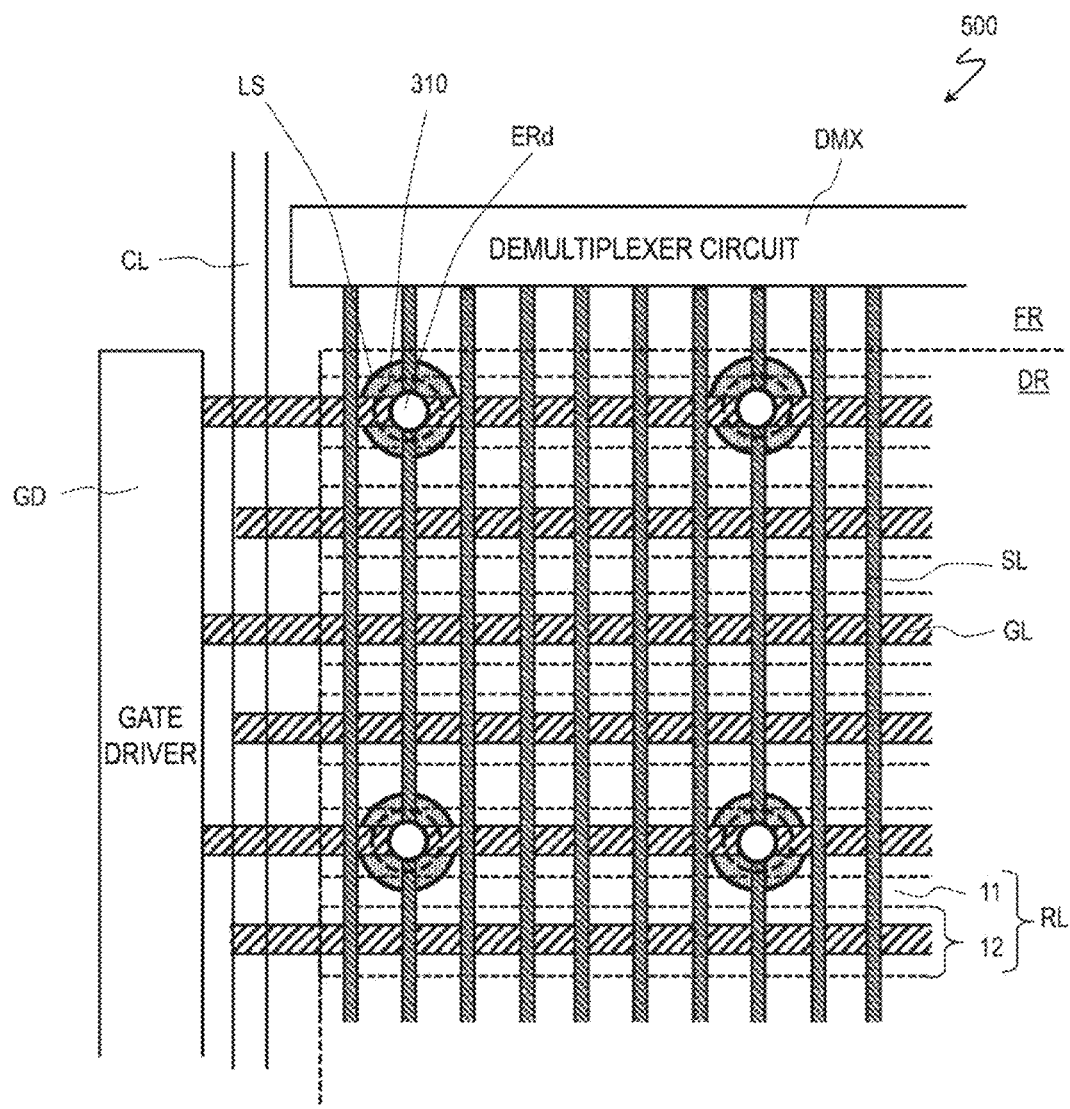
FIG. 17A is a plan view illustrating an example of an arrangement relationship between a first impurity removed region ERd, a columnar spacer 310, and a light shielding layer LS in the liquid crystal display device 500.
Figure 17B:
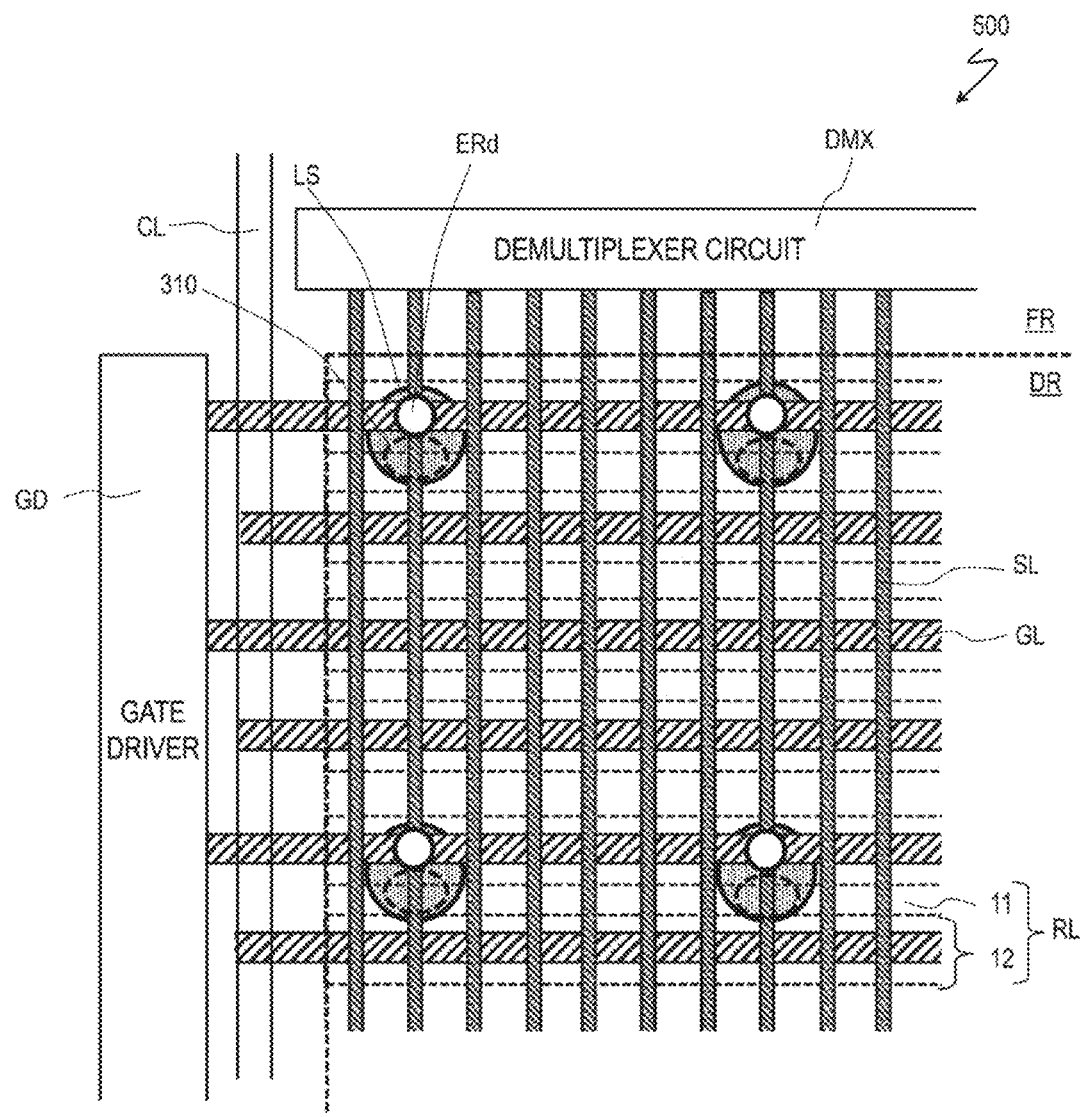
FIG. 17B is a plan view illustrating another example of an arrangement relationship between the first impurity removed region ERd, the columnar spacer 310, and the light shielding layer LS in the liquid crystal display device 500.

FIGS. 17A and 17B are plan views illustrating an arrangement relationship between the first impurity removed region ERd, the columnar spacer 310, and the light shielding layer LS in the liquid crystal display device 500.

As illustrated in FIG. 17A, the dual-layer hole structure portion HS in each of the first impurity removed regions ERd may be disposed so as to overlap one of the columnar spacers 310. In FIG. 17A, the dual-layer hole structure portion HS of the first impurity removed region ERd is positioned on an inner side of the outer edge of the columnar spacer 310 when viewed from the normal direction of the substrate 1, but the columnar spacer 310 and the dual-layer hole structure portion HS may partially overlap each other. Alternatively, as illustrated in FIG. 17B, the dual-layer hole structure portion HS of each of the first impurity removed regions ERd may be disposed in proximity to one of the columnar spacers 310 when viewed from the normal direction of the substrate 1.

Each of the light shielding layers LS in the active matrix substrate 100F is disposed so as to overlap the columnar spacer 310 and the dual-layer hole structure portion HS that overlap each other or are in proximity to each other when viewed from the normal direction of the substrate 1. Thereby, it is possible to suppress influence on display characteristics of the columnar spacer 310 and the first impurity removed region ERd. In addition, it is not necessary to separately provide a light shielding layer for shielding light in the first impurity removed region ERd, and thus it is possible to suppress an increase in a light shielding area and increase a pixel aperture ratio.

The liquid crystal display device 500 is suitably used in a high-resolution (for example, 1000 ppi or more) liquid crystal display device, and is suitably used in, for example, a liquid crystal display device for a head-mounted display.

Note that, although the active matrix substrate 100F has been described as an example here, the active matrix substrates 100A to 100E may be used instead. In a configuration in which the first impurity removed region ERd is provided in the display region DR as in the active matrix substrates 100A, 100C, and 100D, at least one of the first impurity removed regions ERd may be disposed so as to overlap (or be in proximity to) the columnar spacer 310 when viewed from the normal direction of the substrate 1 as described above, and the light shielding layer LS for shielding light for them may be provided.

Further, although an FFS mode, which is a type of transverse electrical field mode, liquid crystal display device 500 is exemplified here, the active matrix substrate according to the embodiments of the disclosure may be used for liquid crystal display devices of other display modes. In a liquid crystal display device of a vertical electrical field mode such as a twisted nematic (TN) mode or a vertical alignment (VA) mode, a common electrode is provided at a counter substrate side.

Method of Manufacturing Active Matrix Substrate

Hereinafter, an example of a method of manufacturing the active matrix substrate according to the present embodiment will be described with reference to the drawings. FIGS. 19A to 19I and FIGS. 20A to 20I are process cross-sectional views illustrating a portion of the display region DR of the active matrix substrate 100A. Each of these drawings illustrates a cross-sectional structure taken along the line XVc-XVc illustrated in FIG. 15A.

Figure 19A:
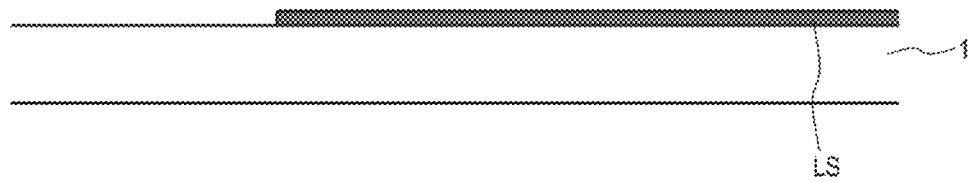
FIG. 19A is a process cross-sectional view illustrating a manufacturing process for an active matrix substrate 100F.

First, as illustrated in FIG. 19A, the light shielding layer LS is formed on the substrate 1. For example, the light shielding layer LS can be formed by depositing a conductive film for a light shielding layer by a sputtering method and then patterning the conductive film for a light shielding layer by a photolithography process.

For example, a glass substrate, a silicon substrate, a plastic substrate (resin substrate) having heat resistance, or the like can be used as the substrate 1. As the conductive film for a light shielding layer, a film containing a metal such as aluminum (Al), tungsten (W), molybdenum (Mo), tantalum (Ta), chromium (Cr), titanium (Ti), or copper (Cu), or an alloy thereof, or a metal nitride thereof, can be appropriately used. In addition, a layered film obtained by layering these plurality of films may be used. Here, a molybdenum tungsten alloy film is used as the conductive film for a light shielding layer. The thickness of the conductive film for a light shielding layer is, for example, 30 nm or more and 100 nm or less.

Figure 19B:
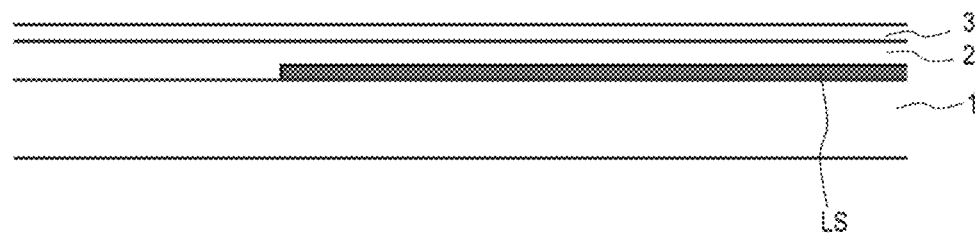
FIG. 19B is a process cross-sectional view illustrating a manufacturing process for the active matrix substrate 100F.

Next, as illustrated in FIG. 19B, the first lower insulating layer 2 and the second lower insulating layer 3 are formed in this order so as to cover the light shielding layer LS. For example, the first lower insulating layer 2 and the second lower insulating layer 3 can be formed by a CVD method. As the first lower insulating layer 2 and the second lower insulating layer 3, a silicon oxide ($SiO_2$) layer, a silicon nitride (SiNx) layer, a silicon oxynitride (SiOxNy; x>y) layer, a silicon nitride oxide (SiNxOy; x>y) layer, and the like can be appropriately used as a layered layer or a single layer.

As illustrated in FIG. 8, in a case where a silicon semiconductor TFT is formed as the circuit TFT 30, for example, after a layered film of silicon oxide and silicon nitride is formed as the first lower insulating layer 2, and subsequently, a crystalline silicon semiconductor layer is formed by a known method such as film formation (in a thickness of 30 nm to 100 nm, for example) of a silicon semiconductor film or laser crystallization, a silicon oxide film may be formed as the second lower insulating layer 3.

In a case where an oxide semiconductor TFT similar to the pixel TFT 20 is formed as the circuit TFT, a SiNx layer for preventing diffusion of impurities or the like from the substrate 1 may be formed as the first lower insulating layer 2 that covers the light shielding layer LS, and an $SiO_2$ layer for securing insulating properties may be formed on the SiNx layer as the second lower insulating layer 3. The thickness of the lower insulating layer (a total thickness in a case where the lower insulating layer has a layered structure) is, for example, 100 nm or more and 600 nm or less. Note that, in a case where an oxide semiconductor TFT similar to the pixel TFT 20 is formed as the circuit TFT, a single lower insulating layer (for example, a layer that can function as a base coat) may be provided instead of providing two layers of the first lower insulating layer 2 and the second lower insulating layer 3.

Figure 19C:
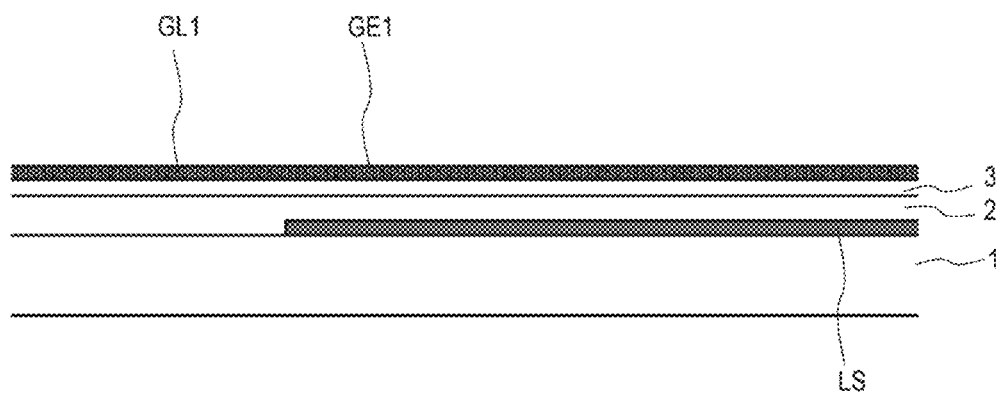
FIG. 19C is a process cross-sectional view illustrating a manufacturing process for the active matrix substrate 100F.

Subsequently, as illustrated in FIG. 19C, the lower gate wiring line GL1 is formed on the second lower insulating layer 3. The lower gate wiring line GL1 includes a portion that functions as the lower gate electrode GE1. Here, the lower gate electrode GE1 and the lower gate wiring line GL1 can be formed by forming the first conductive film (thickness of 50 nm or more and 500 nm or less, for example), for example, by a sputtering method and then performing patterning (for example, wet etching) of the first conductive film by a known photolithography process.

A conductive film (illustrated as a light shielding conductive film) similar to the conductive film for a light shielding layer may be used as the first conductive film. Here, a metal film having a single layer structure or a layered structure containing a molybdenum-tungsten alloy, tungsten, tantalum, molybdenum, copper (Cu), and Al is used as the first conductive film.

Next, in order to control the conductivity of a crystalline silicon semiconductor layer to produce a silicon semiconductor TFT, ion doping for adding impurities such as boron or phosphorus to the crystalline silicon semiconductor layer is performed a plurality of times by using a resist pattern film or the like as a mask by a known method, and a source region and a drain region (not illustrated) are formed in a silicon film.

Figure 19D:
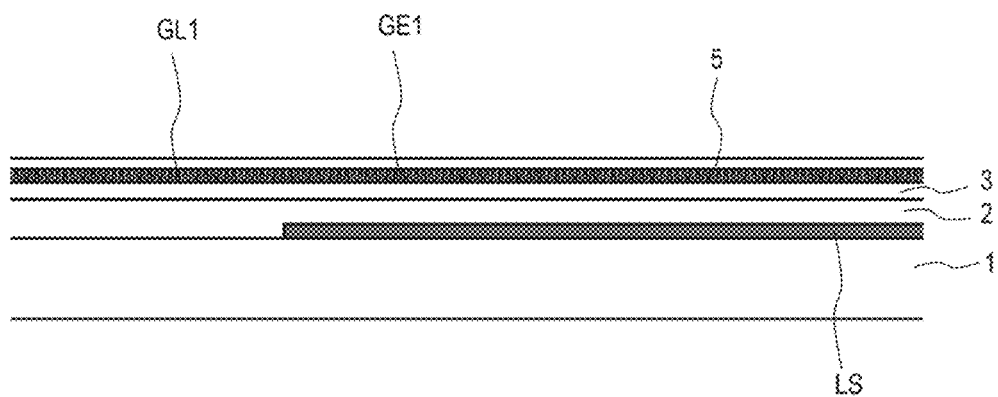
FIG. 19D is a process cross-sectional view illustrating a manufacturing process for the active matrix substrate 100F.

Next, as illustrated in FIG. 19D, the lower gate insulating layer 5 (thickness of 200 nm or more and 600 nm or less, for example) is formed so as to cover the lower gate wiring line GL1.

The lower gate insulating layer 5 is formed, for example, by a CVD method. As the lower gate insulating layer 5, for example, a silicon oxide ($SiO_2$) layer, a silicon nitride (SiNx) layer, a silicon oxynitride (SiOxNy; x>y) layer, a silicon nitride oxide (SiNxOy; x>y) layer, or the like can be used as appropriate. Here, a silicon oxide ($SiO_2$) layer (thickness of 100 nm to 500 nm, for example) is formed as the lower gate insulating layer 5, for example, by a CVD method. Alternatively, a layered film having a silicon nitride (SiNx) layer (thickness of 50 nm to 600 nm) as a lower layer and a silicon oxide ($SiO_2$) layer (thickness of 50 nm to 600 nm) as an upper layer may be formed as the lower gate insulating layer 5.

Figure 19E:
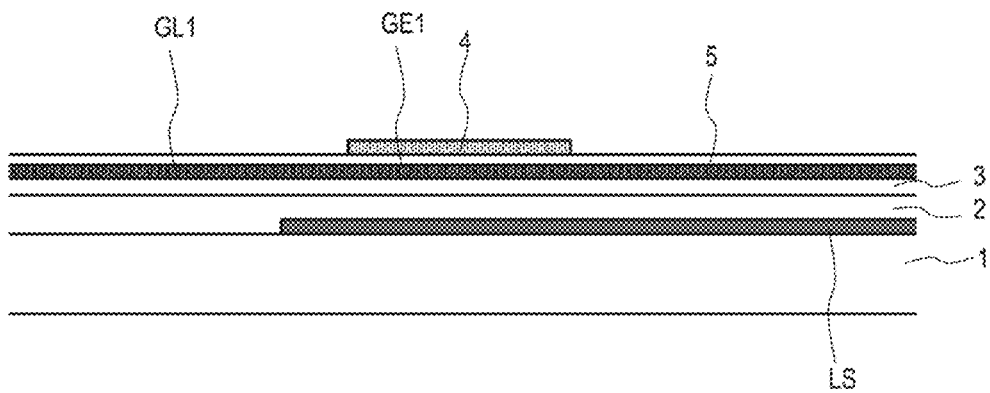
FIG. 19E is a process cross-sectional view illustrating a manufacturing process for the active matrix substrate 100F.

Subsequently, as illustrated in FIG. 19E, the oxide semiconductor layer 4 is formed on the lower gate insulating layer 5. For example, the island-shaped oxide semiconductor layer 4 can be formed by depositing an oxide semiconductor film by a sputtering method and then patterning the oxide semiconductor film by a photolithography process. Here, as the oxide semiconductor layer 4, for example, an In—Ga—Zn—O based semiconductor layer having a composition ratio of In:Ga:Zn=1:1:1 is formed. The thickness of the oxide semiconductor layer 4 is, for example, 5 nm or more and 60 nm or less.

Figure 19F:
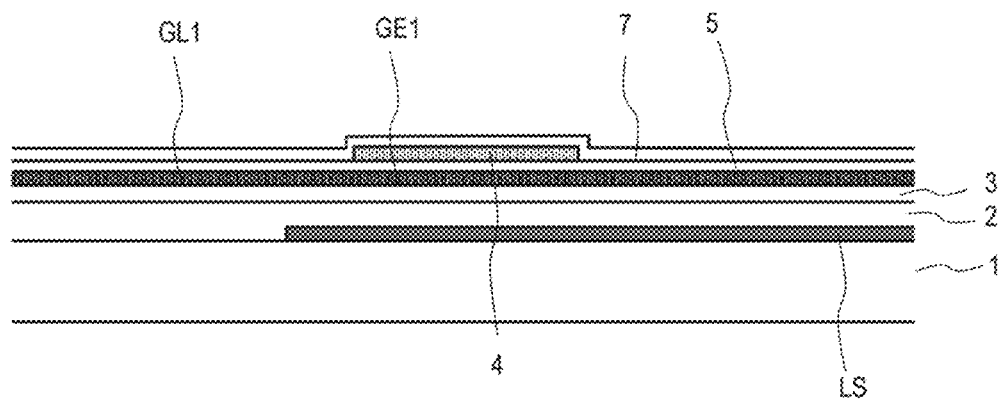
FIG. 19F is a process cross-sectional view illustrating a manufacturing process for the active matrix substrate 100F.

Next, as illustrated in FIG. 19F, the upper gate insulating layer 7 is deposited so as to cover the oxide semiconductor layer 4. The upper gate insulating layer 7 is deposited, for example, by a CVD method. As the upper gate insulating layer 7, for example, an insulating layer (illustrated as the lower gate insulating layer 5) similar to the lower gate insulating layer 5 can be used. Here, as the upper gate insulating layer 7, a silicon oxide ($SiO_2$) layer is formed. The thickness of the upper gate insulating layer 7 is, for example, 50 nm or more and 150 nm or less. Note that an appropriate thermal annealing processing or the like for controlling electrical characteristics of the oxide semiconductor layer 4 may be performed at each step up to this point after the oxide semiconductor layer 4.

Figure 19G:
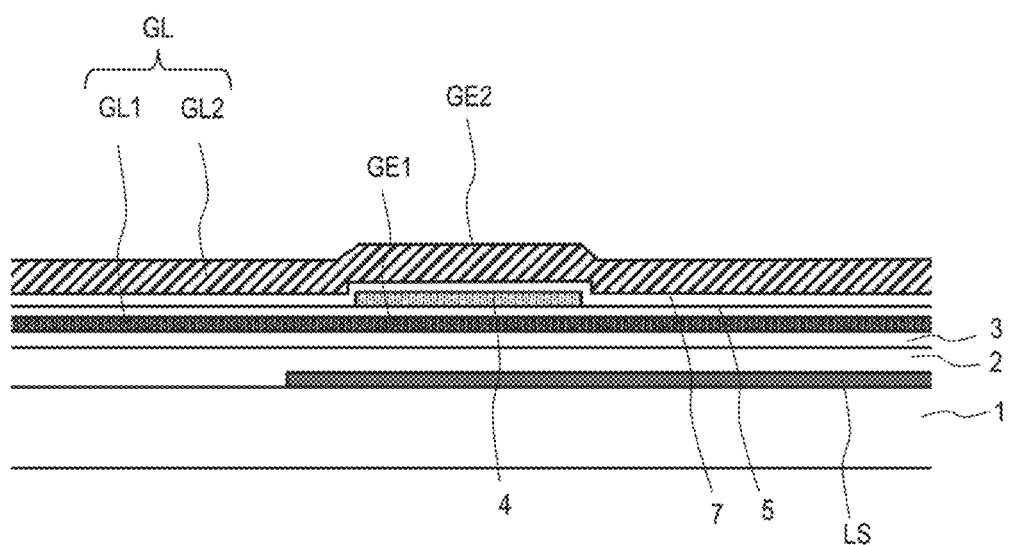
FIG. 19G is a process cross-sectional view illustrating a manufacturing process for the active matrix substrate 100F.

Subsequently, as illustrated in FIG. 19G, the upper gate wiring line GL2 is formed on the lower gate insulating layer 5. The upper gate wiring line GL2 includes a portion that functions as the upper gate electrode GE2. Here, the upper gate wiring line GL2 can be formed by depositing a second conductive film, for example, by a sputtering method and then patterning the second conductive film by a known photolithography process.

As the second conductive film, for example, the same conductive film (illustrated as a first conductive film) as the first conductive film can be used. The thickness of the second conductive film is, for example, 50 nm or more and 500 nm or less.

Thereafter, resistance reduction processing for the oxide semiconductor layer 4 may be performed through the upper gate insulating layer 7 using the upper gate electrode GE2 as a mask. For example, plasma processing or the like can be used as the resistance reduction processing. Due to the resistance reduction processing, a region of the oxide semiconductor layer 4 which does not overlap the upper gate electrode GE2 (a region serving as the source contact region 4s and the drain contact region 4d) is a low resistance region having a lower specific resistance than that of a region of the oxide semiconductor layer 4 which overlaps the upper gate electrode GE2 (a region serving as the channel region 4c). The low resistance region may be a conductive region (sheet resistance of 200Ω/□ or less, for example).

Note that the upper gate insulating layer 7 may be patterned before forming the second conductive film or collectively with the second conductive film. Thereby, the upper gate insulating layer 7 may be disposed only below the upper gate electrode GE2 and the upper gate wiring line GL2. Thereafter, resistance reduction processing for the oxide semiconductor layer 4 may be performed using the upper gate electrode GE2 as a mask.

A resistance reduction processing method is not limited to the plasma processing. For example, it is also possible to perform resistance reduction processing by bringing an exposed region of the oxide semiconductor layer 4 into contact with a reductive insulating film capable of reducing an oxide semiconductor. Alternatively, is also possible to perform resistance reduction processing by ion implantation processing through, for example, ion doping on the oxide semiconductor layer 4. Also in this case, the ion implantation processing can be performed through the upper gate insulating layer 7, and thus it is possible to shorten the process.

Figure 19H:
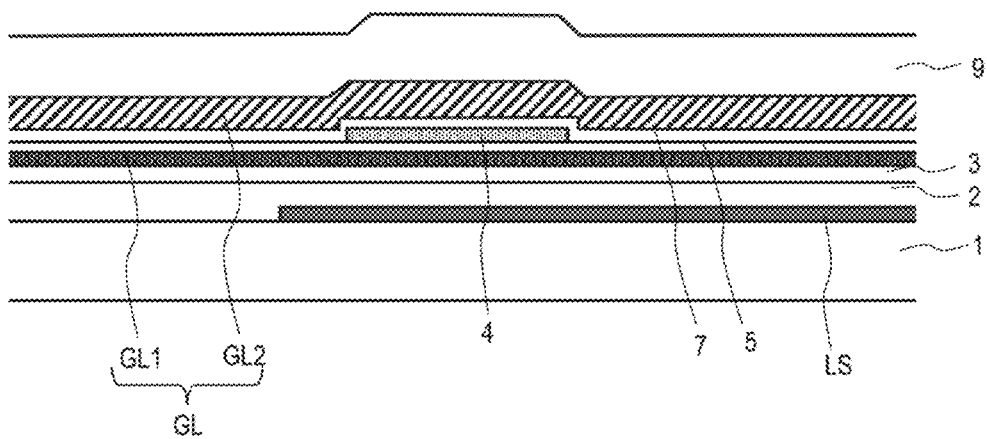
FIG. 19H is a process cross-sectional view illustrating a manufacturing process for the active matrix substrate 100F.

Next, as illustrated in FIG. 19H, the first interlayer insulating layer 9 that covers the oxide semiconductor layer 4 and the upper gate electrode GE2 is formed. For example, the first interlayer insulating layer 9 can be formed by a CVD method. Thereafter, the source contact hole CHs (FIG. 15B) is formed by patterning the first interlayer insulating layer 9 and the upper gate insulating layer 7 such that a portion of the source contact region 4s of the oxide semiconductor layer 4 is exposed.

As the first interlayer insulating layer 9, an inorganic insulating layer such as a silicon oxide ($SiO_2$) layer, a silicon nitride (SiNx) layer, a silicon oxynitride (SiOxNy; x>y) layer, or a silicon nitride oxide (SiNxOy; x>y) layer can be used as a single layer or a layered layer. The thickness of the first interlayer insulating layer 9 is, for example, 200 nm or more and 1000 nm or less. Here, a silicon oxide layer is used as the first interlayer insulating layer 9.

Figure 19I:
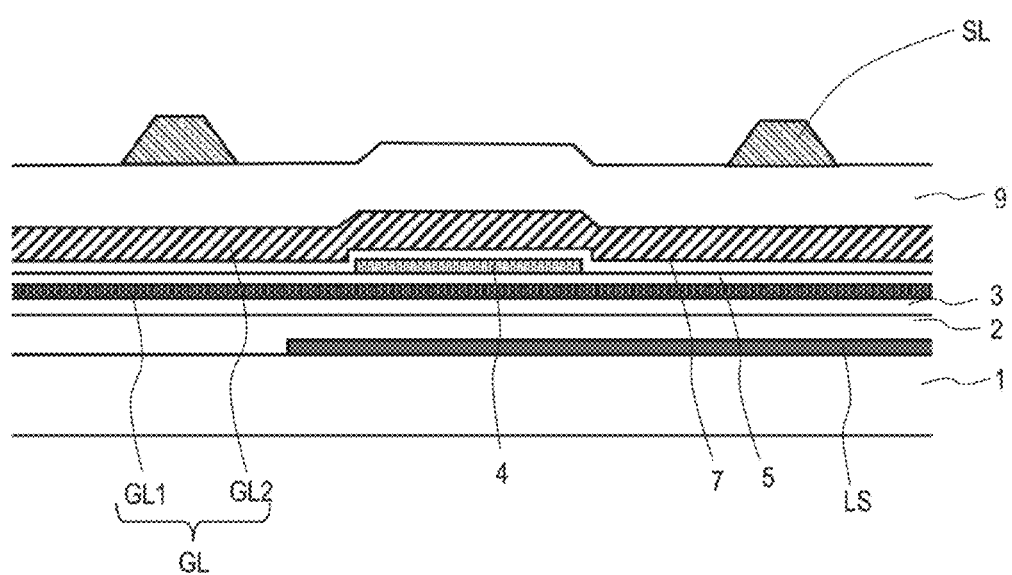
FIG. 19I is a process cross-sectional view illustrating a manufacturing process for the active matrix substrate 100F.

Subsequently, as illustrated in FIG. 19I, the source electrode SE and the source wiring line SL are formed on the first interlayer insulating layer 9. For example, the source wiring line SL can be formed by depositing a source conductive film by a sputtering method and then patterning the source conductive film by a photolithography process. In this manner, the pixel TFT 20 is obtained.

As the source conductive film, for example, a film containing a metal such as aluminum (Al), tungsten (W), molybdenum (Mo), tantalum (Ta), copper (Cu), chromium (Cr), or titanium (Ti), or an alloy thereof, or a metal nitride thereof, can be appropriately used. In addition, a layered film obtained by layering these plurality of films may be used. Here, a film obtained by layering a Ti film, an Al film, and a Ti film in this order is used as the source conductive film. The thickness of the source conductive film is, for example, 200 nm or more and 700 nm or less.

Figure 20A:
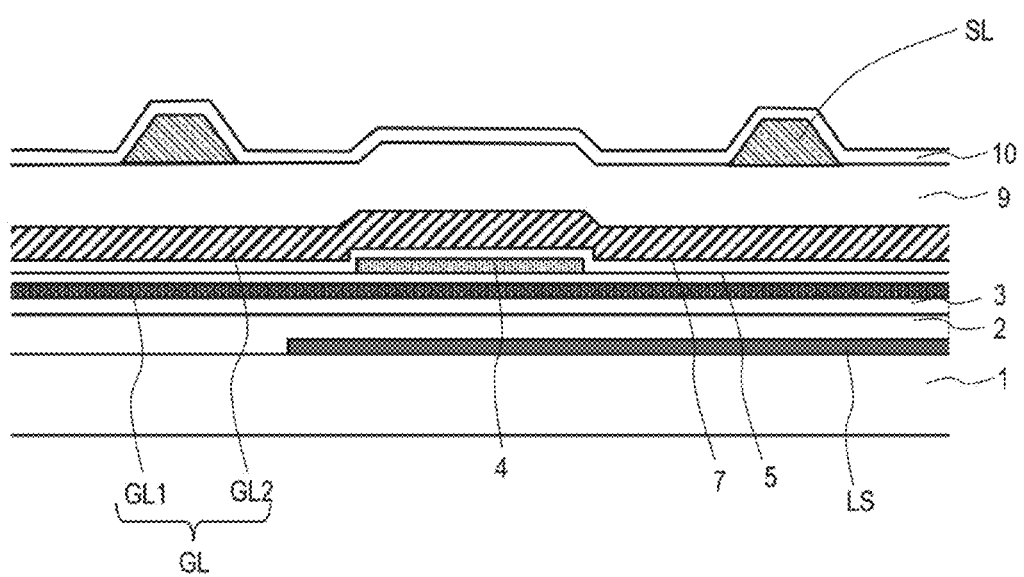
FIG. 20A is a process cross-sectional view illustrating a manufacturing process for the active matrix substrate 100F.

Subsequently, as illustrated in FIG. 20A, the second interlayer insulating layer 10 that covers the pixel TFT 20 is formed. For example, the second interlayer insulating layer 10 can be formed by a CVD method. Thereafter, the first interlayer insulating layer 9 and the second interlayer insulating layer 10 are patterned, and the first pixel contact hole CHp1 (FIG. 15B) is formed such that a portion of the drain contact region 4d of the oxide semiconductor layer 4 is exposed. The first pixel contact hole CHp1 is formed in a circular shape having a diameter of, for example, 1.5 μm to 2.5 μm.

As the second interlayer insulating layer 10, an inorganic insulating layer such as a silicon oxide ($SiO_2$) layer, a silicon nitride (SiNx) layer, a silicon oxynitride (SiOxNy; x>y) layer, or a silicon nitride oxide (SiNxOy; x>y) layer can be used as a single layer or a layered layer. The thickness of the second interlayer insulating layer 10 is, for example, 100 nm or more and 800 nm or less. Here, a silicon nitride layer is used as the second interlayer insulating layer 10.

Figure 20B:
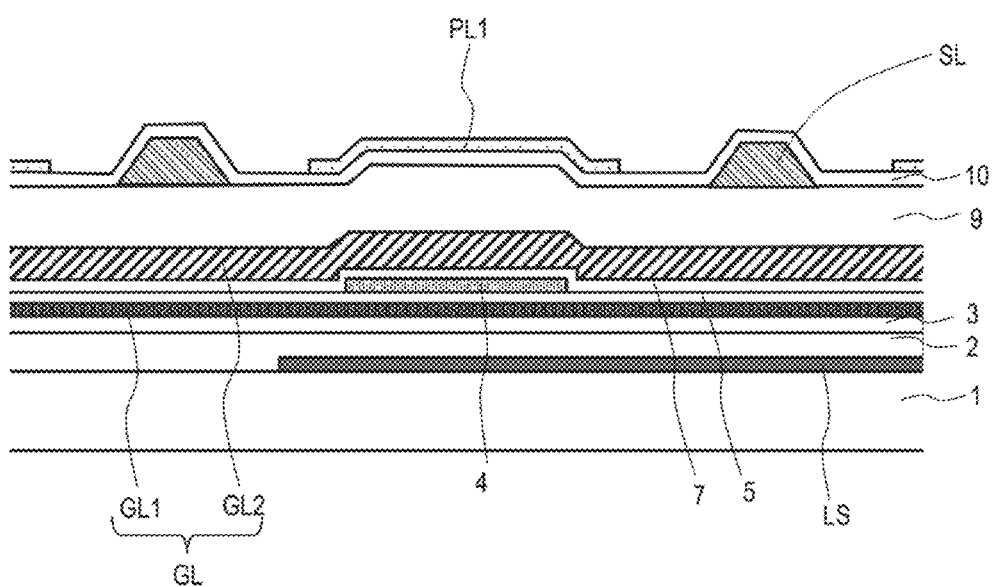
FIG. 20B is a process cross-sectional view illustrating a manufacturing process for the active matrix substrate 100F.

Next, as illustrated in FIG. 20B, the first electrode layer PL1 is formed on the second interlayer insulating layer 10 and in the first pixel contact hole CHp1. For example, the first electrode layer PL1 can be formed by depositing a transparent conductive film by a sputtering method and then patterning the transparent conductive film by a photolithography process. As a transparent conductive material for forming the first electrode layer PL1, for example, indium tin oxide (ITO) or indium zinc oxide (IZO) can be used. Here, indium tin oxide is used. The thickness of the first electrode layer PL1 is, for example, 30 nm or more and 100 nm or less.

Figure 20C:
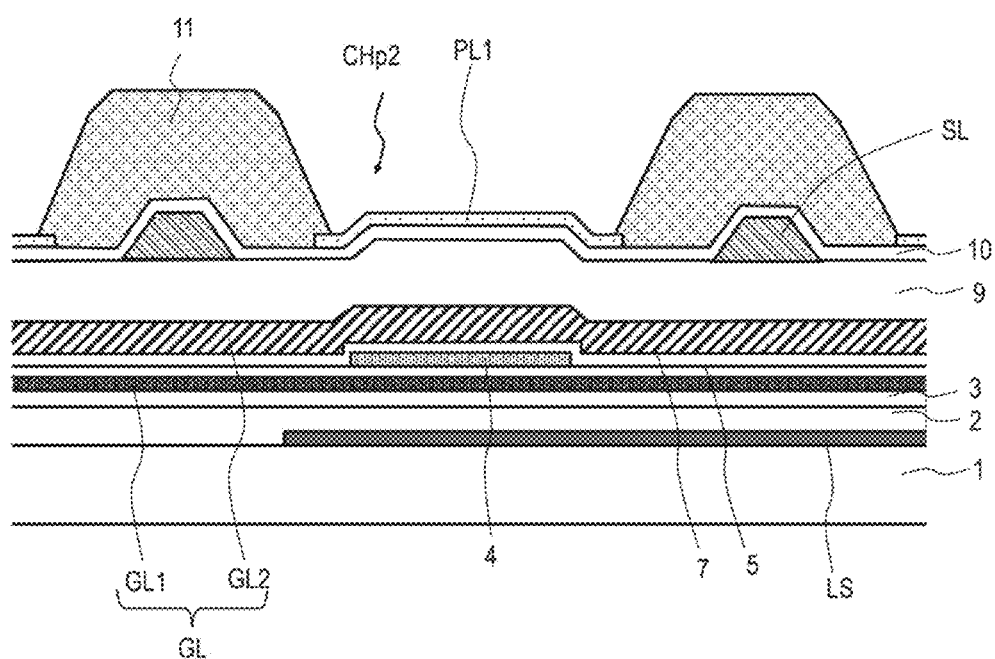
FIG. 20C is a process cross-sectional view illustrating a manufacturing process for the active matrix substrate 100F.

Next, as illustrated in FIG. 20C, the first organic insulating layer 11 that covers the second interlayer insulating layer 10 and the first electrode layer PL1 is formed. The thickness of the first organic insulating layer 11 is, for example, 2 μm or more and 6 μm or less. For example, by applying a photosensitive resin material and performing exposure and development, the first organic insulating layer 11 in which the second pixel contact hole CHp2 is formed such that a portion of the first electrode layer PL1 is exposed is obtained. As the photosensitive resin material, for example, a photosensitive acrylic resin can be used. The second pixel contact hole CHp2 is formed in a circular shape having a diameter of, for example, 2.5 μm to 3.5 μm.

Figure 20D:
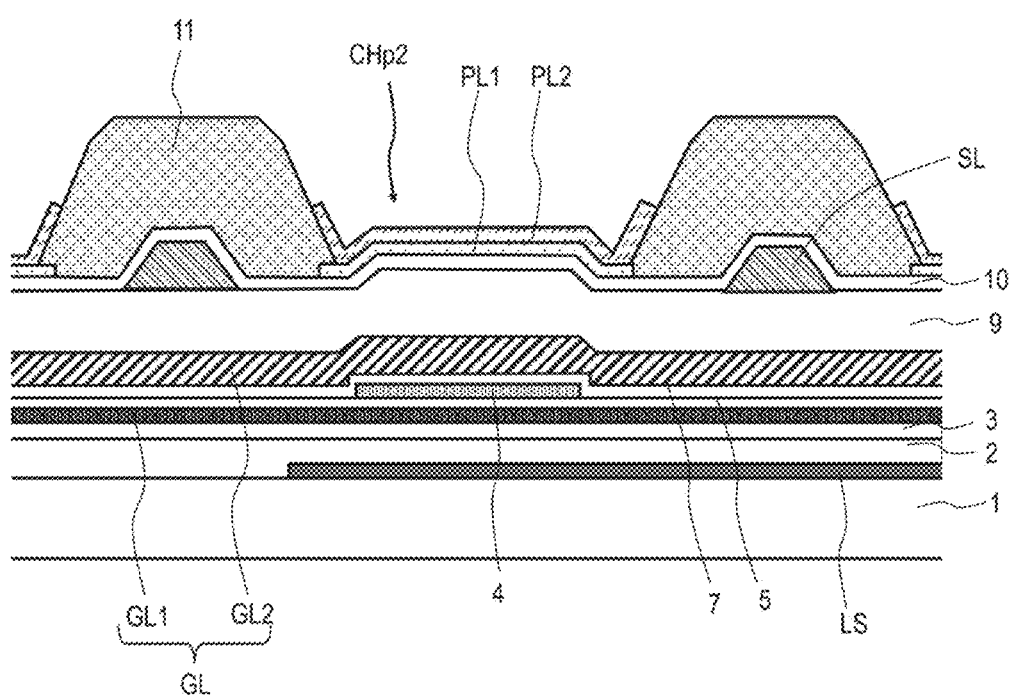
FIG. 20D is a process cross-sectional view illustrating a manufacturing process for the active matrix substrate 100F.

Subsequently, as illustrated in FIG. 20D, the second electrode layer PL2 is formed on the first organic insulating layer 11 and in the second pixel contact hole CHp2. For example, the second electrode layer PL2 can be formed by depositing a transparent conductive film by a sputtering method and then patterning the transparent conductive film by a photolithography process. As the transparent conductive material for forming the second electrode layer PL2, for example, indium tin oxide or indium zinc oxide can be used. Here, indium tin oxide is used. The thickness of the second electrode layer PL2 is, for example, 30 nm or more and 100 nm or less.

Figure 20E:
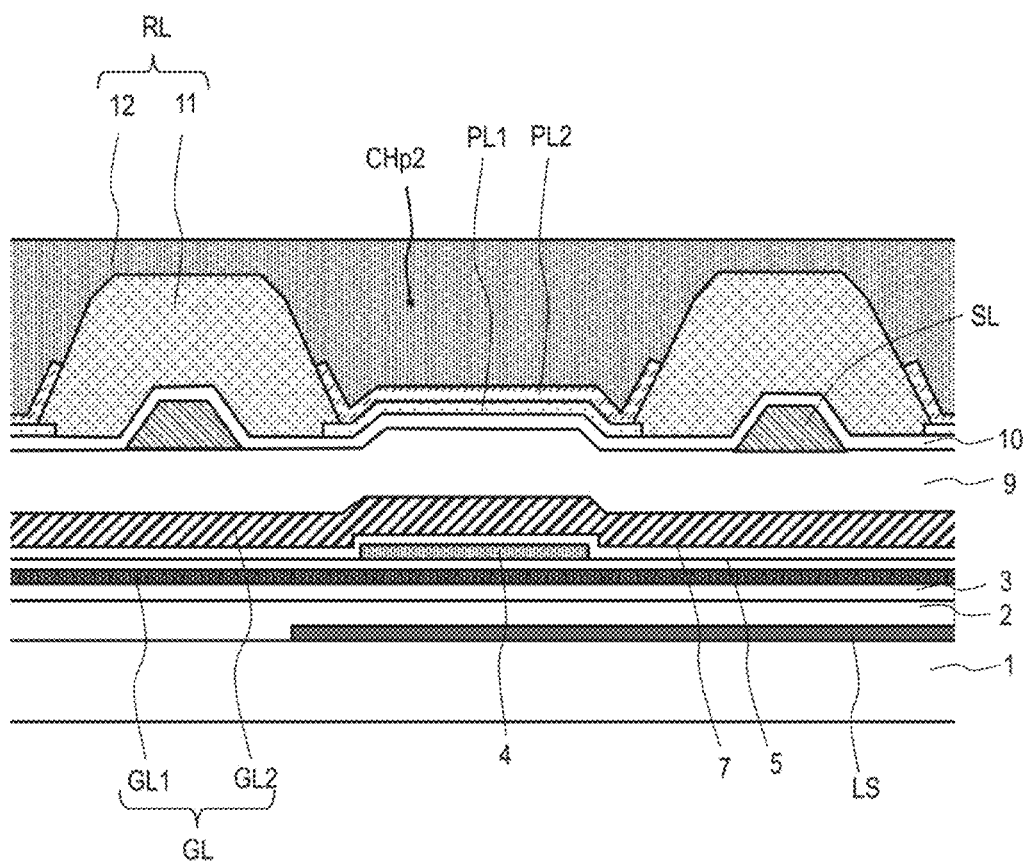
FIG. 20E is a process cross-sectional view illustrating a manufacturing process for the active matrix substrate 100F.

Next, as illustrated in FIG. 20E, the second organic insulating layer 12 that fills the second pixel contact hole CHp2 is formed. For example, the second organic insulating layer 12 is obtained by applying a photosensitive resin material and performing exposure and development. Thereby, the organic insulating layer RL including the first organic insulating layer 11 and the second organic insulating layer 12 is obtained.

As the photosensitive resin material, for example, a photosensitive acrylic resin can be used. A multi-gray scale mask is used as a mask during exposure, and thus the second pixel contact hole CHp2 can be filled with the second organic insulating layer 12 with high accuracy. Specifically, a gray tone mask or a halftone mask can be used as the multi-gray scale mask. A slit that is lower than or equal to in resolution of an exposure device is formed in the gray tone mask, and intermediate exposure is achieved by shielding a portion of light by the slit. On the other hand, intermediate exposure is achieved by using a transflective film in the halftone mask.

Figure 20F:
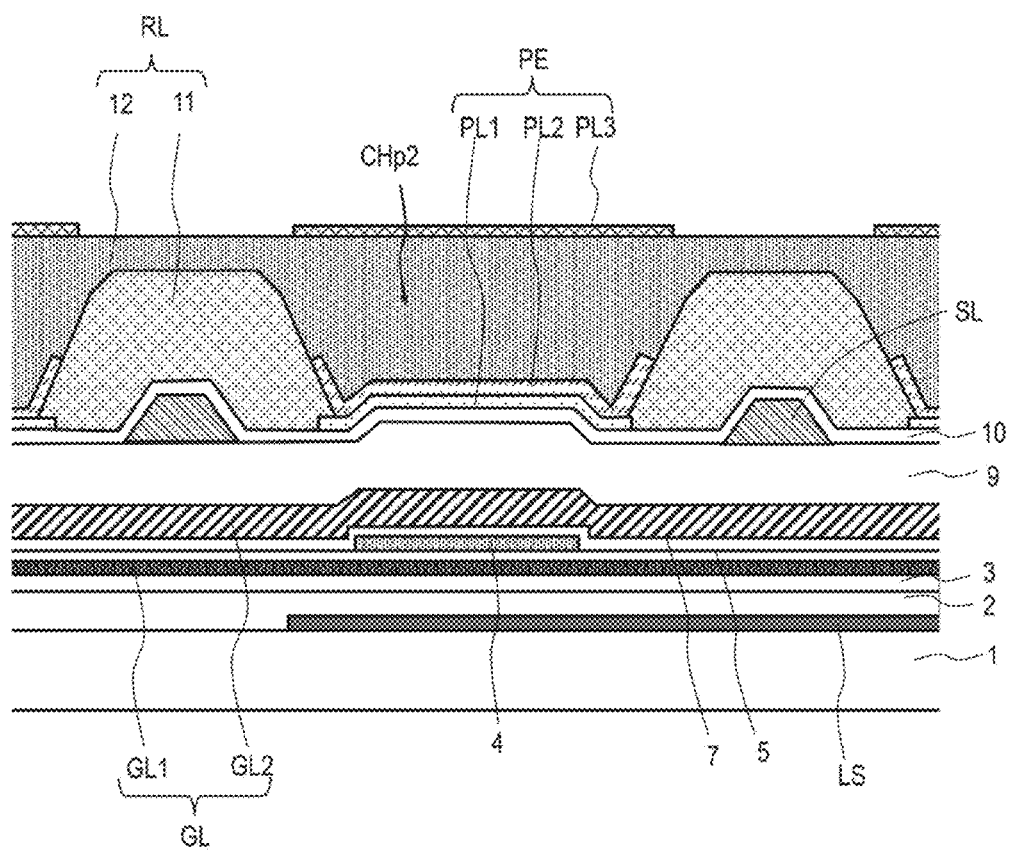
FIG. 20F is a process cross-sectional view illustrating a manufacturing process for the active matrix substrate 100F.

Subsequently, as illustrated in FIG. 20F, the third electrode layer PL3 is formed on the first organic insulating layer 11, the second electrode layer PL2, and the second organic insulating layer 12. For example, the third electrode layer PL3 can be formed by depositing a transparent conductive film by a sputtering method and then patterning the transparent conductive film by a photolithography process. As the transparent conductive material for forming the third electrode layer PL3, for example, indium tin oxide or indium zinc oxide can be used. Here, indium tin oxide is used. The thickness of the third electrode layer PL3 is, for example, 30 nm or more and 100 nm or less.

Figure 20G:
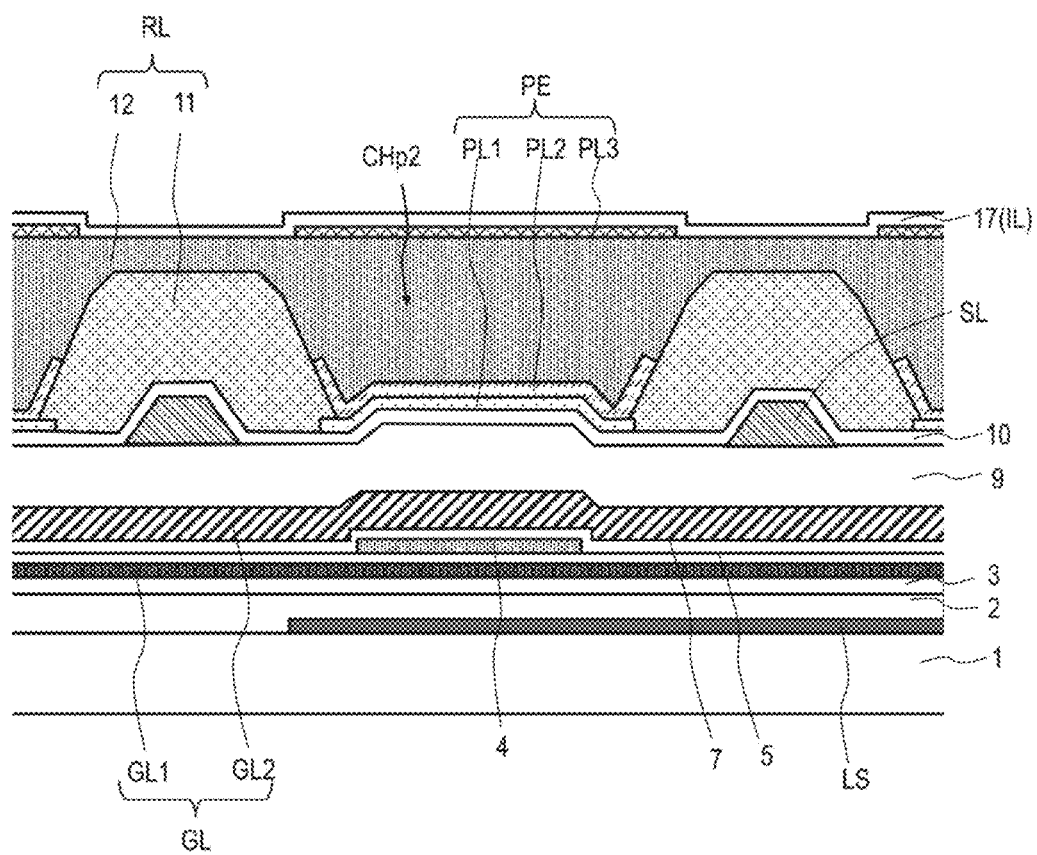
FIG. 20G is a process cross-sectional view illustrating a manufacturing process for the active matrix substrate 100F.

Next, as illustrated in FIG. 20G, the dielectric layer 17 that covers the third electrode layer PL3 is formed. The dielectric layer 17 can be formed, for example, by a CVD method. As the dielectric layer 17, for example, an inorganic insulating layer similar to the first interlayer insulating layer 9 and the second interlayer insulating layer 10 can be used. Here, a silicon nitride layer is used as the dielectric layer 17. The thickness of the dielectric layer 17 is, for example, 50 nm or more and 300 nm or less.

Figure 20H:
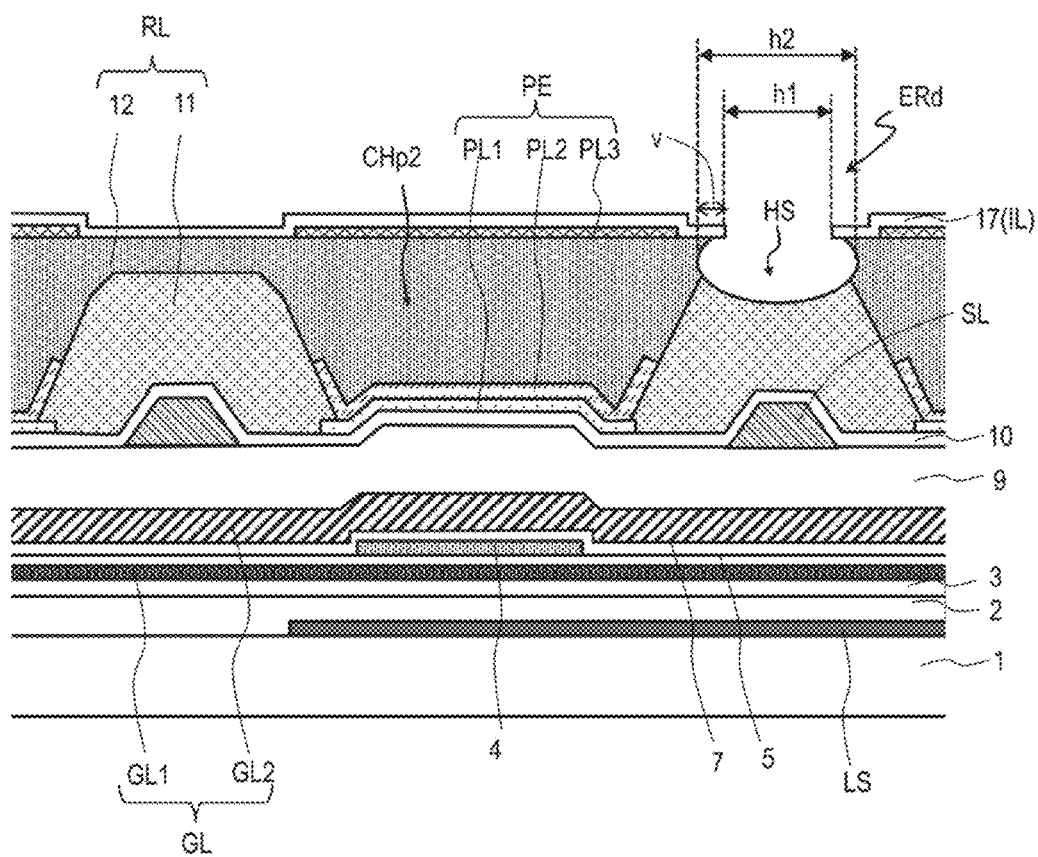
FIG. 20H is a process cross-sectional view illustrating a manufacturing process for the active matrix substrate 100F.

Thereafter, as illustrated in FIG. 20H, the dual-layer hole structure portion HS is formed in the dielectric layer 17 and the organic insulating layer RL. The dual-layer hole structure portion HS can be formed by patterning the dielectric layer 17 and the organic insulating layer RL by a photolithography process. For example, after a resist layer is formed on the dielectric layer 17, dry etching of the dielectric layer 17 and the organic insulating layer RL may be performed using the resist layer as a mask. The dry etching is performed under conditions in which a through-hole is formed in the dielectric layer 17, a bottomed hole is formed in the organic insulating layer RL, and the second organic insulating layer 12 is etched (side-etched) laterally from the dielectric layer 17. Thereby, the through-hole h1 is formed in the dielectric layer 17, and the bottomed hole h2 is formed in the organic insulating layer RL by removing a portion of the organic insulating layer RL which is exposed by the through-hole h1 and a portion positioned on an outer side of the through-hole h1 when viewed from the normal direction of the substrate 1. As an example, it is possible to cause an undercut in the second organic insulating layer 12 by using carbon tetrafluoride ($CF_4$) gas and oxygen ($O_2$) gas as an etching gas at a flow ratio of 4:1 to 2:1. When viewed from the normal direction of the substrate 1, a width v of a portion of the dielectric layer 17 (amount of an undercut in the dielectric layer 17) which is positioned on an inner side of the outer edge of the second organic insulating layer 12 can be controlled, for example, by adjusting an etching time, the pressure in an etching chamber, high-frequency power, and a gas flow ratio. Note that an etching method is not limited to the above-described method. For example, the dielectric layer 17 and the organic insulating layer RL may be etched by combining sulfur hexafluoride ($SF_6$) and oxygen, or gases such as carbon tetrafluoride ($CF_4$), sulfur hexafluoride ($SF_6$), oxygen, and argon and adjusting the respective flow ratio so as to cause an undercut in the second organic insulating layer 12.

Figure 20I:
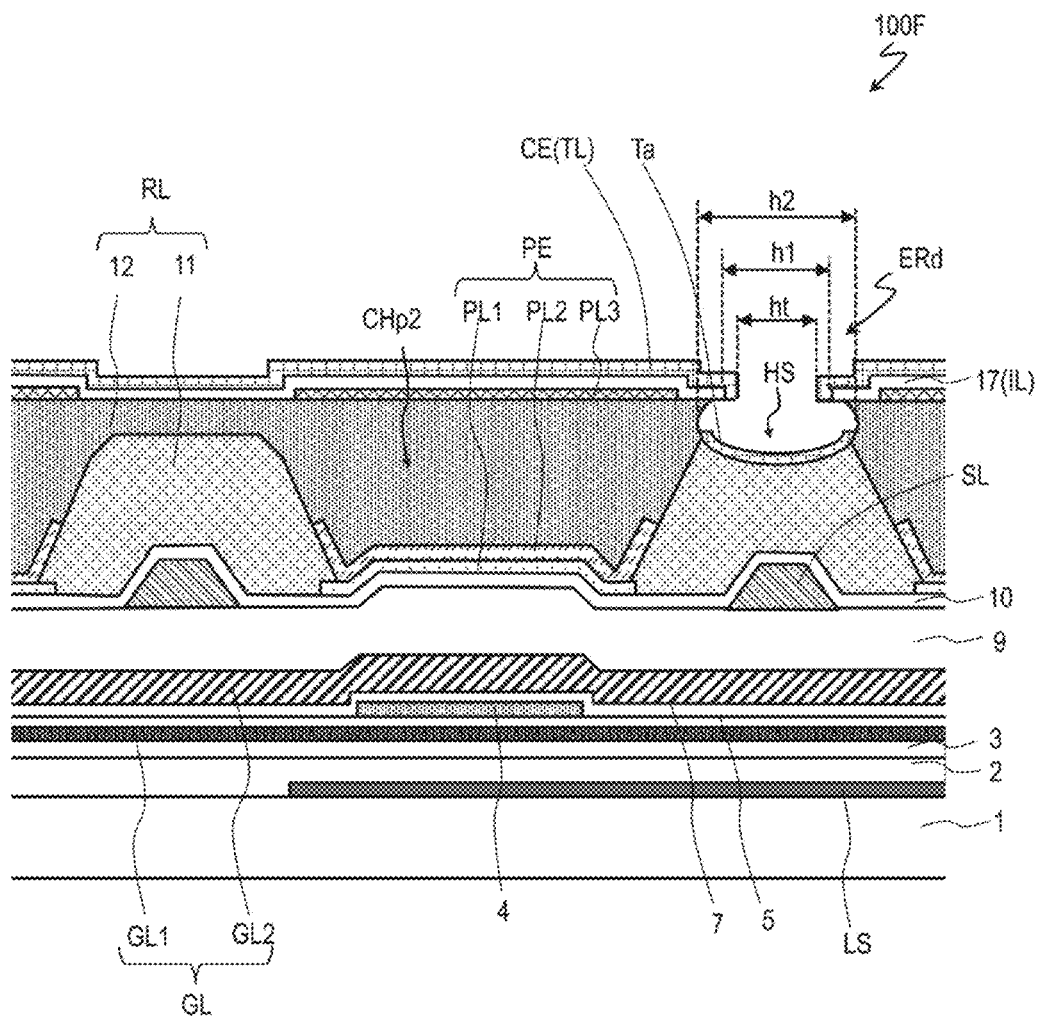
FIG. 20I is a process cross-sectional view illustrating a manufacturing process for the active matrix substrate 100F.

Thereafter, as illustrated in FIG. 20I, the common electrode CE is formed on the dielectric layer 17, and the island-shaped transparent conductive portion Ta is formed in the bottomed hole h2.

First, a transparent conductive film is deposited, for example, by a sputtering method. At this time, a portion of the transparent conductive film which is positioned on the upper surface of the dielectric layer 17 and a portion positioned inside the bottomed hole h2 are separated from each other by using a step between the upper surface of the dielectric layer 17 and the bottom surface of the bottomed hole h2 of the organic insulating layer RL. Thereby, the island-shaped transparent conductive portion Ta is formed in the bottomed hole h2. Thereafter, the common electrode CE can be formed by patterning a portion of the transparent conductive film excluding the island-shaped transparent conductive portion Ta. In this manner, the active matrix substrate 100F is obtained.

As the transparent conductive material for forming the common electrode CE, for example, indium tin oxide or indium zinc oxide can be used. Here, indium tin oxide is used. The thickness of the common electrode CE is, for example, 30 nm or more and 100 nm or less.

Subsequently, impurities in the organic insulating layer RL are discharged to the outside via the first impurity removed region ERd by performing heating processing for the obtained active matrix substrate 100F. The heating processing is performed at a temperature of, for example, 100° C. or higher and 300° C. or lower. Here, the heating processing is performed at a temperature of 200° C. to 220° C. for 1 to 2 hours.

Although not illustrated in the drawing, an alignment film may be formed on the outermost surface of the active matrix substrate 100F after performing a heating step for discharging impurities.

Note that the active matrix substrates 100A to 100E can also be formed in the same manner as described above. For example, the second impurity removed region ERf can be formed by a step similar to the step of forming the first impurity removed region ERd described above.

Modification Example of Manufacturing Method

An impurity removed region ER2 (FIGS. 3A and 3B) having a second structure may be formed as the first impurity removed region ERd or the second impurity removed region ERf. The impurity removed region ER2 can be formed, for example, by patterning a transparent conductive film to form a transparent conductive layer TL (here, the common electrode CE) and then performing etching for forming a dual-layer hole structure portion HS. Hereinafter, a step of forming the first impurity removed region ERd having the second structure will be described.

Figure 21A:
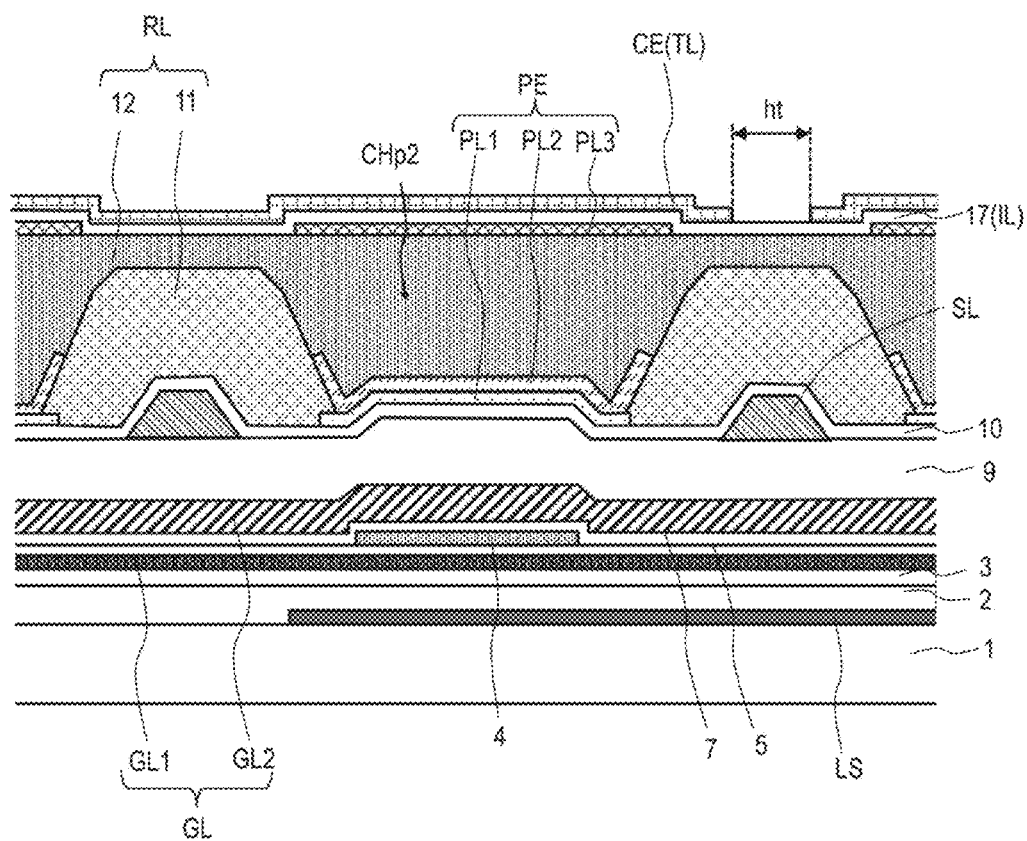
FIG. 21A is a process cross-sectional view illustrating another method of manufacturing the active matrix substrate 100F.
Figure 21B:
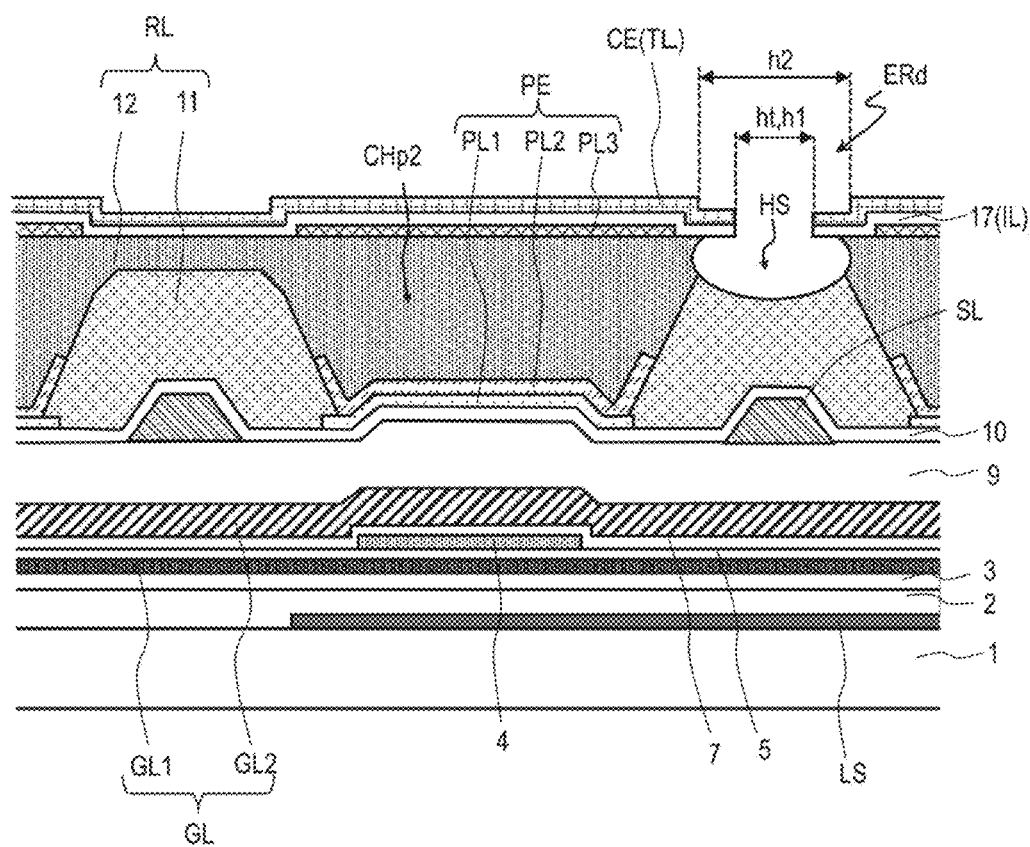
FIG. 21B is a process cross-sectional view illustrating the other method of manufacturing the active matrix substrate 100F.

FIGS. 21A and 21B are process cross-sectional views illustrating another method of manufacturing the first impurity removed region ERd.

First, as illustrated in FIG. 21A, after the organic insulating layer RL is formed, the dielectric layer 17 and the transparent conductive film are deposited in this order, and a transparent conductive film is patterned by a photolithography process. Thereby, the common electrode CE is formed from the transparent conductive film. The common electrode CE has an opening ht in a region for forming the first impurity removed region ERd and has a slit (not illustrated) in each pixel area PIX.

Subsequently, as illustrated in FIG. 21B, dry etching of the dielectric layer 17 and the organic insulating layer RL is performed using the common electrode CE as an etching mask, and the dual-layer hole structure portion HS is formed in the dielectric layer 17 and the organic insulating layer RL. The dry etching may be performed in a state where a resist layer (not illustrated) is formed so as to cover a portion of the dielectric layer 17 which is exposed by the slit of the common electrode CE. In this manner, the first impurity removed region ERd having the second structure is formed.

An etching method and etching conditions are similar to those described above with reference to FIG. 20H. In this step, when viewed from the normal direction of the substrate 1, the through-hole h1 of the dielectric layer 17 is substantially aligned with the opening ht of the common electrode CE, and the bottomed hole h2 of the organic insulating layer RL is positioned inside of the outer edge of the opening ht.

Note that the opening ht, the through-hole h1, and the bottomed hole h2 may be formed by forming the common electrode CE, and then providing another resist layer on the common electrode CE, and collectively etching the common electrode CE, the dielectric layer 17, and the organic insulating layer RL by using the other resist layer as an etching mask. According to this method, damage to the common electrode CE due to dry etching can be reduced compared to a method using the common electrode CE as a mask.

Oxide Semiconductor

An oxide semiconductor included in the oxide semiconductor layer 4 may be an amorphous oxide semiconductor, or may be a crystalline oxide semiconductor including a crystalline portion. Examples of the crystalline oxide semiconductor include a polycrystalline oxide semiconductor, a microcrystalline oxide semiconductor, a crystalline oxide semiconductor having a c-axis oriented substantially perpendicular to the layer surface and the like.

The oxide semiconductor layer 4 may have a layered structure including two or more layers. The oxide semiconductor layer 4 having a layered structure may include an amorphous oxide semiconductor layer and a crystalline oxide semiconductor layer, and may include a plurality of crystalline oxide semiconductor layers having different crystal structures. In addition, the oxide semiconductor layer 4 having a layered structure may include a plurality of amorphous oxide semiconductor layers. When the oxide semiconductor layer 4 has a layered structure, energy gaps of the respective layers may be different from each other.

Materials, structures, and film formation methods of an amorphous oxide semiconductor and the above-described crystalline oxide semiconductors, a configuration of an oxide semiconductor layer having a layered structure, and the like are described in, for example, JP 2014-007399 A. The entire contents described in JP 2014-007399 A are incorporated herein by reference.

The oxide semiconductor layer 4 may include, for example, at least one metal element among In, Ga, and Zn. In the above-described embodiment, the oxide semiconductor layer 4 includes, for example, an In—Ga—Zn—O based semiconductor (for example, indium gallium zinc oxide). Here, the In—Ga—Zn—O based semiconductor is a ternary oxide of indium (In), gallium (Ga), and zinc (Zn), and a ratio (composition ratio) of In, Ga, and Zn is not particularly limited. For example, the ratio includes In:Ga:Zn=2:2:1, In:Ga:Zn=1:1:1, In:Ga:Zn=1:1:2 or the like. Such an oxide semiconductor layer 4 can be formed of an oxide semiconductor film including an In—Ga—Zn—O based semiconductor.

The In—Ga—Zn—O based semiconductor may be an amorphous semiconductor or may be a crystalline semiconductor. A crystalline In—Ga—Zn—O based semiconductor in which a c-axis is oriented substantially perpendicular to a layer surface is preferable as the crystalline In—Ga—Zn—O based semiconductor.

Note that a crystal structure of the crystalline In—Ga—Zn—O based semiconductor is described in, for example, JP 2014-007399 A, JP 2012-134475 A, and JP 2014-209727 A as described above. The entire contents described in JP 2012-134475 A and JP 2014-209727 A are incorporated herein by reference. A TFT including an In—Ga—Zn—O based semiconductor layer has high mobility (more than 20 times as compared to an a-Si TFT) and low leakage current (less than 1/100 as compared to the a-Si TFT). Thus, such a TFT can be suitably used as a driving TFT (for example, a TFT included in a drive circuit provided in a periphery of a display region including a plurality of pixels, and on the same substrate as the display region) and a pixel TFT (TFT provided in a pixel).

In place of the In—Ga—Zn—O based semiconductor, the oxide semiconductor layer 4 may include another oxide semiconductor. For example, the oxide semiconductor layer may include an In—Sn—Zn—O based semiconductor (for example, $In_2O_3$—$SnO_2$—ZnO; InSnZnO). The In—Sn—Zn—O based semiconductor is a ternary oxide of indium (In), tin (Sn), and zinc (Zn). Alternatively, the oxide semiconductor layer 4 may include an In—W—Zn—O based semiconductor containing W (tungsten), an In—W—Sn—Zn—O based semiconductor, an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, CdO (cadmium oxide), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, an Al—Ga—Zn—O based semiconductor, a Ga—Zn—O based semiconductor, an In—Ga—Zn—Sn—O based semiconductor, and the like.

INDUSTRIAL APPLICABILITY

According to the embodiments of the disclosure, it is possible to provide an active matrix substrate capable of suppressing a decrease in transmittance caused by a contact hole formed in an organic insulating layer in which fluctuations in characteristics of an oxide semiconductor TFT due to impurities such as moisture are suppressed. The active matrix substrate according to the embodiments of the disclosure is suitably used in a high-resolution (for example, 1000 ppi or more) liquid crystal display device such as a liquid crystal display device for a head-mounted display.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. An active matrix substrate including a display region including a plurality of pixel areas arrayed in a matrix shape in a row direction and a column direction, and a non-display region positioned in a periphery of the display region, the active matrix substrate comprising:
    a substrate;
    a pixel TFT supported by the substrate and provided corresponding to each of the plurality of pixel areas, the pixel TFT including an oxide semiconductor layer as an active layer;
    an organic insulating layer disposed above at least the oxide semiconductor layer of the pixel TFT; and
    an inorganic insulating layer disposed in contact with an upper surface of the organic insulating layer on the organic insulating layer,
    wherein the organic insulating layer and the inorganic insulating layer are provided with a plurality of dual-layer hole structure portions,
    each of the dual-layer hole structure portions includes a through-hole provided in the inorganic insulating layer and a bottomed hole provided in the organic insulating layer and positioned below the through-hole, and
    an entirety of the through-hole is positioned on an inner side of an outer edge of the bottomed hole when viewed from a normal direction of the substrate.

2. The active matrix substrate according to claim 1, wherein an inner surface of the bottomed hole is not in direct contact with the inorganic insulating layer.

3. The active matrix substrate according to claim 1, further comprising:
    a transparent conductive layer disposed on the inorganic insulating layer,
    wherein the transparent conductive layer includes an opening on each of the dual-layer hole structure portions, and
    at least a portion of an inner surface of the bottomed hole is exposed from the transparent conductive layer and the inorganic insulating layer in each of the dual-layer hole structure portions.

4. The active matrix substrate according to claim 3, further comprising:
    an island-shaped transparent conductive portion formed in the same layer as the transparent conductive layer,
    wherein the transparent conductive layer covers at least a portion of an upper surface of the inorganic insulating layer and at least a portion of an inner surface of the through-hole of the inorganic insulating layer in each of the dual-layer hole structure portions,
    the island-shaped transparent conductive portion is disposed separated from the transparent conductive layer inside the bottomed hole of the organic insulating layer, and a portion of the inner surface of the bottomed hole is exposed from the island-shaped transparent conductive portion, the transparent conductive layer, and the inorganic insulating layer.

5. The active matrix substrate according to claim 4, wherein the opening is positioned on an inner side of the outer edge of the through-hole when viewed from the normal direction of the substrate.

6. The active matrix substrate according to claim 3, wherein the opening of the transparent conductive layer exposes an inner surface of the through-hole and the inner surface of the bottomed hole in each of the dual-layer hole structure portions, and
an entirety of the opening is positioned on an inner side of the outer edge of the bottomed hole when viewed from the normal direction of the substrate.

7. The active matrix substrate according to claim 1, wherein the organic insulating layer includes a first organic insulating layer and a second organic insulating layer positioned in a layer higher than the first organic insulating layer, and
each of the first organic insulating layer and the second organic insulating layer includes a portion exposed to the bottomed hole of each of the dual-layer hole structure portions.

8. The active matrix substrate according to claim 1, further comprising:
an other organic insulating layer disposed on the organic insulating layer via the inorganic insulating layer,
wherein the other organic insulating layer is disposed filling the through-hole and the bottomed hole in each of the dual-layer hole structure portions.

9. The active matrix substrate according to claim 1, wherein the plurality of dual-layer hole structure portions include a plurality of first dual-layer hole structure portions disposed in the display region.

10. The active matrix substrate according to claim 9, further comprising:
a plurality of pixel electrodes respectively disposed in the plurality of pixel areas and electrically connected to a corresponding one pixel TFT,
wherein the first dual-layer hole structure portions are disposed at positions that do not overlap the plurality of pixel electrodes in the display region.

11. The active matrix substrate according to claim 9, wherein the plurality of first dual-layer hole structure portions are disposed in the display region such that one first dual-layer hole structure portion corresponds to three or more pixel areas.

12. The active matrix substrate according to claim 9, further comprising:
a plurality of light shielding layers disposed on the substrate side of the pixel TFT,
wherein the first dual-layer hole structure portions overlap any one of the plurality of light shielding layers when viewed from the normal direction of the substrate.

13. The active matrix substrate according to claim 1, wherein the plurality of dual-layer hole structure portions include a plurality of second dual-layer hole structure portions disposed in the non-display region.

14. The active matrix substrate according to claim 13, wherein the non-display region further includes a gate driver and/or a demultiplexer circuit supported by the substrate, and
the plurality of second dual-layer hole structure portions are positioned between the gate driver and/or the demultiplexer circuit and the display region when viewed from the normal direction of the substrate.

15. The active matrix substrate according to claim 1, further comprising:
a plurality of pixel electrodes respectively disposed in the plurality of pixel areas,
wherein the pixel TFT is electrically connected to a corresponding one pixel electrode by a connection electrode formed of a transparent conductive material.

16. The active matrix substrate according to claim 1, wherein a depth of the bottomed hole is ¼ or more and ¾ or less of a thickness of the organic insulating layer.

17. A liquid crystal display device comprising:
the active matrix substrate according to claim 1;
a counter substrate provided facing the active matrix substrate;
a liquid crystal layer provided between the active matrix substrate and the counter substrate;
a plurality of columnar spacers positioned between the active matrix substrate and the counter substrate; and
wherein the active matrix substrate further includes a plurality of light shielding layers disposed in association with the plurality of columnar spacers on a side closer to the substrate than the pixel TFT, and
each of the light shielding layers are disposed overlapping one of the plurality of dual-layer hole structure portions and one of the plurality of columnar spacers when viewed from the normal direction of the substrate.

18. A method of manufacturing the active matrix substrate according to claim 1, the method comprising:
forming the inorganic insulating layer on the organic insulating layer; and
etching the inorganic insulating layer and the organic insulating layer by using the same etching mask,
wherein the etching is performed under conditions in which the through-hole is formed in the inorganic insulating layer, and the bottomed hole is formed in the organic insulating layer by removing a portion of the organic insulating layer exposed in the through-hole and a portion positioned on an outer side of the through-hole when viewed from the normal direction of the substrate.

19. A method of manufacturing the active matrix substrate according to claim 1, the method comprising:
forming the organic insulating layer, the inorganic insulating layer, and a transparent conductive film in this order;
patterning the transparent conductive film to form an opening in a region of each of the dual-layer hole structure portions; and
etching the inorganic insulating layer and the organic insulating layer using the transparent conductive film including the opening formed therein as a mask,
wherein the etching is performed under conditions in which the through-hole is formed in the inorganic insulating layer, and the bottomed hole is formed in the organic insulating layer by removing a portion of the organic insulating layer exposed in the through-hole and a portion positioned on an outer side of the through-hole when viewed from the normal direction of the substrate.

20. An active matrix substrate, including a display region including a plurality of pixel areas arrayed in a matrix shape in a row direction and a column direction, and a non-display region positioned in a periphery of the display region, the active matrix substrate comprising:
a substrate;

a pixel TFT supported by the substrate and provided corresponding to each of the plurality of pixel areas, the pixel TFT including an oxide semiconductor layer as an active layer;

an organic insulating layer disposed above at least the oxide semiconductor layer of the pixel TFT; and an inorganic insulating layer disposed in contact with an upper surface of the organic insulating layer on the organic insulating layer, wherein the organic insulating layer and the inorganic insulating layer are provided with a plurality of dual-layer hole structure portions, each of the dual-layer hole structure portions includes a through-hole provided in the inorganic insulating layer and a bottomed hole provided in the organic insulating layer and positioned below the through-hole, the through-hole is positioned on an inner side of an outer edge of the bottomed hole when viewed from a normal direction of the substrate, the organic insulating layer includes a first organic insulating layer and a second organic insulating layer, and the second organic insulating layer includes a portion positioned in a layer higher than the first organic insulating layer and in direct contact with the first organic insulating layer, and only one of the first organic insulating layer and the second organic insulating layer includes a portion exposed to the bottomed hole of each of the dual-layer hole structure portions.

* * * * *